US 12,407,345 B2

(12) United States Patent
Volke et al.

(10) Patent No.: US 12,407,345 B2
(45) Date of Patent: Sep. 2, 2025

(54) SWITCHED INDUCTIVE STORAGE ELEMENT TO ENHANCE GATE DRIVE AT TURN-OFF

(71) Applicant: Power Integrations, Inc., San Jose, CA (US)

(72) Inventors: Andreas Volke, Soest (DE); Christoph Dustert, Soest (DE); Brian Harold Floyd, Sunnyvale, CA (US)

(73) Assignee: Power Integrations, Inc., San Jose, CA (US)

( * ) Notice: Subject to any disclaimer, the term of this patent is extended or adjusted under 35 U.S.C. 154(b) by 63 days.

(21) Appl. No.: 18/520,376

(22) Filed: Nov. 27, 2023

(65) Prior Publication Data

US 2024/0195404 A1 Jun. 13, 2024

Related U.S. Application Data

(60) Provisional application No. 63/430,955, filed on Dec. 7, 2022.

(51) Int. Cl.
*H03K 17/16* (2006.01)
(52) U.S. Cl.
CPC .................................. *H03K 17/16* (2013.01)
(58) Field of Classification Search
CPC .............................. H03K 17/16; H03K 17/168
See application file for complete search history.

(56) References Cited

U.S. PATENT DOCUMENTS

| 4,682,047 A * | 7/1987 | von Sichart ......... H03K 5/1534 326/87 |
| 9,698,768 B2 * | 7/2017 | Leong ..................... H02M 1/34 |
| 2022/0166425 A1 | 5/2022 | Lin et al. |

FOREIGN PATENT DOCUMENTS

| EP | 2819268 A2 | 12/2014 |
| EP | 3057233 A1 | 8/2016 |
| EP | 3872990 A1 | 9/2021 |
| WO | 2015070344 A1 | 5/2015 |

OTHER PUBLICATIONS

Extended European Search Report in EP23173211.6, mailed Oct. 11, 2023, 10 pages.

* cited by examiner

*Primary Examiner* — Menatoallah Youssef
*Assistant Examiner* — Colleen J O'Toole
(74) *Attorney, Agent, or Firm* — Arentfox Schiff LLP

(57) ABSTRACT

A switched inductive storage element to enhance gate drive at turn-off is described herein. An inductive storage element (e.g., an inductor) may be switched between a supply node and a gate node of a gated device (e.g., a low-side device and/or a high-side device). While coupled to the supply node, the inductive storage element may be energized; and subsequently, while coupled to the gate node of the gated device, the inductive storage element may drive the gate node (i.e., the gate of the low-side and/or high-side device) below the local ground potential.

23 Claims, 36 Drawing Sheets

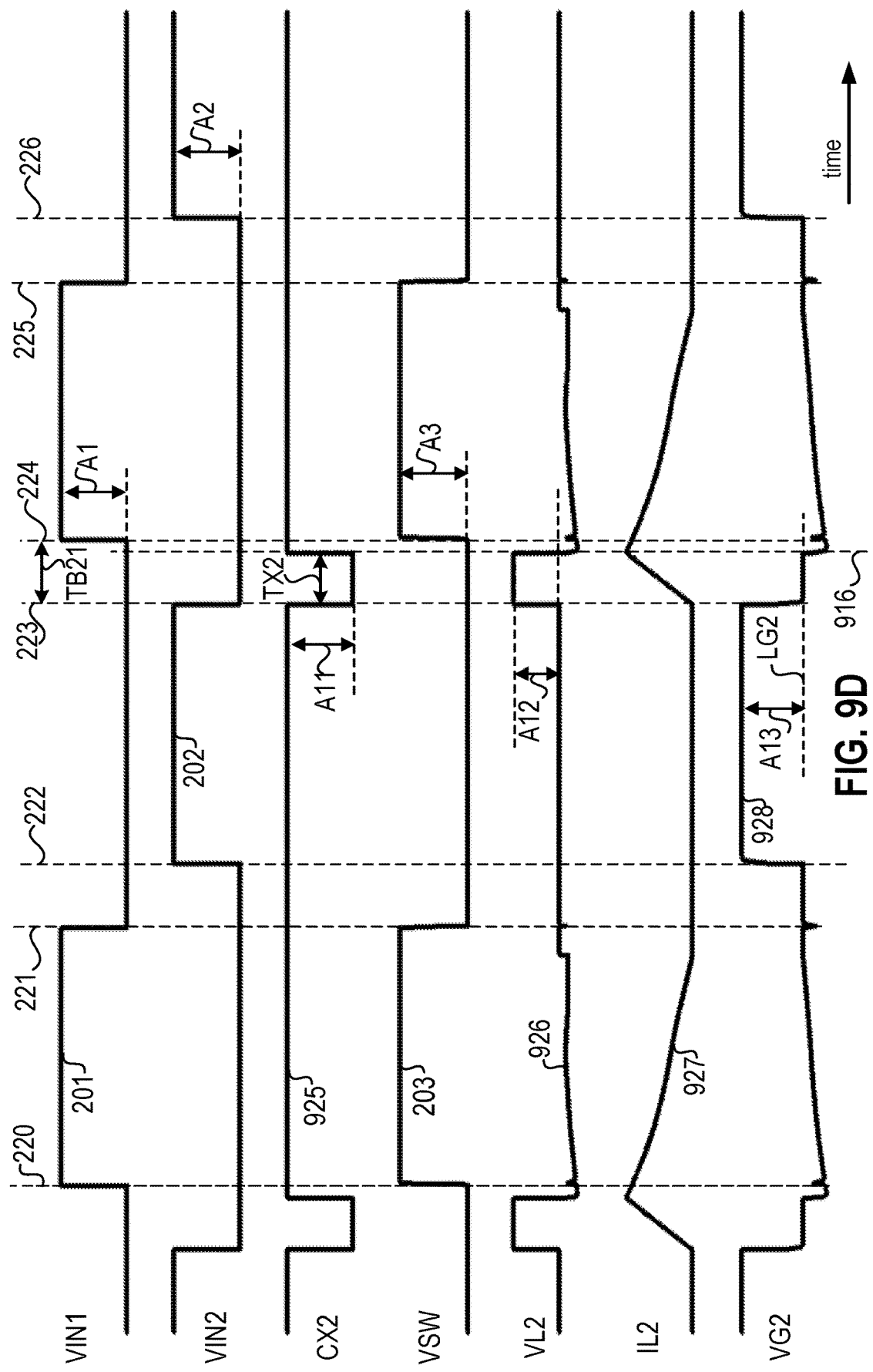

SWITCHED INDUCTIVE STORAGE ELEMENT TO ENHANCE GATE DRIVE AT TURN-OFF

CROSS-REFERENCE TO RELATED APPLICATION(S)

This application claims the benefit of U.S. Provisional Application Ser. No. 63/430,955, entitled "A SWITCHED INDUCTIVE STORAGE ELEMENT TO ENHANCE GATE DRIVE AT TURN-OFF" and filed on Dec. 7, 2022, which is expressly incorporated by reference herein in its entirety.

FIELD OF THE DISCLOSURE

The present invention relates to using an inductive storage element to enhance gate drive to a switching device at turn-off and more specifically to enhance the gate drive to a low-side and/or high-side device at turn-off.

BACKGROUND INFORMATION

Power conversion and power supply circuitry is often used in switching high voltages (e.g., voltages exceeding six-hundred volts). When switching high voltages, it is of fundamental importance that power devices reliably turn on and off as desired. However, the reliability of turn on and off is often impaired. For example, switching induced transients (e.g., systematic noise) may arise in the signals that drive power devices.

Bridge topologies, including half-bridge and full-bridge topologies, are often used in power conversion applications including dc-to-dc power supply modules (e.g., dc-to-dc converters), solar inverters, automotive circuits, motor drivers, and the like. Additionally, bridge topologies often include gated devices (i.e., gated power devices). For instance, in a dual-gate (i.e., half-bridge) topology, a high-side device and a low-side device may be realized using insulated gate bipolar transistors (IGBTs); and high-side and low-side gate drivers may be used to provide gate drive to the IGBTs.

Gate drivers (e.g., high-side and low-side gate drivers) often use isolation. For instance, a half-bridge topology may use reverse biased junctions to isolate the high-side gate driver from the low-side gate driver. Alternatively, and additionally, a half-bridge topology may use galvanic isolation (e.g., an optocoupler) to isolate the high-side gate driver from the low-side gate driver.

BRIEF DESCRIPTION OF THE DRAWINGS

Non-limiting and non-exhaustive embodiments of a switched inductive storage element to enhance gate drive at turn-off are described with reference to the following figures, wherein like reference numerals refer to like parts throughout the various views unless otherwise specified.

FIG. 9D illustrates simulated waveforms of a half-bridge driver according to an embodiment.

Figure 1A:
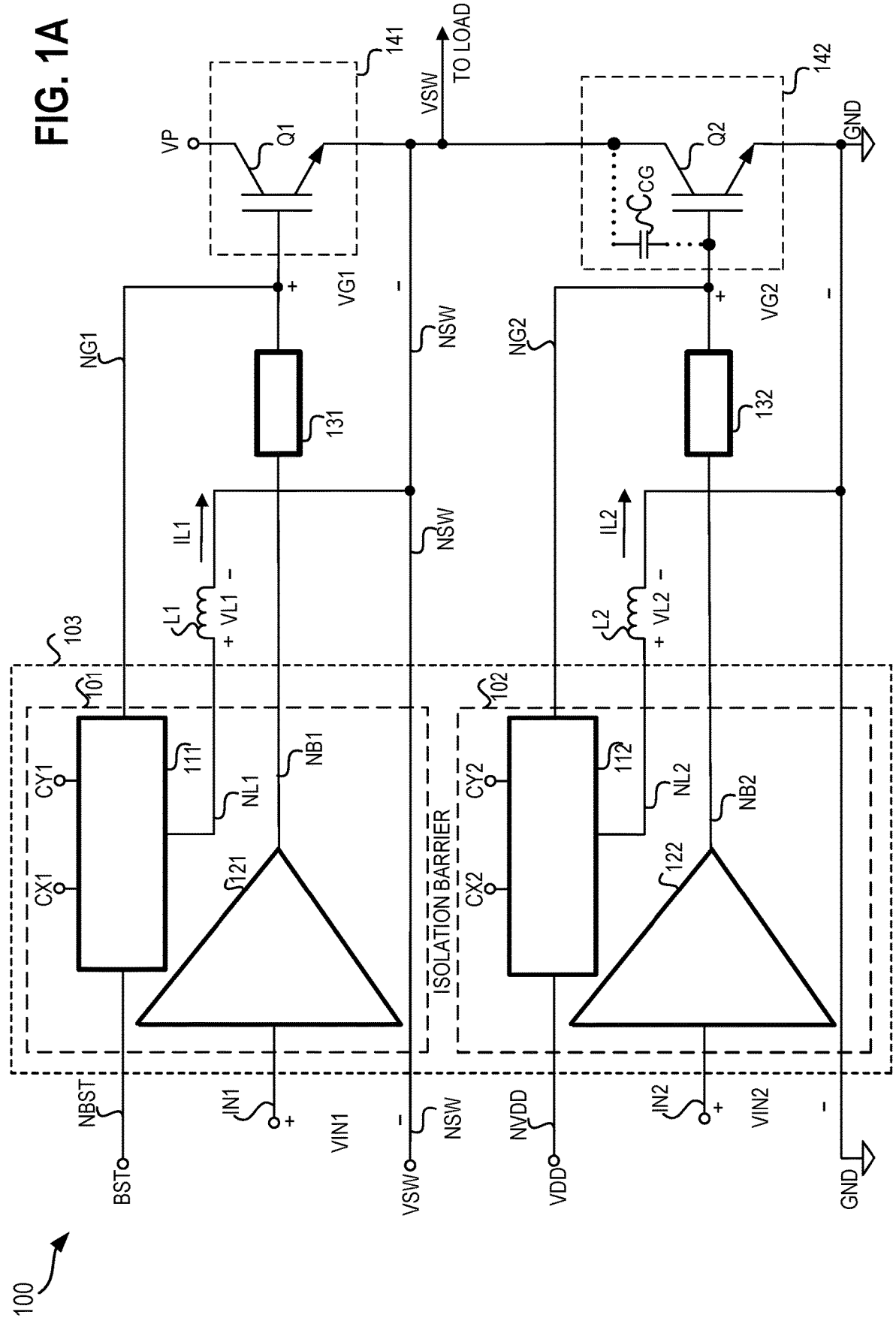
FIG. 1A illustrates a half-bridge driver for driving a high-side device and a low-side device according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the teachings herein. Also, common but well-understood elements that are useful or necessary in a commercially feasible embodiment are often not depicted in order to facilitate a less obstructed view of these various embodiments of a switched inductive storage element to enhance gate drive at turn-off.

DETAILED DESCRIPTION

In the following description, numerous specific details are set forth in order to provide a thorough understanding of a switched inductive storage element to enhance gate drive at turn-off. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure, or characteristic described in connection with the embodiment or example is included in at least one embodiment of a switched inductive storage element to enhance gate drive at turn-off. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a logic circuit, or other suitable components that provide the described functionality. In addition, it is appreciated that the figures provided herewith are for explanation purposes to persons ordinarily skilled in the art and that the drawings, including waveforms and graphs, are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, in one embodiment, a high-voltage transistor comprises an N-channel metal-oxide-semiconductor (NMOS) field-effect transistor (FET) with the high-voltage being supported between the first terminal, a drain, and the second terminal, a source. Also, for purposes of this disclosure, "ground" or "ground potential" refers to a reference voltage or potential against which all other voltages or potentials of an electronic circuit or integrated circuit (IC) are defined or measured.

As discussed above, one type of bridge topology is a half-bridge topology. The half-bridge topology, also referred to as a dual-gate topology, may include gate drivers and gated devices (e.g., IGBTs).

In consumer, low power, and price-sensitive applications it may be common practice to switch the gated devices using a gate drive signal between a local ground potential and a supply voltage. For instance, a low-side gate driver may drive the gate of a low-side device (e.g., an IGBT) between zero volts (i.e., a system ground potential) and fifteen volts (i.e., a supply voltage). Alternatively, and additionally, a high-side gate driver may drive the gate of a high-side device (e.g., an IGBT) between a switch node voltage (i.e., a local ground potential from a switch node) and a bootstrap voltage (i.e., a bootstrap supply voltage).

As discussed above, when switching a gated device off (e.g., switching from high to low), there may be a switching induced transient (i.e., systematic noise) which potentially causes the device to either remain on or to turn on unintentionally. Such transients may degrade and possibly damage circuit components including the gated device.

One approach to mitigate switching induced transients may be to introduce a split supply thereby availing a negative supply rail (i.e., a negative voltage source). However, a split supply requires an additional voltage source and may not be practical for consumer, low power, and price-sensitive applications. Accordingly, there is a need for a bridge topology (e.g., a half bridge topology) which allows operation between a local ground potential and a supply voltage while mitigating unwanted transient noise (e.g., switching induced noised).

A switched inductive storage element to enhance gate drive at turn-off is described herein. According to the teachings herein, an inductive storage element (e.g., an inductor) may be switched between a supply node and a gate node of the gated device (e.g., a low-side device and/or a high-side device). While coupled to the supply node, the inductive storage element may be energized; and subsequently, while coupled to the gate node of the gated device, the inductive storage element may drive the gate node (i.e., the gate of the low-side and/or high-side device) below the local ground potential.

FIG. 1A illustrates a half-bridge driver 100 for driving a high-side device 141 and a low-side device 142 according to an embodiment. The half-bridge driver 100 includes a half-bridge module 103, a high-side inductive storage element L1, a high-side impedance network 131, a low-side inductive storage element L2, and a low-side impedance network 132. The half-bridge module 103 includes a high-side module 101 and a low-side module 102. The high-side module 101 includes a high-side buffer 121 and a high-side inductor switch block 111; and the low-side module 102 includes a low-side buffer 122 and a low-side inductor switch block 112. The high-side device 141 comprises an insulated gate bipolar transistor (IGBT) Q1; and the low-side device 142 comprises an insulated gate bipolar transistor (IGBT) Q2.

According to FIG. 1A, the collector of IGBT Q1 may receive a power supply voltage VP; and the emitter of IGBT Q1 may be connected to a switch node NSW. The collector of IGBT Q2 may be connected to switch node NSW, and the emitter of IGBT Q2 may be connected to ground GND.

Additionally, the gate of IGBT Q1 may be electrically coupled to a high-side gate node NG1 and the gate of IGBT Q2 may be electrically coupled to a low-side gate node NG2.

As illustrated, the high-side buffer 121 may receive an input voltage VIN1 at an input IN1; and the low-side buffer 122 may receive an input voltage VIN2 at input IN2. Additionally, the high-side impedance network 131 may be electrically coupled between the high-side gate node NG1 and a buffer output node NB1 of high-side buffer 121; and the low-side impedance network 132 may be electrically coupled between the low-side gate node NG2 and a buffer output node NB2 of low-side buffer 122.

Thus, the high-side buffer 121 may be electrically coupled to the high-side gate node NG1 by virtue of the high-side impedance network 131; and the low-side buffer 122 may be electrically coupled to the low-side gate node NG2 by virtue of the low-side impedance network 132. Accordingly, the high-side buffer 121 may drive the gate of (i.e., provide a gate voltage VG1 to) high-side device 141 in response to the input voltage VIN1; and the low-side buffer 122 may drive the gate of (i.e., provide a gate voltage VG2 to) the low-side device 142 in response to the input voltage VIN2.

Also as illustrated, the high-side module 101 may be isolated from the low-side module 102. For instance, as discussed above with regards to types of isolation, the high-side module 101 and low-side module 102 may be isolated using reverse biased junctions; alternatively, and additionally, the high-side module 101 and low-side module 102 may be isolated using galvanic isolation. Furthermore, in some embodiments the half-bridge module 103 may integrate the high-side module 101 and the low-side module 102. For instance, the high-side module 101 and the low-side module 102 may be fabricated as a monolithic integrated circuit; alternatively, the high-side module 101 and the low-side module 102 may be assembled together in a hybrid package.

In accordance with the operation of half-bridge topologies, the gates of high-side device 141 and low-side device 142 may be driven so that the switch node voltage VSW at switch node NSW has a time varying waveform. For instance, the switch node voltage VSW may have a square-wave waveform with values between the power supply voltage VP and ground GND.

As discussed above, when the power supply voltage VP is a high voltage (e.g., a voltage greater than six-hundred volts) there may be systematic (i.e., transient induced) noise. Transient induced noise may give rise to undesirable parasitic turn-on of the high-side device 141 and/or low-side device 142. For instance, when the low-side buffer 122 drives the low-side gate node NG2 low (i.e., drives the gate of low-side device 142 low), a large transient voltage at the switch node NSW may be coupled to the low-side gate node NG1 by a parasitic capacitor CCG. Thus, when the high-side buffer 121 drives the high-side gate node NG1 high, the parasitic capacitor CCG, which is coupled between low-side gate node NG2 and switch node NSW, may couple the switch node voltage VSW to the low-side gate node NG2 In turn, the low-side device 142 may inadvertently turn-on (i.e., exhibit parasitic turn-on).

According to the teachings herein, the low-side inductor switch block 112 may switch the low-side inductive storage element L2 to drive the low-side gate node NG2 below ground GND (i.e., to drive the gate of low-side device 142 below ground potential). Similarly, the high-side inductor switch block 111 may switch the high-side inductive storage element L1 to drive the high-side gate node NG1 below the switch node NSW (i.e., to drive the gate of high-side device 141 below the switch node voltage VSW).

As illustrated, the low-side inductive storage element L2 is electrically coupled between node NL2 and ground GND. The low-side inductor switch block 112 may receive a first control signal CX2 and second control signal CY2. According to the teachings herein, the first and second control signals CX2, CY2 may be exerted so that the node NL2 is switched to the supply node NVDD, to the low-side gate node NG2, and/or to neither.

Also as illustrated, the supply node NVDD may be electrically coupled to a supply voltage VDD. Accordingly, when the node NL2 is switched (i.e., electrically coupled) to the supply node NVDD, the low-side inductive storage element L2 may be energized by the supply voltage VDD (e.g., fifteen volts relative to ground GND). When the node NL2 is be switched (i.e., electrically coupled) to the low-side gate node NG2, the low-side inductive storage element L2 may, by virtue of stored energy, drive the low-side gate node NG2 below ground GND (e.g., zero volts). Alternatively, when the node NL2 is switched to neither the supply node NVDD nor the low-side gate node NG2, then the node NL2 becomes a high-impedance node to the low-side inductive storage element L2; accordingly, the low-side inductive storage element L2 may electrically float (i.e., exist in a high-impedance path).

Similarly, the high-side inductive storage element L1 is electrically coupled between node NL1 and the switch node NSW. The high-side inductor switch block 111 may receive a first control signal CX1 and second control signal CY1. According to the teachings herein, the first and second control signals CX1, CY1 may be exerted so that the node NL1 is switched to the bootstrap node NBST, to the high-side gate node NG1, and/or to neither.

Also, according to the operation of half-bridge topologies, the switch node NSW may be treated as a local ground node and the switch node voltage VSW may be treated as a local ground. For instance, the input voltage VIN1 and the high-side gate voltage VG1 may be provided relative to the switch node voltage VSW. Accordingly, the switch node voltage VSW may also be referred to as a local ground potential.

Thus, the bootstrap node NBST may be electrically coupled to a bootstrap voltage BST, a local supply voltage relative to the switch node voltage VSW. Accordingly, when the node NL1 is switched (i.e., electrically coupled) to the bootstrap node NBST, the high-side inductive storage element L1 may be energized by the bootstrap voltage BST (e.g., fifteen volts relative to the switch node voltage VSW). When the node NL1 is switched (i.e., electrically coupled) to the high-side gate node NG1, the high-side inductive storage element L1 may, by virtue of stored energy, drive the high-side gate node NG1 below the switch node voltage VSW (i.e., a local ground potential). Alternatively, when the node NL1 is switched to neither the bootstrap node NBST nor the high-side gate node NG1, then the node NL1 becomes a high-impedance node to the high-side inductive storage element L1; accordingly, the high-side inductive storage element L1 may electrically float (i.e., exist in a high-impedance path).

Also, according to the teachings herein, an inductive storage element (e.g., the high-side and/or low-side inductive storage elements L1, L2), may be any electrical component, element, device, and/or entity comprising inductance. The inductance may be intentional and/or parasitic. For instance, as one of ordinary skill in the art may appreciate, an inductor is one example of an inductive storage element. Other non-limiting examples of an inductive storage element may include a wire-wound resistor, a wire bond, a Micro-electromechanical system (MEMs) inductor, a solenoid, one or more transformer windings, and the like.

Figure 1B:
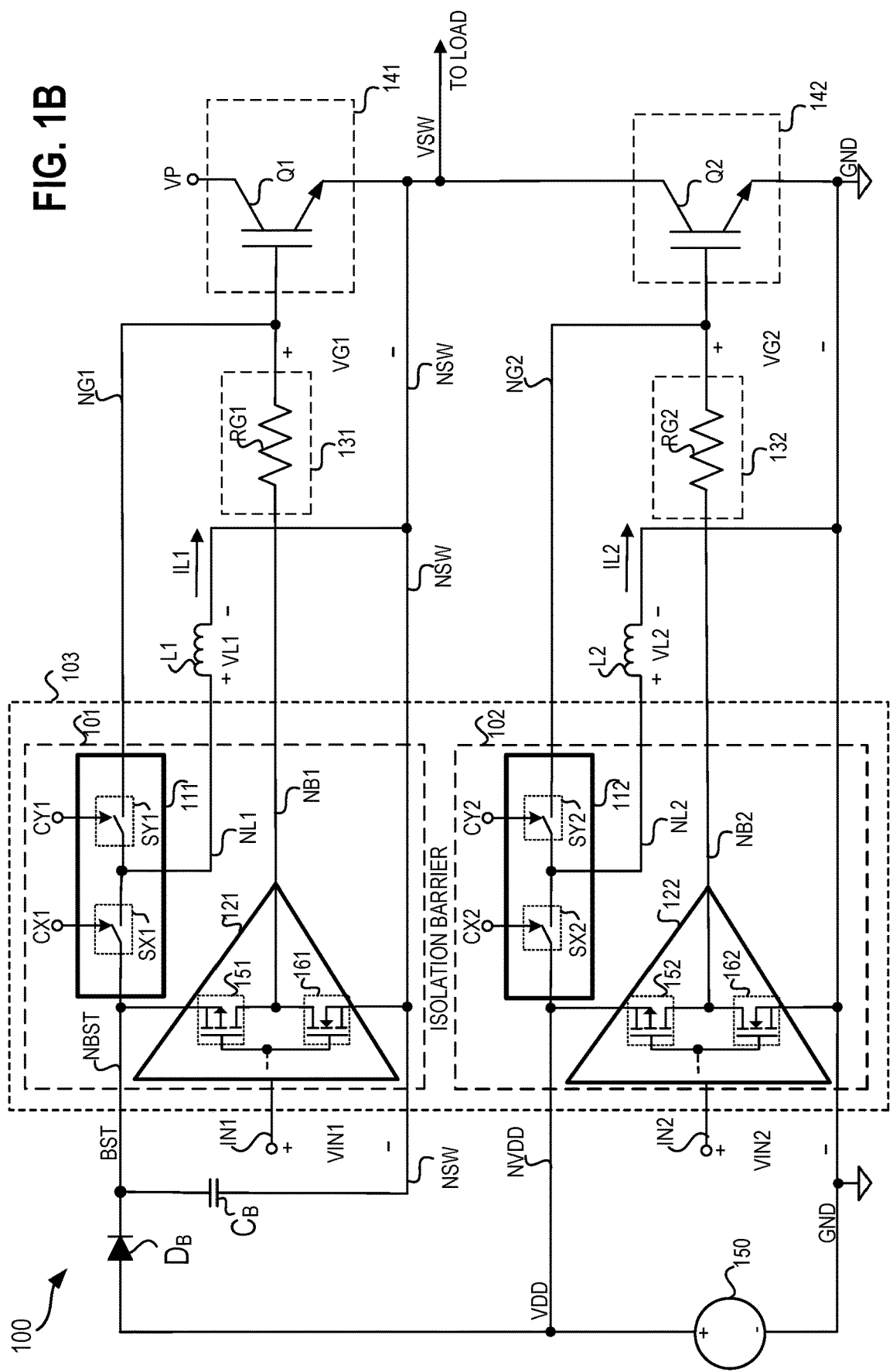
FIG. 1B illustrates a half-bridge driver for driving a high-side device and a low-side device according to another embodiment.

FIG. 1B illustrates a half-bridge driver 100 for driving a high-side device 141 and a low-side device 142 according to another embodiment. As illustrated, the half-bridge driver 100 of FIG. 1B includes a power supply 150, a bootstrap diode $D_B$, and a bootstrap capacitor $C_B$. The power supply 150 is electrically coupled between the supply node NVDD and ground GND. The bootstrap diode $D_B$ is electrically coupled between the supply node NVDD and an anode of the bootstrap diode $D_B$; and the cathode of the bootstrap diode is electrically coupled to the bootstrap node NBST.

According to the operation of half-bridge topologies, the power supply 150 may provide the supply voltage VDD (which is typically 15 volts, although can be larger to provide some compensation) to the supply node NVDD; and in response to switching, the bootstrap capacitor $C_B$ may provide the bootstrap voltage BST to the bootstrap node NBST. For instance, when the switch node voltage VSW transitions low or to ground potential (i.e., transitions to ground GND) the bootstrap diode $D_B$ may become forward biased and allow the power supply 150 to charge the bootstrap capacitor $C_B$ (e.g., charge the bootstrap capacitor $C_B$ to approximately fifteen volts, i.e., the voltage of supply voltage VDD minus the drop across the bootstrap diode $D_B$).

Subsequently, while the switch node voltage VSW transitions high (i.e., transitions towards power supply voltage VP), the bootstrap capacitor $C_B$ may provide the bootstrap voltage BST to the bootstrap node NBST. Moreover, as discussed above, the switch node voltage VSW may be a local ground potential whereby the bootstrap voltage BST assumes a voltage greater than the switch node voltage. For instance, the switch node voltage VSW may transition high to six-hundred volts while the bootstrap voltage BST transitions to approximately six-hundred and fifteen volts.

As illustrated, the high-side buffer 121 includes a p-type field effect transistor PFET 151 and an n-type field effect transistor NFET 161; and the low-side buffer 122 includes a PFET 152 and an NFET 162. The drain of PFET 151 and drain of NFET 161 are electrically coupled to buffer node NB1. Also, the source and body of PFET 151 are electrically coupled to the bootstrap node NBST; and the source and body of NFET 161 are electrically coupled to the switch node NSW. Additionally, the drain of PFET 152 and drain of NFET 162 are electrically coupled to buffer node NB2. The source and body of PFET 152 are electrically coupled to the supply node NVDD; and the source and body of NFET 161 are electrically coupled to ground GND.

The high-side inductor switch block 111 includes a switch SX1 and switch SY1; and the low-side inductor switch block 112 includes a switch SX2 and switch SY2. As illustrated, switch SX1 is electrically coupled between the bootstrap node NBST and node NL1; and switch SY1 is electrically coupled between node NL1 and the high-side gate node NG1. Also, switch SX2 is electrically coupled between the supply node NVDD and node NL2; and switch SY2 is electrically coupled between node NL2 and the low-side gate node NG2.

Additionally, the high-side impedance network 131 comprises a resistor RG1; and the low-side impedance network 132 comprises a resistor RG2. Resistor RG1 is electrically coupled between buffer node NG1 and high-side gate node NG1; and resistor RG2 is electrically coupled between buffer node NG2 and low-side gate node NG2. Although the high-side impedance network 131 comprises a resistor RG1 and the low-side impedance network 132 comprises a resistor RG2, other network configurations are possible. For instance, the high-side and low-side impedance networks 131-132 may include additional passive components and/or active components (e.g., diodes, transistors, and the like).

In accordance with the operation of half-bridge topologies, the high-side buffer 121 may, in response to transitions of the input voltage VIN1, switch (i.e., drive) high-side device 141 on and off. For instance, when PFET 151 is turned on, it may source current to the gate of IGBT Q1 so that the gate voltage VG1, between the high-side gate node NG1 and switch node NSW, exceeds an IGBT threshold voltage. Alternatively, and additionally, when NFET 161 is turned on, it may sink current from the gate of IGBT Q1 so that gate voltage VG1 reduces below an IGBT threshold voltage.

Similarly, low-side buffer 122 may, in response to transitions of the input voltage VIN2, switch (i.e., drive) low-side device 142 on and off. For instance, when PFET 152 is turned on, it may source current to the gate of IGBT Q2 so that the gate voltage VG2, between the low-side gate node NG2 and ground GND, exceeds an IGBT threshold voltage. Alternatively, and additionally, when NFET 162 is turned on, it may sink current from the gate of IGBT Q2 so that gate voltage VG2 reduces below an IGBT threshold voltage.

According to the teachings herein, the high-side inductor switch block 111 may, in response to control signals CX1 and CY1, switch the high-side inductive storage element L1 to mitigate parasitic turn-on of the high-side device 141. For instance, when switch SX1 is turned on by control signal CX1, it may couple the high-side inductive storage element L1 to the bootstrap node NBST. In turn, the high-side inductive storage element L1 may be energized by energy stored on the bootstrap capacitor $C_B$ (i.e., by bootstrap voltage BST). In this regard, the bootstrap capacitor $C_B$ is configured as a bootstrap supply to provide a bootstrap supply voltage BST.

Alternatively, and additionally, when switch SY1 is turned on by control signal CY1, it may subsequently couple the high-side inductive storage element L1 to the high-side gate node NG1. In turn the high-side inductive storage element L1 may sink current from the gate of high-side device 141. Also, according to the teachings herein, the switch SY1 may be turned on when the high-side device 141 is operating in the off state so that the high-side inductive storage element L1 mitigates parasitic turn-on.

Similarly, the low-side inductor switch block 112 may, in response to control signals CX2 and CY2, switch the low-side inductive storage element L2 to mitigate parasitic turn-on of the low-side device 142. For instance, when switch SX2 is turned on by control signal CX2, it may couple the low-side inductive storage element L2 to the supply node NVDD. In turn, the low-side inductive storage element L2 may be energized the power supply 150 (i.e., by supply voltage VDD).

Alternatively, and additionally, when switch SY2 is turned on by control signal CY2, it may subsequently couple the low-side inductive storage element L2 to the low-side gate node NG2. In turn the low-side inductive storage element L2 may sink current from the gate of low-side device 142. Also, according to the teachings herein, the switch SY2 may be turned on when the low-side device 142 is operating in the off state so that the low-side inductive storage element L2 mitigates parasitic turn-on.

Figure 1C:
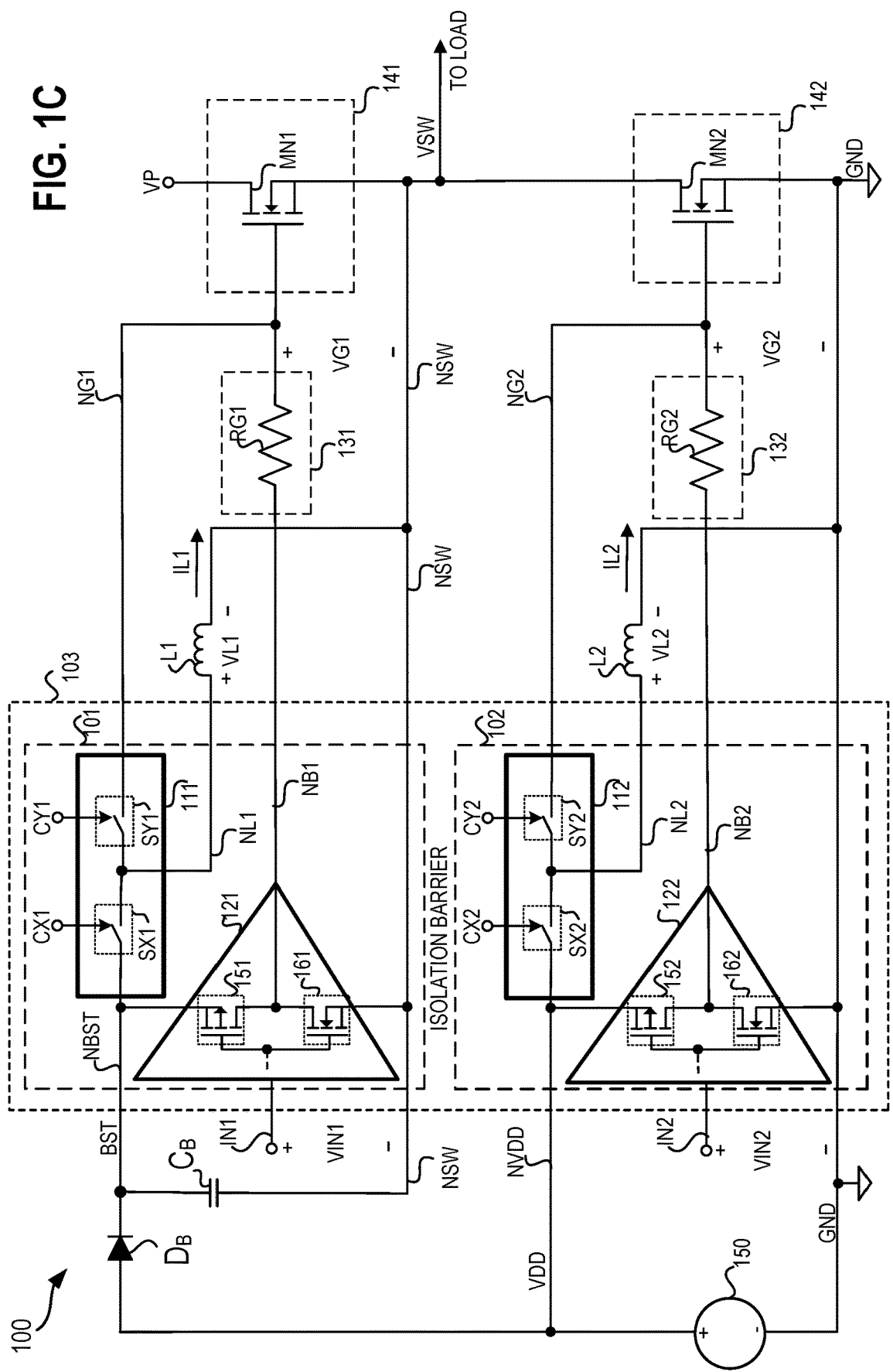
FIG. 1C illustrates a half-bridge driver for driving a high-side device and a low-side device according to another embodiment.

In addition, although FIG. 1A and FIG. 1B illustrate embodiments where the high-side device 141 comprises an IGBT Q1 and the low-side device 142 comprises an IGBT Q2, other configurations are possible. For instance, FIG. 1C illustrates half-bridge driver 100 for driving a high-side device 141 and a low-side device 142 according to another embodiment. Unlike in the embodiments of FIG. 1A and FIG. 1B, in the embodiment of FIG. 1C, the low-side device 141 comprises an n-channel field effect transistor (NFET) MN1; and the high-side device 142 comprises an NFET MN2.

Figure 1D:
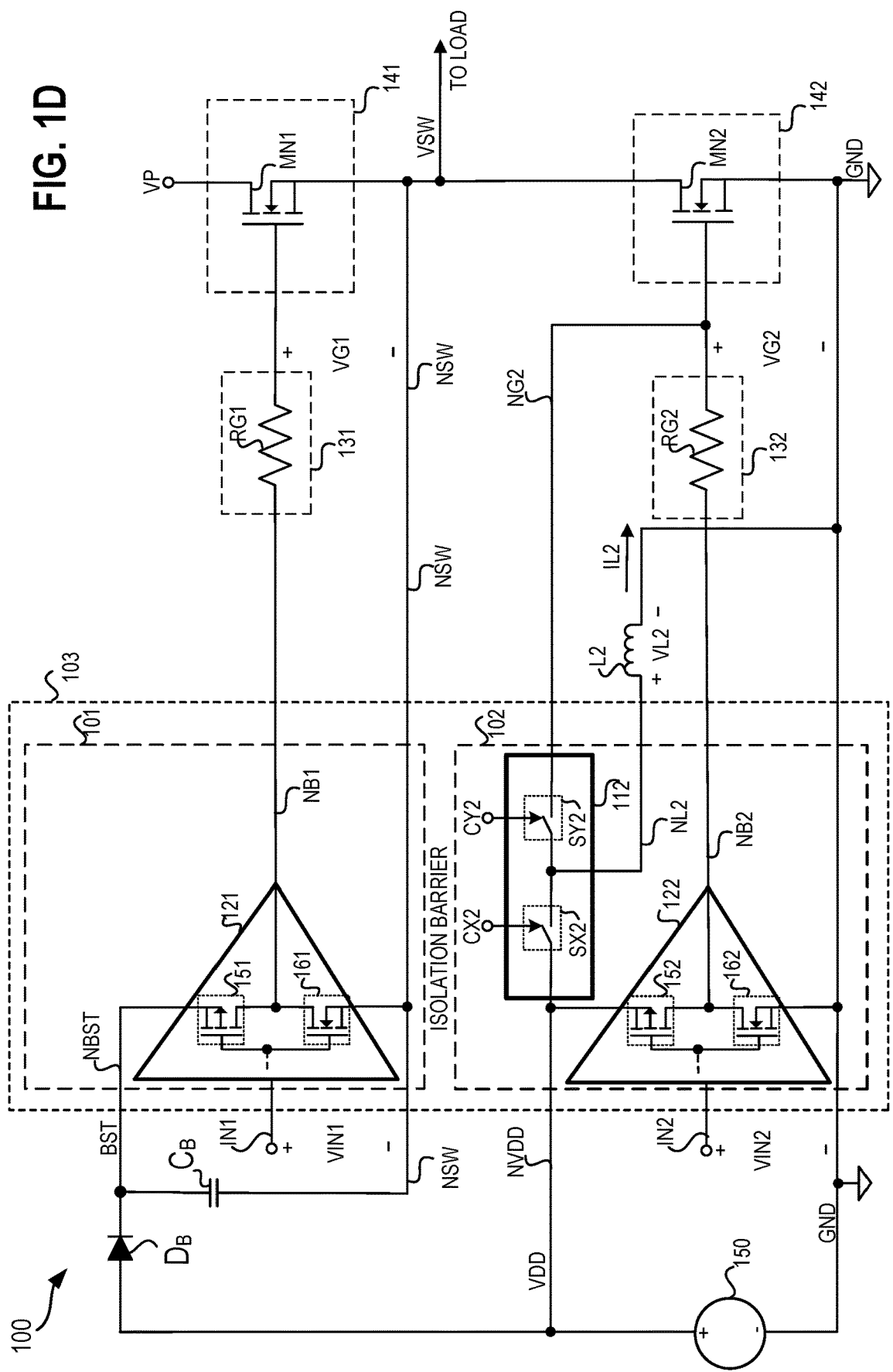
FIG. 1D illustrates a half-bridge driver for driving a high-side device and a low-side device according to another embodiment.

Moreover, although FIG. 1A, FIG. 1B, and FIG. 1C illustrate embodiments where the half-bridge driver 100 includes both high-side and low-side inductor switch blocks 111-112 and high-side and low-side inductive storage elements L1, L2, other configurations are possible. For instance, FIG. 1D illustrates a half-bridge driver 100 for driving a high-side device 141 and a low-side device 142 according to another embodiment. The embodiment of FIG. 1D is like that of FIG. 1C, except it uses only the low-side inductor switch block 112 and the low-side inductive storage element L2.

As discussed above and as presented in the description of waveforms below, the high-side buffer 121 and the low-side buffer 122 respond to transitions of input voltage VIN1 and input voltage VIN2, respectively. In accordance with the operation of half-bridge topologies, the switch node voltage VSW at switch node NSW may undergo switching transitions in response to a switching state (e.g., "on-state" and/or "off-state") of the high-side device 141 and low-side device 142.

According to the teachings herein, the high-side inductive storage element L1 and/or low-side inductive storage element L2 may be switched to enhance the turn-off state of high-side device 141 and low-side device 142. Moreover, as described herein, the high-side inductive storage element L1 and low-side inductive storage element L2 may be switched during switching cycles of input voltages VIN1, VIN2. By virtue of inductive energy storage during the switching cycles, the high-side and low-side inductive storage elements L1, L2, mitigate parasitic turn-on of the high-side device 141 and/or low-side device 142.

Figure 2A:
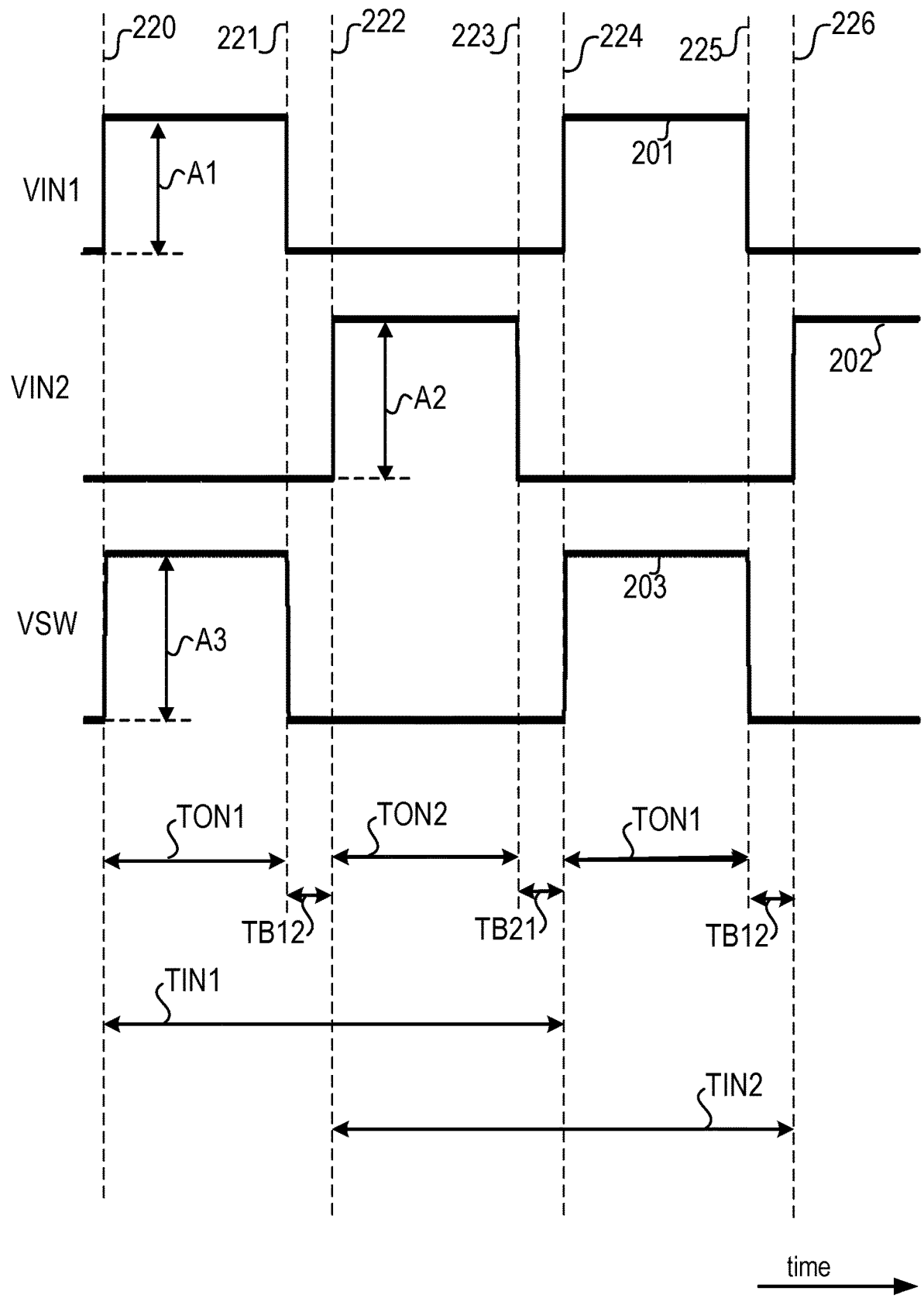
FIG. 2A illustrates switching waveforms during operation of a half-bridge driver.

FIG. 2A illustrates switching waveforms 201-203 during operation of a half-bridge driver 100. Waveforms 201, 202, and 203 respectively correspond with the input voltage VIN1, input voltage VIN2, and switch node voltage VSW as a function of time; and as illustrated, waveforms 201-203 undergo switching at transition times 220-226.

As illustrated by waveform 201, input voltage VIN1 transitions from low to high at time 220 and from high to low at time 221; and the transitions may follow a rectangular waveform with amplitude A1. According to the operation of half-bridge topologies, the amplitude A1 may be a voltage excursion, relative to the switch node NSW and switch node voltage VSW, which has sufficient magnitude to cause the high-side buffer 121 to change states. For instance, the high-side buffer 121 may change state to cause the high-side device 141 to turn on and/or to turn off.

According to a switching cycle of period TIN1, the input voltage VIN1 again transitions from low to high at time 224 and from high to low at time 225. With reference to half-bridge driver 100, the high-side device 141 may be on (i.e., may be conducting) when the input voltage VIN1 is high. Accordingly, the time interval TON1 from time 220 to time 221 may determine an on-time and duty cycle of the high-side device 141.

Similarly, as illustrated by waveform 202, input voltage VIN2 transitions from low to high at time 222 and from high to low at time 223; and transitions may follow a rectangular waveform with amplitude A2. According to the operation of half-bridge topologies, the amplitude A2 may be a voltage excursion, relative to ground GND and a system ground potential, which has sufficient magnitude to cause the low-side buffer 122 to change states. For instance, the low-side buffer 122 may change state to cause the low-side device 142 to turn on and/or to turn off.

According to a switching cycle of period TIN2, the input voltage VIN2 again transitions from low to high at time 226. With reference to half-bridge driver 100, the low-side device 142 may be on (i.e., may be conducting) when the input voltage VIN2 is high. Accordingly, the time interval TON2 from time 222 to time 223 may determine an on-time and duty cycle of the low-side device 142.

Also, as illustrated by waveforms 201 and 202, there is a break-before-make interval TB12 from time 221 to time 222 and again from time 225 to time 226. In accordance with half-bridge topologies, a break-before-make interval TB12 may allow for the high-side device 141 to turn off before the low-side device 142 turns on. As one of ordinary skill in the art may appreciate, the break-before-make interval TB12 may advantageously mitigate shoot-through current between the high-side device 141 and low-side device 142.

Similarly, there is a break-before-make TB21 from time 223 to time 224; and the break-before-make interval TB21 may allow for the low-side device 142 to turn off before the high-side device 141 turns on. Accordingly, the break-before-make interval TB21 may also mitigate shoot-through current between the high-side device 141 and low-side device 142.

As illustrated by waveform 203, the switch node voltage VSW may transition with amplitude A3. For instance, in response to input voltage VIN1 switching high at time 220, the high-side device 141 may drive the switch node NSW from low (e.g., zero volts) to high (e.g., power supply voltage VP); and the switch node voltage VSW may be high while input voltage VIN1 is high due, at least in part, to the high-side device 141 operating in the on state. Additionally, the switch node voltage VSW may be low while the input voltage VIN2 is low due, at least in part, to the low-side device 142 operating in the on state. Although waveform 203 illustrates the switch node voltage VSW as being low during the break-before-make intervals TB12, TB21; other transitions of waveform 203 may be possible based, at least in part, upon the load connected at switch node NSW.

According to the embodiment of FIG. 2A, the waveforms 201-203 may be rectangular with amplitudes A1-A3, respectively. As discussed above, the amplitude A1 of waveform 201 may be a voltage (e.g., ten to fifteen volts) relative to the switch node NSW. Accordingly, the switch node NSW may serve as a local ground reference providing a local ground potential determined by the switch node voltage VSW. Also, as discussed above, the amplitude A2 of waveform 202 may be relative to ground GND. Accordingly, the ground GND serves as a local ground reference providing a local ground potential (e.g., zero volts).

Additionally, although waveforms 201-203 show an embodiment whereby the input voltages VIN1, VIN2 and the switch node voltage VSW are rectangular, other waveforms are possible and applicable to the teachings herein. For instance, as discussed above, waveform 203 may depend, at least in part, upon the type of load (e.g., reactive, resistive). Additionally, the waveforms 201-203 may depend on the type of application (e.g., buck, boost, full bridge), the amount of load (e.g., heavy load and/or light load), and/or a system condition (e.g., transient, steady-state, and/or start up).

Figure 2B:
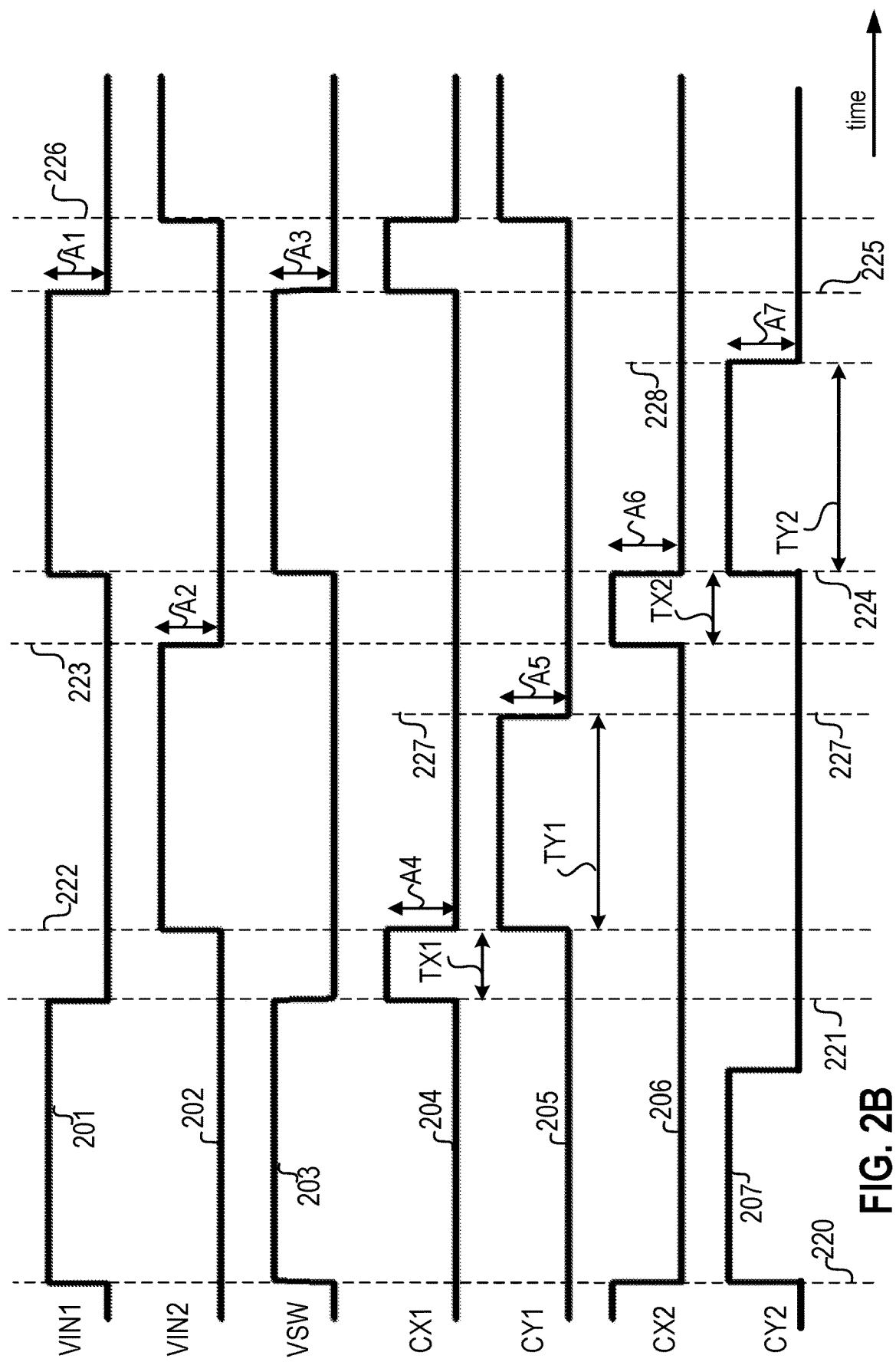
FIG. 2B illustrates switching waveforms during operation of a half-bridge driver.

FIG. 2B illustrates switching waveforms 201-207 during operation of a half-bridge driver 100. As discussed above, waveforms 201, 202, and 203 respectively correspond with the input voltage VIN1, input voltage VIN2, and switch node voltage VSW. Waveforms 204, 205, 206, and 207 may correspond with control signal CX1, control signal CY1, control signal CX2, and control signal CY2, as a function of time.

According to an embodiment, switches SX1, SY1, SX2, and SY2 may receive time varying control signals CX1, CY1, CX2, and CY2 according to a sequence. For instance, as illustrated by waveforms 204-207, control signals CX1, CY1, CX2, and CY2 may be provided as pulses according to a sequence beginning at time 221. Additionally, the sequence may be periodic. For instance, as illustrated, the sequence beginning at time 221 may repeat at time 225.

Moreover, as illustrated, the time varying control signals CX1, CY1, CX2, and CY2 may be provided in relation to the switching of input voltage VIN1 and/or input voltage VIN2. For instance, as illustrated, control signal CX1 may transition high with amplitude A4 (e.g., fifteen volts) at time 221 corresponding with a falling edge of waveform 201 (i.e., input voltage VIN1). Also, as illustrated, control signal CX1 may transition low at time 222 corresponding with a rising edge of waveform 202 (i.e., input voltage VIN2). As discussed below with regards to FIG. 3A, the pulse width TX1 may correspond with the time during which switch SX1 is turned on (i.e., closed).

Also, with reference to FIG. 2A, the pulse width TX1 may be equal or substantially equal to the break-before-make interval TB12. For instance, as illustrated, the control signal CX1 may transition high at time 221 in response to waveform 201 (i.e., input voltage VIN1) and may transition low at time 222 in response to waveform 202 (i.e., input voltage VIN2).

However, although the pulse width TX1 is shown as being substantially equal to the break-before-make interval TB12, other values are possible. For instance, according to another embodiment, the control signal CX1 may transition high after time 221 in response to input voltage VIN1 so that the pulse width TX1 is less than the break-before-make interval TB12. Alternatively, and additionally, control signal CX1 may transition low prior to time 222. Accordingly, the transition edges (i.e., the rising and falling edges) of control signal CX1 may occur during the break-before-make interval TB12; and the pulse width TX1 may be less than or equal to the break-before-make interval TB12.

Also, as illustrated by waveform 205, control signal CY1 may transition high with amplitude A5 (e.g., fifteen volts) at time 222 corresponding with the falling edge of waveform 204 (i.e., control voltage CX1). Additionally, as discussed above, the falling edge of waveform 204 may occur prior to time 222. Accordingly, control signal CY1 may be exerted relative to control voltage CX1; and control signal CY1 may transition high prior to time 222 with the falling edge of waveform 204.

As illustrated, control signal CY1 may transition low at time 227; and as discussed below with regards to FIG. 3B, the pulse width TY1 may correspond with the time during which switch SY1 is turned on (i.e., closed). Moreover, with reference to FIG. 2A, the pulse width TY1 may be less than the time interval TON2. Alternatively, and additionally, time 227 may be chosen to be substantially equal to time 223 so that the pulse width TY1 may be substantially equal to the time interval TON2.

Similarly, as illustrated, control signal CX2 may transition high with amplitude A6 (e.g., fifteen volts) at time 223 corresponding with a falling edge of waveform 202 (i.e., input voltage VIN2). Also, as illustrated, control signal CX2 may transition low at time 224 corresponding with a rising edge of waveform 201 (i.e., input voltage VIN1). As discussed below with regards to FIG. 3C, the pulse width TX2 may correspond with the time during which switch SX2 is turned on (i.e., closed).

Also, with reference to FIG. 2A, the pulse width TX2 may be equal or substantially equal to the break-before-make interval TB21. For instance, as illustrated, the control signal CX2 may transition high at time 223 in response to waveform 202 (i.e., input voltage VIN2) and may transition low at time 224 in response to waveform 201 (i.e., input voltage VIN1).

Additionally, although the pulse width TX2 is shown as being substantially equal to the break-before-make interval TB21, other values are possible. For instance, according to another embodiment, the control signal CX2 may transition high after time 223 in response to input voltage VIN2 so that the pulse width TX2 is less than the break-before-make interval TB21. Alternatively, and additionally, control signal CX2 may transition low prior to time 224. Accordingly, the transition edges (i.e., the rising and falling edges) of control signal CX2 may occur during the break-before-make interval TB21; and the pulse width TX2 may be less than or equal to the break-before-make interval TB21.

Also, as illustrated by waveform 207, control signal CY2 may transition high with amplitude A7 (e.g., fifteen volts) at time 224 corresponding with the falling edge of waveform 206 (i.e., control voltage CX2). Additionally, as discussed above, the falling edge of waveform 206 may occur prior to time 224. Accordingly, control signal CY2 may be exerted relative to control signal CX2; and control signal CY2 may transition high prior to time 224 with the falling edge of waveform 206.

As illustrated, control signal CY2 may transition low at time 228; and as discussed below with regards to FIG. 3D, the pulse width TY2 may correspond with the time during which switch SY2 is turned on (i.e., closed). With reference to FIG. 2A, the pulse width TY2 may be less than the time interval TON1. Alternatively, and additionally, time 228 may be chosen to be substantially equal to time 225 so that the pulse width TY2 may be substantially equal to the time interval TON1.

Figure 2C:
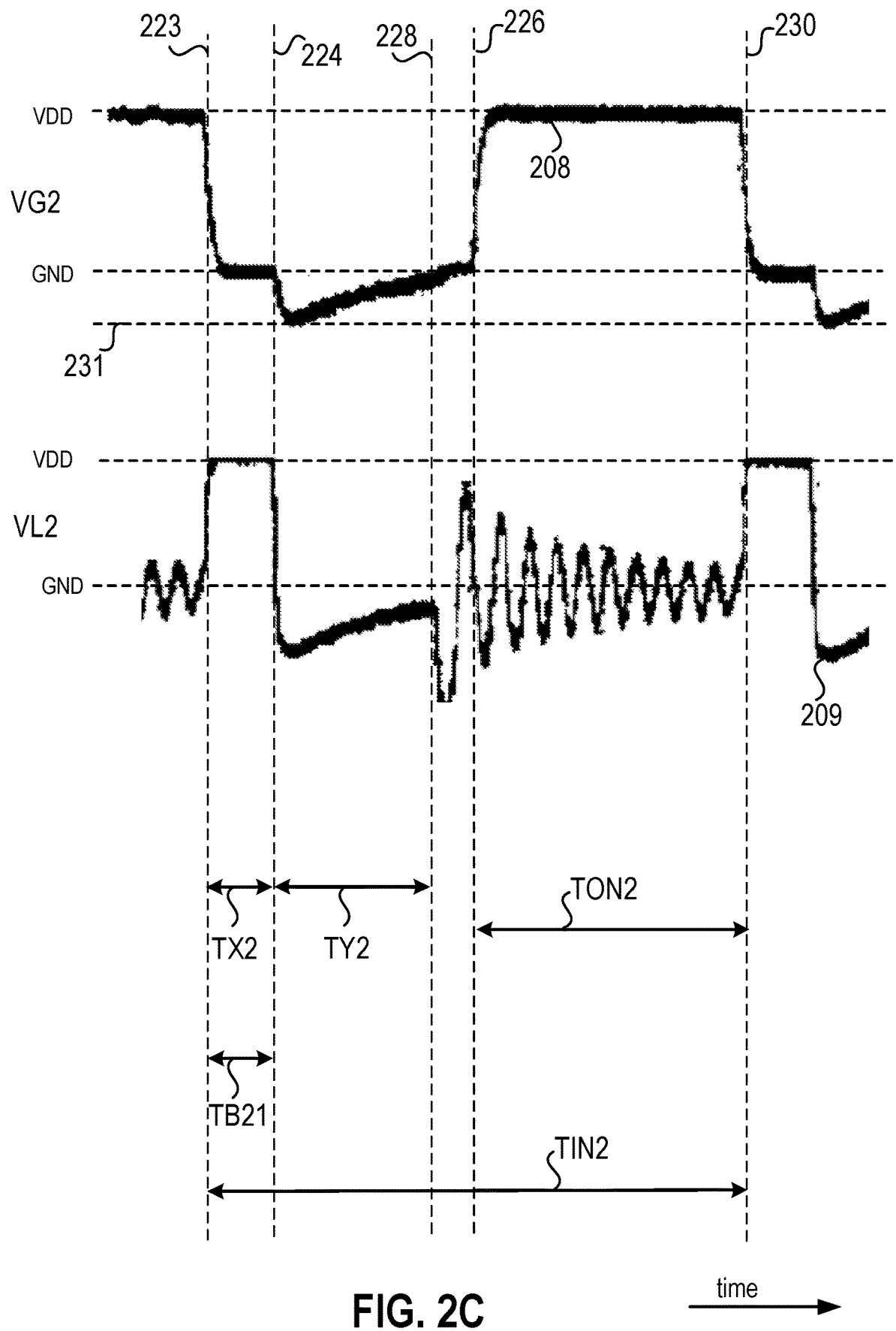
FIG. 2C illustrates switching waveforms during operation of a half-bridge driver.

As discussed above and according to the teachings herein, the high-side inductive storage element L1 and/or low-side inductive storage element L2 may be operated (i.e., switched) to mitigate parasitic turn-on. For instance, FIG. 2C illustrates switching waveforms 208-209 during operation of a half-bridge driver 100. Waveform 208 may correspond to the gate voltage VG2 as a function of time; and waveform 209 may correspond to the voltage VL2 across the low-side inductive storage element L2 as a function of time.

Additionally, waveforms 208 and 209 are illustrated during a switching cycle of period TIN including times 223, 224, 228, 226, and 230. Times 223, 224, 228, and 226 were discussed above with regards to waveforms 201-207; and time 230 may correspond to a time subsequent to time 226. As illustrated, a cycle of period TIN may be delineated from time 223 to time 230.

As discussed above, a break-before-make interval TB21 may begin at time 223 and end at time 224. According to the embodiment of FIG. 2C, the control signal CX2 may be exerted during the break-before-make interval TB21; and as illustrated, the pulse width TX2 may be equal to or substantially equal to the break-before-make interval TB21. Additionally, during break-before-make interval TB21, gate voltage VG2 may be substantially equal to ground potential (i.e., the potential of ground GND). Concurrently, the voltage VL2 may be high and substantially equal to the supply voltage VDD.

Subsequently, from time 224 to time 228, control signal CY2 may be exerted so that the low-side inductive storage element L2 is electrically coupled to the low-side gate node NG2. As discussed herein, the time interval from time 224 to time 228 may correspond with the pulse width TY2 of control signal CY2.

According to the teachings herein, the low-side inductive storage element L2 may cause gate voltage VG2 to be pulled below ground GND (i.e., to attain a voltage lower than that of ground GND). For instance, the voltage at node NL2 may be substantially equal to the voltage VL2; and the gate voltage VG2 may follow that of node NL2. Accordingly, as illustrated by waveform 208, the gate voltage VG2 may be pulled below ground and attain a minimum 231 (e.g., negative five volts).

At time 228 control signal CY2 may be exerted to turn off switch SY2. As illustrated by waveform 209, the voltage VL2 may ring (i.e., oscillate). The ringing may be due, in part, to residual energy remaining in the low-side inductor L2 and to parasitic impedance (e.g., parasitic capacitance) at node NL2.

Also, as illustrated, during the time interval TON2 from time 226 to time 230, the gate voltage VG2 may transition high (i.e., may be driven high) so that the high-side device 142 turns on.

Figure 3A:
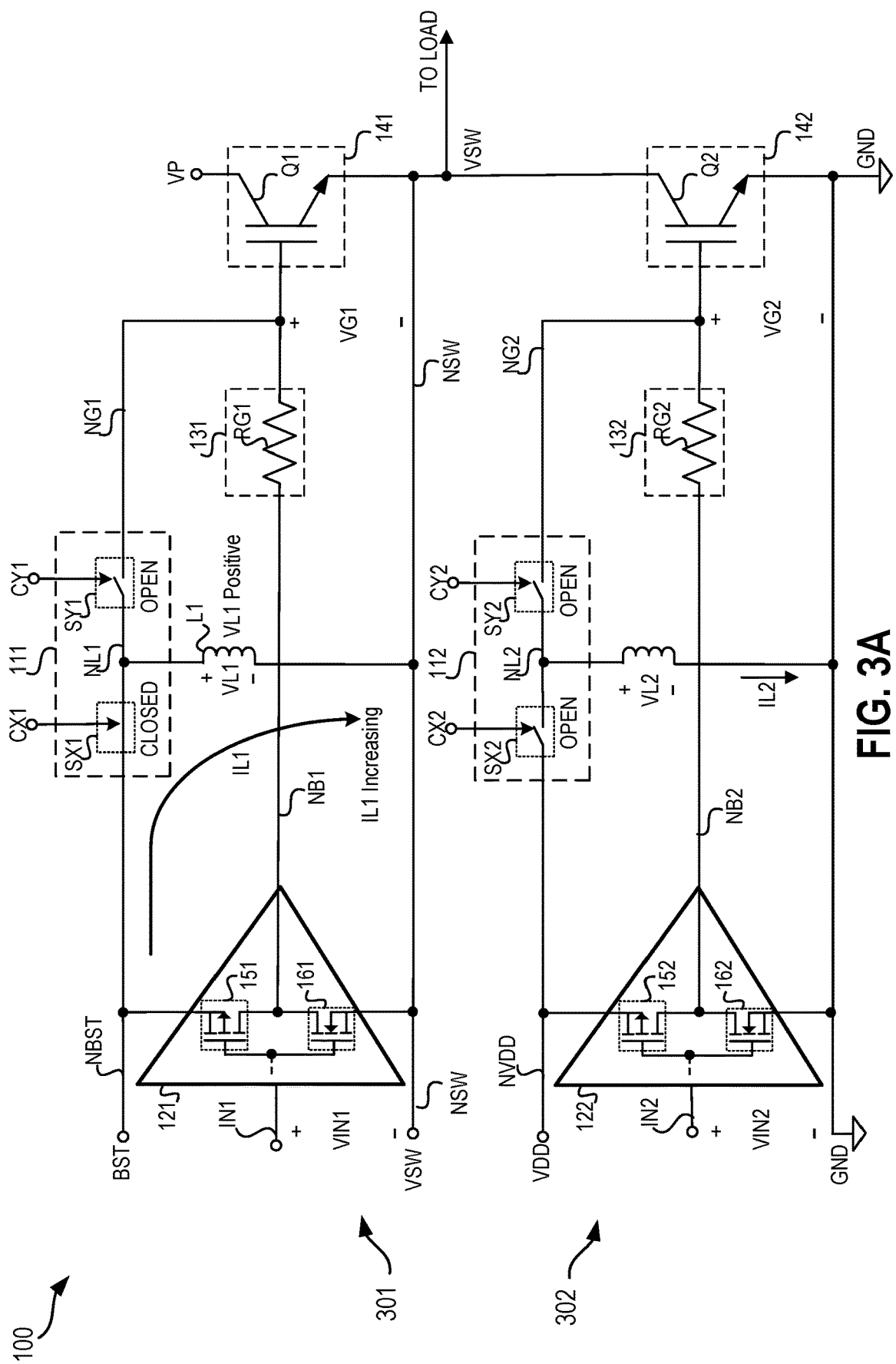
FIG. 3A illustrates a first switching state of a high-side inductive storage element in a half-bridge driver according to an embodiment.

FIG. 3A illustrates a first switching state of a high-side inductive storage element L1 in a half-bridge driver 100 according to an embodiment. During the first switching state, switch SX1 may be closed and switch SY1 may be open so that the high-side inductive storage element L1 is electrically coupled to the bootstrap node NBST. Accordingly, the high-side inductive storage element L1 may be electrically coupled between the bootstrap node NBST and the switch node NSW.

Additionally, the first switching state may correspond with the time duration of pulse width TX1. Also, both switch SX2 and switch SY2 of the low-side inductor switch block 112 may be open such that the node NL2 electrically floats.

As illustrated, during the first switching state, an inductive current IL1 may increase due, at least in part, to the bootstrap voltage BST (i.e., a supply voltage). For instance, the voltage VL1 across the high-side inductive storage element L1 may be approximately equal to the difference between the bootstrap voltage BST and the switch node voltage VSW.

Furthermore, the high-side inductive storage element L1 may comprise inductance; accordingly, the inductive current IL1 may increase at a rate dependent, at least in part, on the inductance and voltage VL1. Also, according to magnetics and circuit theory, the high-side inductive storage element L1 may store energy during the time duration of pulse width TX1.

Figure 3B:
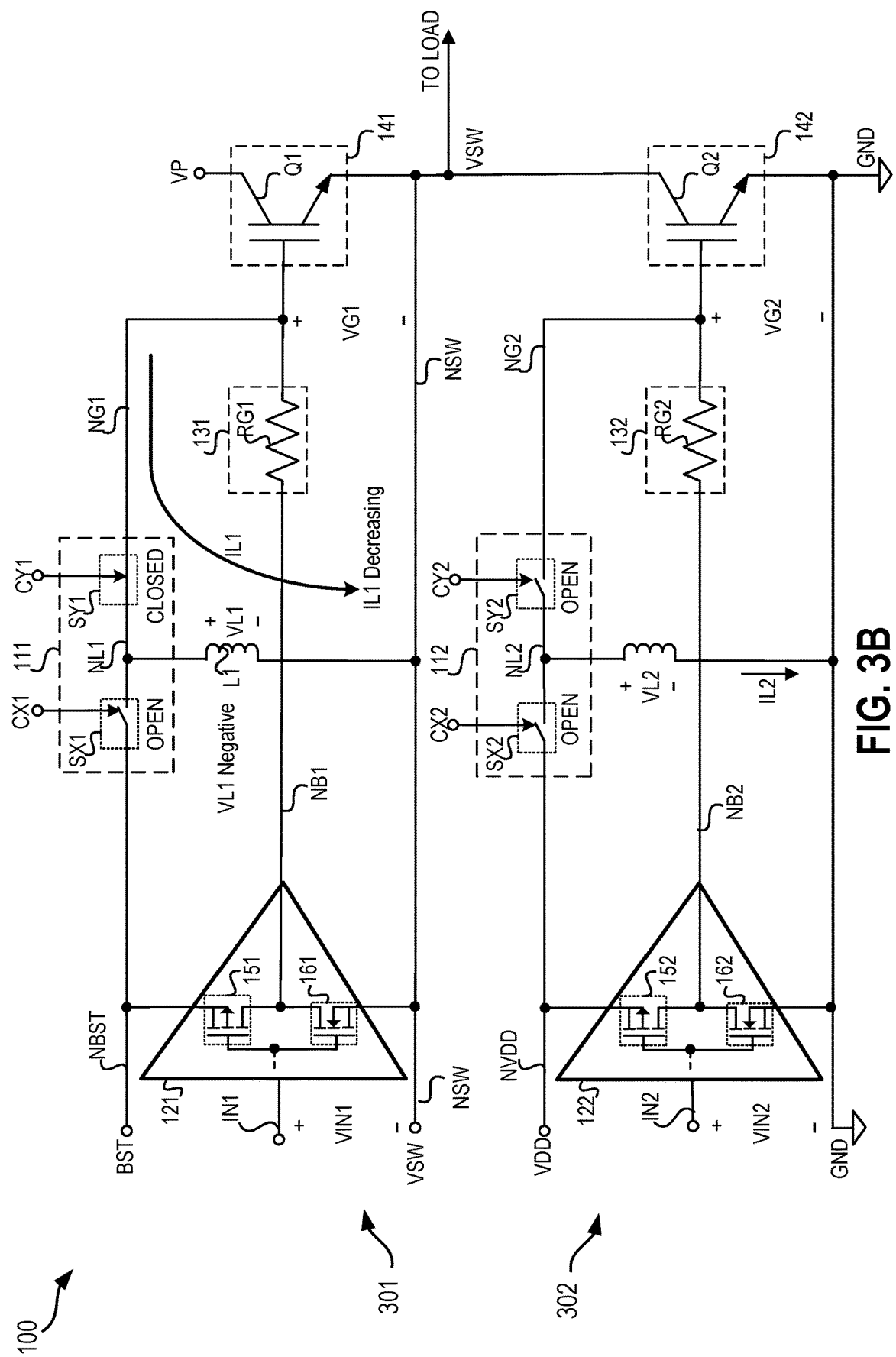
FIG. 3B illustrates a second switching state of a high-side inductive storage element in a half-bridge driver according to an embodiment.

FIG. 3B illustrates a second switching state of a high-side inductive storage element L1 in a half-bridge driver 100 according to an embodiment. During the second switching state, switch SY1 may be closed and switch SX1 may be open so that the high-side inductive storage element L1 is electrically coupled to the high-side gate node NG1. Accordingly, the high-side inductive storage element L1 may be electrically coupled between the high-side gate node NG1 and the switch node NSW.

Additionally, the second switching state may correspond with the time duration of pulse width TY1 during which control signal CY1 is high; and the pulse width TY1 may be selected so that the energy stored during the first switching state is depleted during the second switching state. Also, both switch SX2 and switch SY2 of the low-side inductor switch block 112 may be open such that the node NL2 electrically floats.

As illustrated, during the second switching state, the inductive current IL1 may decrease. Additionally, the voltage VL1 across the high-side inductive storage element L1 may be negative and proportional to the inductance. Accordingly, the voltage at node NL1 may be negative, and according to magnetics and circuit theory, the energy stored during the first switching state allows the inductive current IL1 to continuously decrease.

Figure 3C:
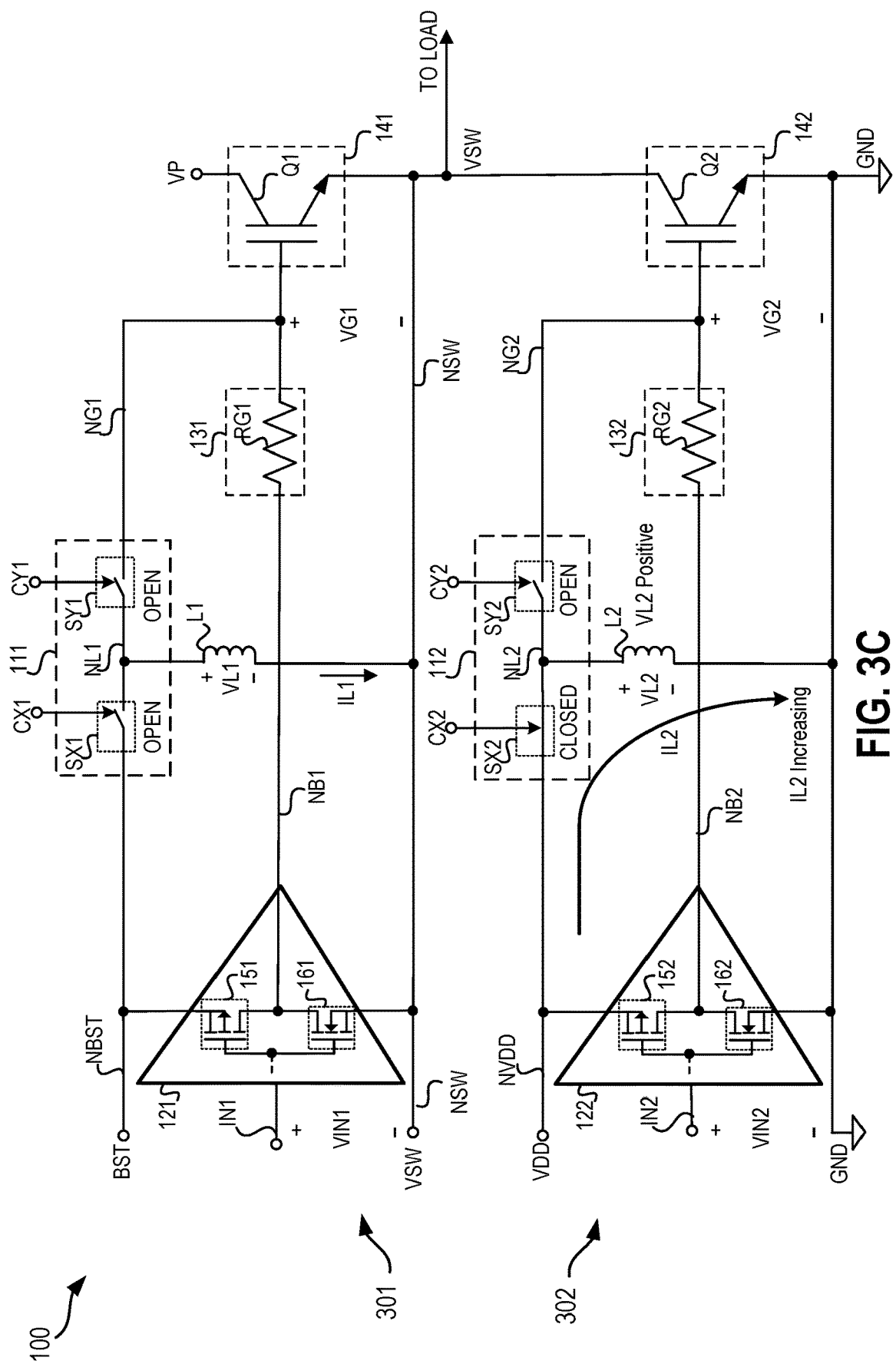
FIG. 3C illustrates a first switching state of a low-side inductive storage element in a half-bridge driver according to an embodiment.

FIG. 3C illustrates a first switching state of a low-side inductive storage element L2 in a half-bridge driver 100 according to an embodiment. During the first switching state, switch SX2 may be closed and switch SY2 may be open so that the low-side inductive storage element L2 is electrically coupled to the supply node NVDD. Accordingly, the low-side inductive storage element L2 may be electrically coupled between the supply node NVDD and ground GND.

Additionally, the first switching state may correspond with the time duration of pulse width TX2. Also, both switch SX1 and switch SY1 of the high-side inductor switch block 111 may be open such that the node NL1 electrically floats.

As illustrated, during the first switching state, an inductive current IL2 may increase as a function of time due, at least in part, to the supply voltage VDD. For instance, the voltage VL2 across the low-side inductive storage element L2 may be approximately equal to the difference between the supply voltage VDD and ground GND (i.e., approximately equal to the supply voltage VDD).

Furthermore, the low-side inductive storage element L2 may comprise inductance; accordingly, the inductive current IL2 may increase at a rate dependent, at least in part, on the inductance and voltage VL2. Also, according to magnetics and circuit theory, the low-side inductive storage element L2 may store energy during the time duration of pulse width TX2.

Figure 3D:
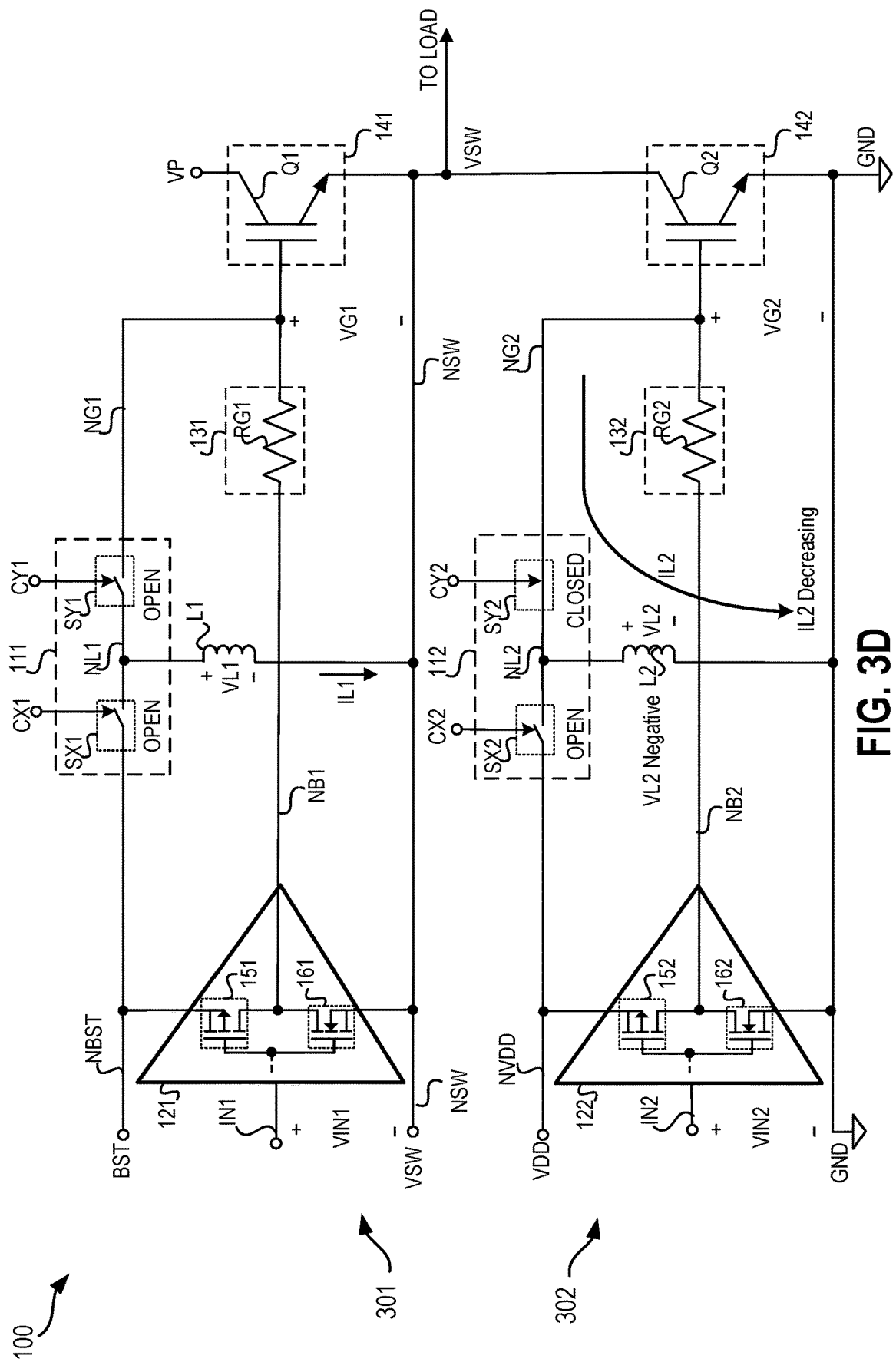
FIG. 3D illustrates a second switching state of low-side inductive storage element in a half-bridge driver according to an embodiment.

FIG. 3D illustrates a second switching state of a low-side inductive storage element L2 in a half-bridge driver 100 according to an embodiment. During the second switching state, switch SY2 may be closed and switch SX2 may be open so that the low-side inductive storage element L2 is electrically coupled to the low-side gate node NG2. Accordingly, the low-side inductive storage element L2 may be electrically coupled between the low-side gate node NG2 and ground GND.

Additionally, the second switching state may correspond with the time duration of pulse width TY2; and the pulse width TY2 may be selected so that the energy stored during the first switching state is depleted during the second switching state. Also, both switch SX1 and switch SY1 of the high-side inductor switch block 111 may be open such that the node NL1 electrically floats.

As illustrated, during the second switching state, the inductive current IL2 may decrease as a function of time. For instance, the voltage VL2 across the low-side inductive storage element L2 may be negative and proportional to the inductance. Accordingly, the voltage at node NL2 may be negative, and according to magnetics and circuit theory, the energy stored during the first switching state allows the inductive current IL2 to continuously decrease.

In addition to illustrating switching states, FIG. 3A, FIG. 3B, FIG. 3C, and FIG. 3D further illustrate the separation of half-bridge driver 100 into a high-side gate driver 301 and a low-side gate driver 302. For instance, as illustrated high-side gate driver 301 may drive the gate of high-side device 141; and low-side gate driver 302 may drive the gate of low-side device 142. Moreover, although the teachings are illustrated with applications of a half-bridge driver 100, other embodiments having greater or fewer gate drivers (i.e., high-side and low-side gate drivers 301, 302) and devices (i.e., high-side and low-side devices 141, 142) are possible. For instance, the teachings herein may also apply to full-bridge drivers having four devices (e.g., four IGBTs or power FETs) and/or to a single gate driver having one device (e.g., a single IGBT).

As discussed above, node NL1 and/or node NL2 may transition between positive and negative voltages relative to a local ground reference (e.g., a switch node NSW and/or ground GND). However, in realizing switches SX1, SY1, SX2, and SY2, a practical challenge arises due, at least in part, to the existence of negative voltages. For instance, realizing switch SX1 and/or switch SX2 with an N-channel field effect transistor (NFET) may prove untenable due to a body diode. Moreover, negative voltages at node NL1 and node NL2 may not avail blocking with the control signal CX1 and control signal CX2 of waveforms 204 and 206, respectively.

Accordingly, there is a need to realize an inductor switch block (e.g., inductor switch block 111 and/or inductor switch block 112) which may operate with negative voltages relative to ground.

Also, as described above, switches SX1, SY1, SX2, and SY2 are controlled using time varying control signals CX1, CY1, CX2, and CY2, respectively. For instance, as shown in FIG. 2B, switch SX1 is turned on when control signal CX1 transitions high at time 221; and switch SY1 is turned on when control signal CY1 transitions high at time 222. According to waveforms 204 and 205, energy storage element L1 may be electrically coupled to the bootstrap node NBST for a duration of pulse width TX1; subsequently, energy storage element L1 may be electrically coupled to the high-side gate node NG1 for a duration of pulse width TY1.

Similarly, switch SX2 is turned on when control signal CX2 transitions high at time 223; and switch SY2 is turned on when control signal CY2 transitions high at time 224. According to waveforms 206 and 207, energy storage element L2 may be electrically coupled to the supply node NVDD for a duration of pulse width TX2; subsequently, energy storage element L2 may be electrically coupled to the low-side gate node NG2 for a duration of pulse width TY2. Additionally, as discussed herein, the duration of pulse width TY1 and pulse width TY2 may depend, at least in part, upon the duration of pulse width TX1 and pulse width TX2, respectively.

In some embodiments, control signals control CX1, CY1, CX2, and CY2 like those of FIG. 2B may be generated by an external controller and/or microprocessor. However, there may be applications wherein an external controller and/or microprocessor may be untenable due to cost and/or area constraints. Additionally, it may be desirable to improve yield by using simpler circuitry with simpler control.

Accordingly, there is a need to realize an inductor switch block (e.g., high-side inductor switch block 111 and/or low-side inductor switch block 112) which operates with simpler control and with fewer than two control signals (e.g., fewer than two control signals CX1, CY1 and/or control signals CX2, CY2).

In this regard, an inductor switch block using a single gate control signal is also disclosed herein. An inductor switch block (i.e., a high-side inductor switch block 111 and/or low-side inductor switch block 112) may be realized using a p-channel field effect transistor (PFET) and a back-to-back switch. The back-to-back switch comprises n-channel field effect transistors (NFETs). A control signal may be applied to the PFET gate to electrically couple an inductive storage element (i.e., a high-side inductive storage element L1 and/or a low-side inductive storage element L2) to a supply node. A back-to-back gate may receive a local ground potential and/or be electrically coupled to a local ground node (e.g., ground GND and/or the switch node NSW). The back-to-back switch may advantageously turn-on and turn-off without the need for an additional control signal.

Inductor Switch Block

Figure 4A:
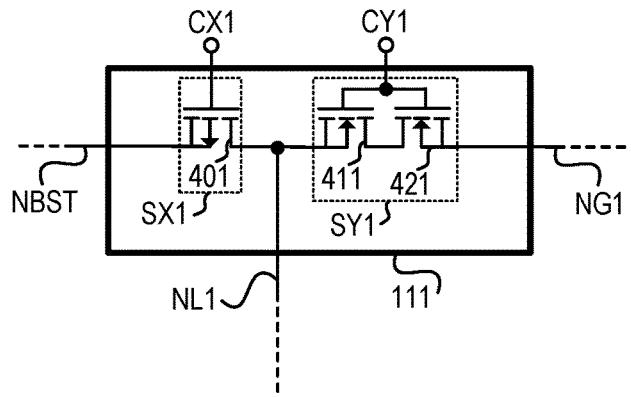
FIG. 4A illustrates a high-side inductor switch block according to an embodiment.

FIG. 4A illustrates a high-side inductor switch block 111 according to an embodiment. High-side inductor switch block 111 includes switch SX1 and switch SY1. Switch SX1 comprises a p-channel field effect transistor (PFET) 401, and switch SY1 comprises a first n-channel field effect transistor (NFET) 411 and a second NFET 421.

As illustrated, the body and source of PFET 401 are electrically coupled to the bootstrap node NBST and the drain of PFET 401 is electrically coupled to node NL1. As discussed above with respect to FIG. 1B, the bootstrap node NBST may receive the bootstrap voltage BST. Also, as described herein, node NL1 may sustain voltages less than or equal to that of bootstrap node NBST. Accordingly, having the body of PFET 401 electrically coupled to the bootstrap node NBST may advantageously assure that a body diode of PFET 401 is reverse biased.

Additionally, the body and source of NFET 411 are electrically coupled to node NL1; and the body and source of NFET 421 are electrically coupled to the high-side gate node NG1. Additionally, the gate of NFET 411 and the gate of NFET 421 are electrically coupled together; and the drain of NFET 411 and the drain of NFET 421 are electrically coupled together. Thus, NFET 411 and NFET 421 have a back-to-back configuration, and the gates of NFET 411 and NFET 421 are connected as a back-to-back gate.

Accordingly, switch SY1 may also be referred to as a back-to-back switch SY1 whereby a body diode of NFET 411 and a body diode of NFET 421 are electrically coupled in series to block bidirectionally. Moreover, as the back-to-back switch SY1 comprises NFET 411 and NFET 421, the switch SY1 may further be referred to as an n-type back-to-back switch SY1.

As illustrated, the gate of PFET 401 may receive a control signal CX1. Therefore, when PFET 401 is an enhancement mode device, then switch SX1 may block when the control signal CX1 is substantially equal to that of the bootstrap node NBST; and switch SX1 may conduct when the control signal CX1 transitions low.

Also, as illustrated, the back-to-back gate may receive a control signal CY1. Therefore, when NFET 411 and NFET 421 are enhancement mode devices, then back-to-back switch SY1 may block when the control signal CY1 is lower than a voltage of the high-side gate node NG1 and of node NL1. Back-to-back switch SY1 may conduct when the control signal CY1 is greater than a voltage of the high-side gate node NG1 and/or of node NL1.

Figure 4B:
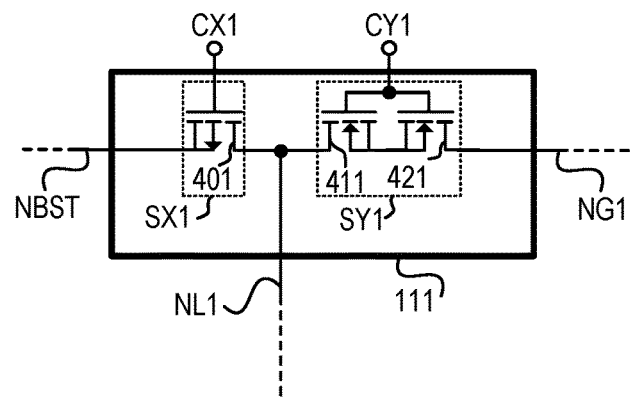
FIG. 4B illustrates a high-side inductor switch block according to another embodiment.

FIG. 4B illustrates a high-side inductor switch block 111 according to another embodiment. High-side inductor switch block 111 of FIG. 4B is like that of FIG. 4A except back-to-back switch SY1 is configured differently. For instance, the body and source of NFET 411 are connected to the body and source of NFET 421. Additionally, the drain of NFET 411 is connected to node NL1; and the drain of NFET 421 is connected to the high-side gate node NG1. Accordingly, the body diode of NFET 411 and the body diode of NFET 421 are electrically coupled in series to block bidirectionally.

Additionally, when NFET 411 and NFET 421 are enhancement mode devices, then back-to-back switch SY1 may block when the control signal CY1 is lower than a voltage of the high-side gate node NG1 and of node NL1. Also, like the back-to-back switch SY1 of FIG. 4A, the back-to-back switch SY1 of FIG. 4B may conduct when the control signal CY1 is greater than a voltage of the high-side gate node NG1 and/or of node NL1.

Figure 4C:
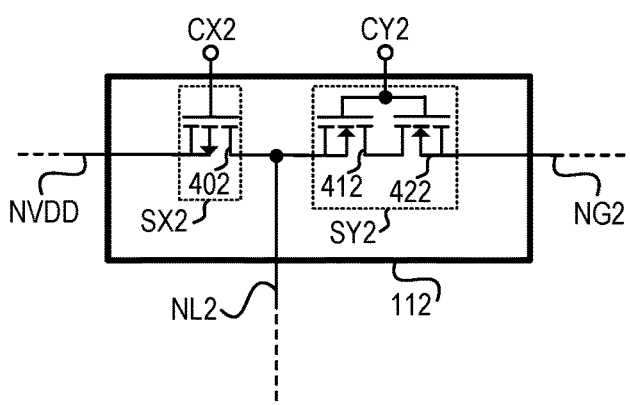
FIG. 4C illustrates a low-side inductor switch block according to an embodiment.

FIG. 4C illustrates a low-side inductor switch block 112 according to an embodiment. Low-side inductor switch block 112 includes switch SX2 and switch SY2 Switch SX2 comprises a p-channel field effect transistor (PFET) 402, and switch SY2 comprises a first n-channel field effect transistor (NFET) 412 and a second NFET 422.

As illustrated, the body and source of PFET 402 are electrically coupled to the supply node NVDD and the drain of PFET 402 is electrically coupled to node NL2. As discussed above with respect to FIG. 1B, the supply node NVDD may receive a supply voltage VDD. Also, as described herein, node NL2 may sustain voltages less than or equal to that of supply node NVDD. Accordingly, having the body of PFET 402 electrically coupled to the bootstrap node NBST may advantageously assure that a body diode of PFET 402 is reverse biased.

Additionally, the body and source of NFET 412 are electrically coupled to node NL2; and the body and source of NFET 422 are electrically coupled to the low-side gate node NG2. Additionally, the gate of NFET 412 and the gate of NFET 422 are electrically coupled together; and the drain of NFET 412 and the drain of NFET 422 are electrically coupled together. Thus, NFET 412 and NFET 422 have a back-to-back configuration, and the gates of NFET 412 and NFET 422 are connected as a back-to-back gate.

Accordingly, switch SY2 may also be referred to as a back-to-back switch SY2 whereby a body diode of NFET 412 and a body diode of NFET 422 are electrically coupled in series to block bidirectionally. Moreover, as the back-to-back switch SY2 comprises NFET 412 and NFET 422, the switch SY2 may further be referred to as an n-type back-to-back switch SY2.

As illustrated, the gate of PFET 402 may receive a control signal CX2. Therefore, when PFET 402 is an enhancement mode device, then switch SX2 may block when the control signal CX2 is substantially equal to that of the supply node NVDD; and switch SX2 may conduct when the control signal CX2 transitions low.

Also, as illustrated, the back-to-back gate may receive a control signal CY2. Therefore, when NFET 412 and NFET 422 are enhancement mode devices, then back-to-back switch SY2 may block when the control signal CY2 is lower than a voltage of the low-side gate node NG2 and of node NL2. Back-to-back switch SY2 may conduct when the control signal CY2 is greater than a voltage of the low-side gate node NG2 and/or of node NL2.

Figure 4D:
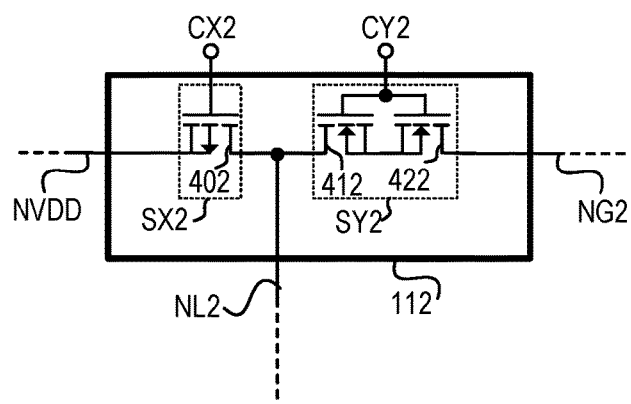
FIG. 4D illustrates a low-side inductor switch block according to another embodiment.

FIG. 4D illustrates a low-side inductor switch block 112 according to another embodiment. Low-side inductor switch block 112 of FIG. 4D is like that of FIG. 4C except back-to-back switch SY2 is configured differently. For instance, the body and source of NFET 412 are connected to the body and source of NFET 422. Additionally, the drain of NFET 412 is connected to node NL2; and the drain of NFET 422 is connected to the low-side gate node NG2. Accordingly, the body diode of NFET 412 and the body diode of NFET 422 are electrically coupled in series to block bidirectionally.

Additionally, when NFET 412 and NFET 422 are enhancement mode devices, then back-to-back switch SY2 may block when the control signal CY2 is lower than a voltage of the low-side gate node NG2 and of node NL2. Also, like the back-to-back switch SY2 of FIG. 4C, the back-to-back switch SY2 of FIG. 4D may conduct when the control signal CY2 is greater than a voltage of the low-side gate node NG2 and/or of node NL2.

Figure 5A:
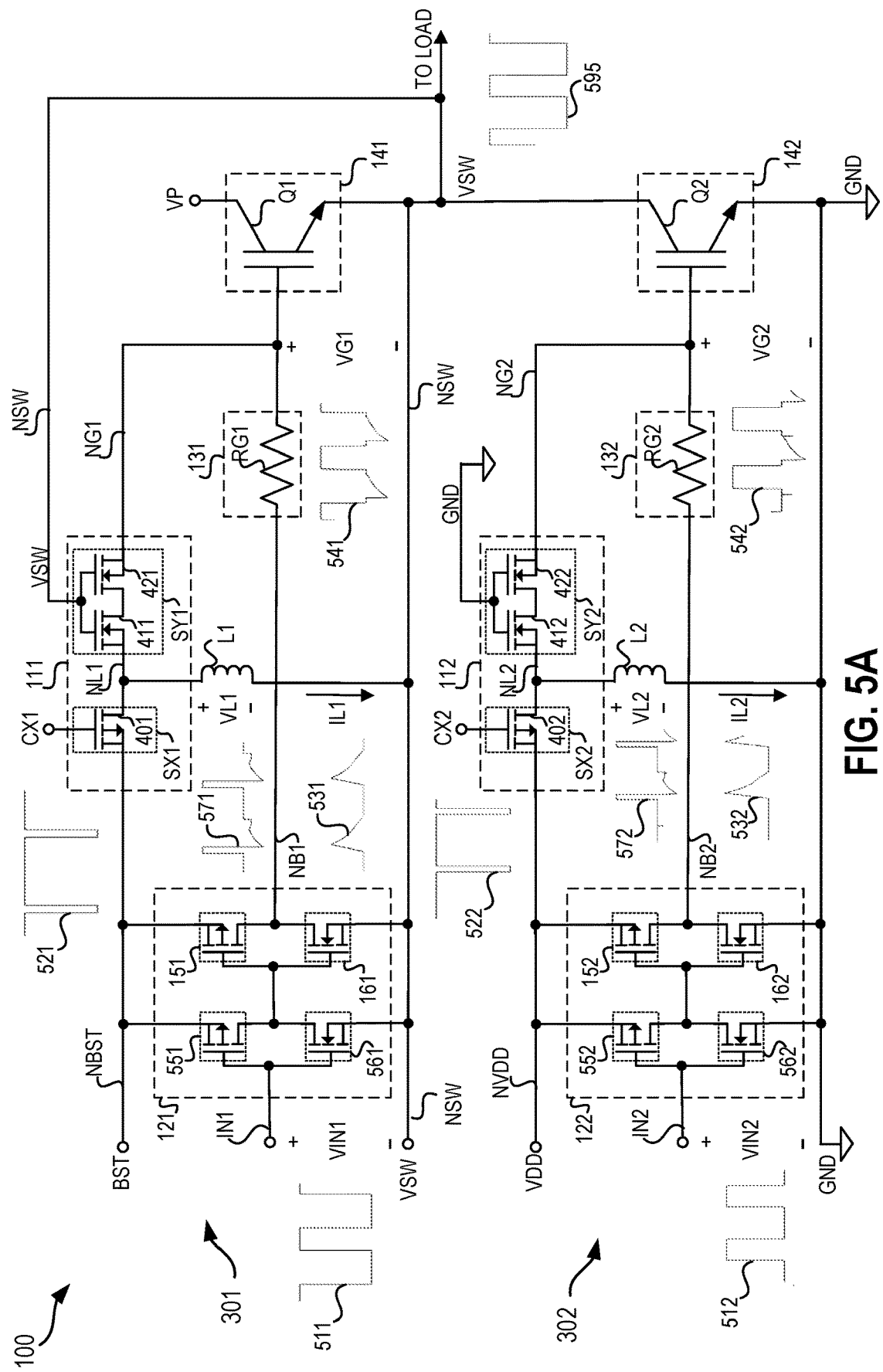
FIG. 5A illustrates a half-bridge driver for driving a high-side device and a low-side device according to an embodiment.

FIG. 5A illustrates a half-bridge driver 100 for driving a high-side device 141 and a low-side device 142 according to an embodiment. As discussed above with regards to FIG. 3A-FIG. 3D, half-bridge driver 100 includes a high-side gate driver 301 and a low-side gate driver 302. In accordance with the operation of half-bridge topologies, the high-side gate driver 301 may drive the gate of the high-side device 141; and the low-side gate driver 302 may driver the gate of the low-side device 142. Thus, high-side gate driver 301 may provide the gate voltage VG1 relative to the switch node NSW; and low-side gate driver 302 may provide the gate voltage VG2 relative to ground GND.

Also, in accordance with the operation of half-bridge topologies, the switch node NSW may be a local ground node whereby the switch node voltage VSW is a local ground potential. In this context, ground GND (i.e., the system ground GND) may also be a local ground node whereby ground GND is systematically a local ground potential (e.g., zero volts). Additionally, the bootstrap node NBST may be a local supply node whereby the bootstrap voltage BST is a local supply voltage; and the supply node NVDD may be a local supply node whereby the supply voltage VDD is a local supply voltage.

As illustrated, the high-side buffer 121 includes PFET 151, PFET 551, NFET 161, and NFET 561. The body and source of PFET 151 and of PFET 551 may be electrically coupled to the bootstrap node NBST; and the body and source of NFET 161 and of NFET 561 may be electrically coupled to the switch node NSW. The gate of PFET 551 and of NFET 561 may be coupled together at the input IN1; and the gate of PFET 151 and of NFET 161 may be coupled to the drain of PFET 551 and the drain of NFET 561. Additionally, the drain of PFET 151 and the drain of NFET 161 may be electrically coupled to the buffer output node NB1.

Also, as illustrated the high-side impedance network 131 is electrically coupled between the buffer output node NB1 and the high-side gate node NG1. Accordingly, resistor RG1 is electrically coupled between the buffer output node NB1 and the high-side gate node NG1.

As discussed above, the high-side inductor switch block 111 includes switch SX1 and a back-to-back switch SY1. As illustrated, switch SX1 comprises PFET 401 electrically coupled between the bootstrap node NBST and node NL1; and back-to-back switch SY1 comprises NFET 411 and NFET 421 electrically coupled between the high-side gate NG1 and node NL1. Additionally, high-side inductive storage element L1 is electrically coupled between node NL1 and the switch node NSW.

As illustrated, the back-to-back gate of back-to-back switch SY1 may receive the local ground potential (i.e., the switch node voltage VSW). For instance, the back-to-back gate (i.e., the gate of NFET 411 and the gate of NFET 421) may be electrically coupled to the switch node NSW to receive the switch node voltage VSW, a local ground potential of the high-side gate driver 301.

Similarly, the low-side buffer 122 includes PFET 152, PFET 552, NFET 162, and NFET 562. The body and source of PFET 152 and of PFET 552 may be electrically coupled to the supply node; and the body and source of NFET 162 and of NFET 562 may be electrically coupled to ground GND. The gate of PFET 552 and of NFET 562 may be coupled together at the input IN2; and the gate of PFET 152 and of NFET 162 may be coupled to the drain of PFET 552 and the drain of NFET 562. Additionally, the drain of PFET 152 and the drain of NFET 162 may be electrically coupled to the buffer output node NB2.

Also, as illustrated the low-side impedance network 132 is electrically coupled between the buffer output node NB2 and the low-side gate node NG2. Accordingly, resistor RG2 is electrically coupled between the buffer output node NB2 and the low-side gate node NG2.

As discussed above, the low-side inductor switch block 112 includes switch SX2 and a back-to-back switch SY2. As illustrated, switch SX2 comprises PFET 402 electrically coupled between the supply node NVDD and node NL2; and back-to-back switch SY2 comprises NFET 412 and NFET 422 electrically coupled between the high-side gate NG2 and node NL2. Additionally, high-side inductive storage element L2 is electrically coupled between node NL2 and ground GND.

As illustrated, the back-to-back gate of back-to-back switch SY2 may receive the local ground potential (i.e., the switch node voltage VSW). For instance, the back-to-back gate (i.e., the gate of NFET 412 and the gate of NFET 422) may be electrically coupled to ground GND to receive the ground potential (e.g., zero volts), a local ground potential of the low-side gate driver 302.

In accordance with the operation of half-bridge topologies, the high-side gate driver 301 may receive a time varying input voltage VIN1 at input IN1; and the low-side gate driver 302 may receive a time varying input voltage VIN2 at input IN2. For instance, waveform 511 may illustrate the input voltage VIN1 relative to the switch node NSW; and waveform 512 may illustrate the input voltage VIN2 relative to ground GND. Waveform 595 may illustrate the switch node voltage VSW at switch node NSW.

When the input voltage VIN1 transitions high, PFET 151 may source current through high-side impedance network 131 (i.e., via resistor RG1) and drive the gate of high-side device 141 toward the bootstrap voltage BST. Alternatively, when the input voltage VIN1 transitions low, NFET 161 may sink current through high-side impedance network 131 and drive the gate of the high-side device 141 toward the switch node voltage VSW.

According to the teachings herein, when the gate of the high-side device 141 transitions toward the switch node voltage VSW, the high-side inductive storage element L1 may be used to mitigate parasitic turn-on of the high-side device 141. For instance, as illustrated by waveform 531 of the inductive current IL1 and by waveform 571 of voltage VL1, the inductive current IL1 may increase when switch SX1 is closed; and the inductive current IL1 may decrease when back-to-back switch SY1 is subsequently closed. According to electromagnetic theory and as illustrated by waveforms 531 and 571, while inductive current IL1 decreases, the voltage VL1 may become negative.

Accordingly, if back-to-back switch SY1 is subsequently closed while the high-side buffer 121 drives the gate (i.e., the device gate) of high-side device 141 low, then the high-side inductive storage element L1 may advantageously drive the high-side gate node NG1 to a voltage lower than that of the switch node NSW. For instance, as illustrated by waveform 541, the gate voltage VG1 may be driven negative relative to the switch node voltage VSW. In some embodiments, resistor RG1 may be selected so that a body diode of NFET 161 remains reverse biased (i.e., remains off) while the high-side gate node NG1 is driven below the local ground potential (i.e., below the switch node voltage VSW).

Also, according to the teachings herein, the high-side inductor switch block 111 may be operated with one control signal CX1 provided to the gate of switch SX1 and with a local ground potential (i.e., the switch node voltage VSW) provided to the gate of the back-to-back switch SY1. For instance, PFET 401 and NFETs 411, 421 may be enhancement mode devices. Therefore, as illustrated by waveform 521, when control signal CX1 transitions low, switch SX1 (i.e., PFET 401) may turn on (i.e., may conduct). Subsequently, when control signal CX1 transitions high, then back-to-back switch SY1 (i.e., NFET 411 and NFET 421) may turn-on due to electromagnetic energy stored in high-side inductive storage element L1. For instance, when control signal CX1 transitions high, as illustrated by waveform 521, then node NL1 may become negative relative to the switch node NSW, and consequently, relative to the back-to-back gate. In turn, back-to-back switch SY1 may turn on (i.e., conduct) in response to voltage VL1 becoming negative.

Similarly, when the input voltage VIN2 transitions high, PFET 152 may source current through low-side impedance network 132 (i.e., via resistor RG2) and drive the gate of high-side device 142 toward the supply voltage VDD. Alternatively, when the input voltage VIN2 transitions low, NFET 162 may sink current through low-side impedance network 132 and drive the gate of the low-side device 142 toward ground GND (e.g., toward zero volts).

According to the teachings herein, when the gate of the low-side device 142 transitions towards ground GND, the low-side inductive storage element L2 may be used to mitigate parasitic turn-on of the low-side device 142. For instance, as illustrated by waveform 532 of the inductive current IL2 and by waveform 572 of voltage VL2, the inductive current IL2 may increase when switch SX2 is closed; and the inductive current IL2 may decrease when back-to-back switch SY2 is subsequently closed. According to electromagnetic theory and as illustrated by waveforms 532 and 572, while inductive current IL2 decreases, the voltage VL2 may become negative.

Accordingly, if back-to-back switch SY2 is subsequently closed while the low-side buffer 122 drives the gate (i.e., the device gate) of low-side device 142 low, then the low-side inductive storage element L2 may advantageously drive the low-side gate node NG2 to a voltage lower than ground GND. For instance, as illustrated by waveform 542, the gate voltage VG2 may be driven negative relative to ground GND. In some embodiments, resistor RG2 may be selected so that a body diode of NFET 162 remains reverse biased (i.e., remains off) while the low-side gate node NG2 is driven below the local ground potential (i.e., below ground GND).

Also, according to the teachings herein, the low-side inductor switch block 112 may be operated with one control signal CX2 provided to the gate of switch SX2 and with a local ground potential (i.e., ground GND) provided to the gate of the back-to-back switch SY2. For instance, PFET 402 and NFETs 412, 422 may be enhancement mode devices. Therefore, as illustrated by waveform 522, when control signal CX2 transitions low, switch SX2 (i.e., PFET 402) may turn on (i.e., may conduct). Subsequently, when control signal CX2 transitions high, then back-to-back switch SY2 (i.e., NFET 412 and NFET 422) may turn-on due, at least in part, to electromagnetic energy stored in low-side inductive storage element L2. For instance, when control signal CX2 transitions high, as illustrated by waveform 522, then node NL2 may become negative relative to ground GND, and consequently, relative to the back-to-back gate. In turn, back-to-back switch SY2 may turn on (i.e., conduct) in response to voltage VL2 becoming negative.

Although FIG. 5A illustrates the back-to-back gate of back-to-back switch SY1 as being electrically coupled to the local switch node NSW and the back-to-back gate of back-to-ack switch SY2 as being electrically coupled to ground GND, other configurations are possible. For instance, FIG. 5B illustrates a half-bridge driver 100 for driving a high-side device 141 and a low-side device 142 according to another embodiment.

Figure 5B:
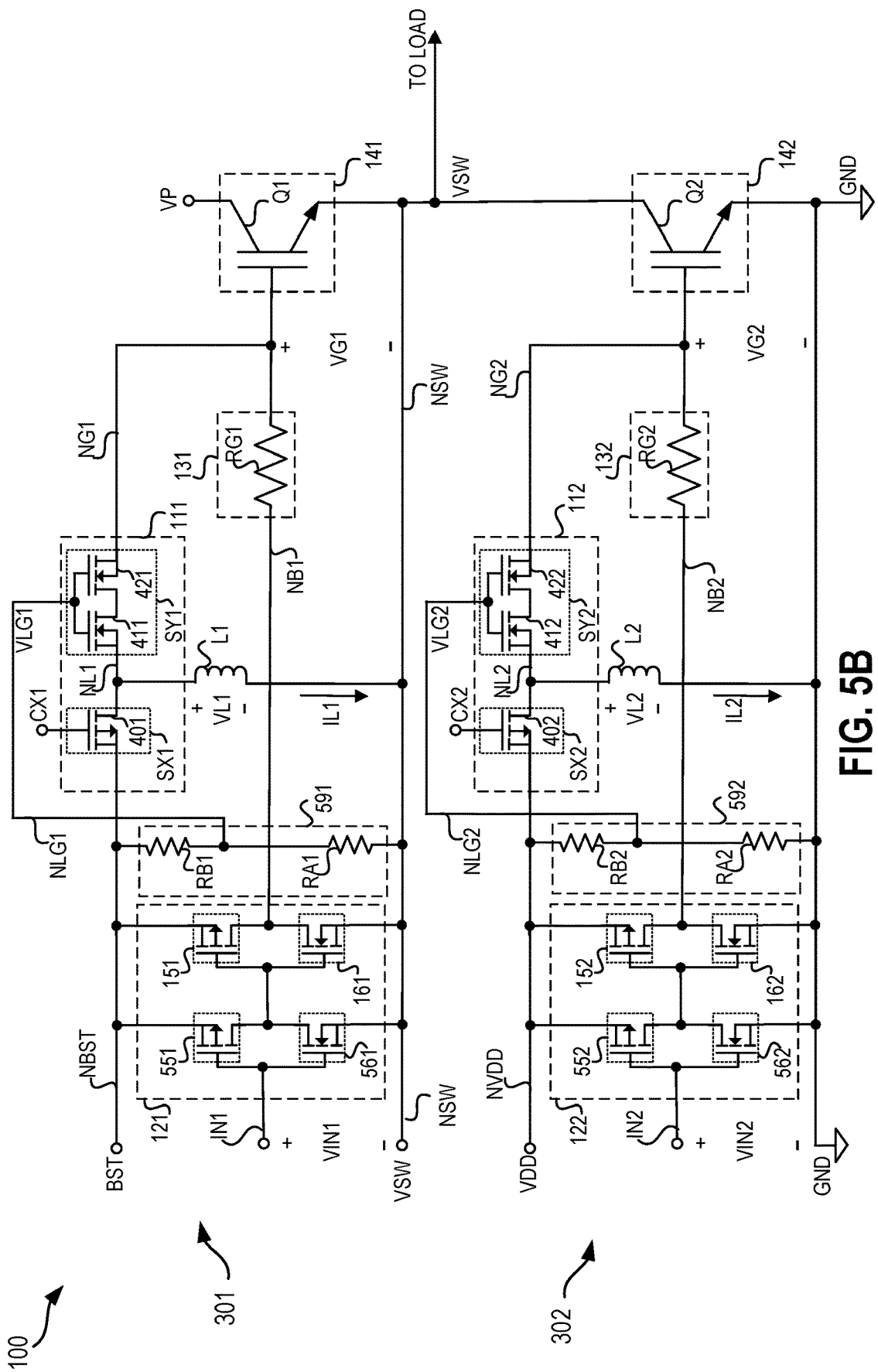
FIG. 5B illustrates a half-bridge driver for driving a high-side device and a low-side device according to another embodiment.

The embodiment of FIG. 5A is like that of FIG. 5B except it includes resistors RB1, RA1, RB2, RA2. As illustrated, resistors RB1, RA1 may be electrically coupled between the bootstrap node NBST and switch node NSW to form a resistor divider 591; and resistors RB2, RA2 may be electrically coupled between the supply node NVDD and ground GND to form a resistor divider 592.

According to the embodiment of FIG. 5B, the back-to-back gate of back-to-back switch SY1 may be electrically coupled to a local alternating current (ac) ground node NLG1 (e.g., ac ground node NLG1 from resistor divider 591). Alternatively, and additionally, the back-to-back gate of back-to-back switch SY2 may be electrically coupled to a local ac-ground node NLG2 (e.g., ac ground node NLG2 from resistor divider 592).

As illustrated, the local ac-ground node NLG1 may provide a fixed potential VLG1 (i.e., an ac ground); and the local ac-ground NLG2 may provide a fixed potential VLG2 (i.e., an ac ground). The fixed potential VLG1 may be selected so that back-to-back switch SY1 remains off (i.e., blocks) while voltage VL1 is greater than zero, and so that back-to-back switch SY1 turns on (i.e., conducts) when voltage VL1 becomes negative. Similarly, the fixed potential VLG2 may be selected so that back-to-back switch SY2 remains off (i.e., blocks) while voltage VL2 is greater than zero, and so that back-to-back switch SY2 turns on (i.e., conducts) when voltage VL2 becomes negative.

Figure 6:
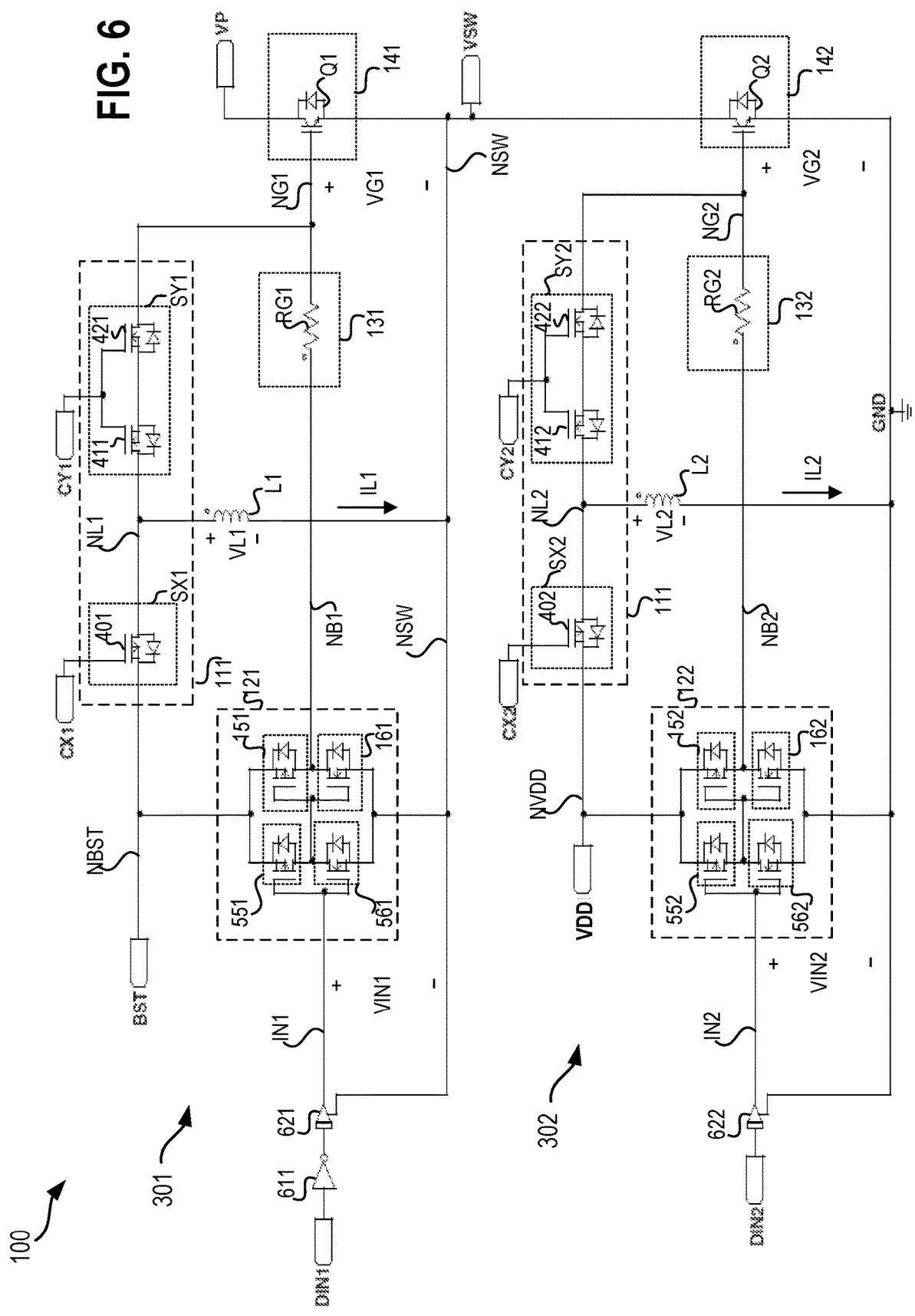
FIG. 6 illustrates a half-bridge driver for driving a high-side device and a low-side device according to an embodiment.

FIG. 6 illustrates a half-bridge driver 100 for driving a high-side device 141 and a low-side device 142 according to an embodiment. The embodiment of FIG. 6 shows a PSIM realization of the half-bridge driver 100 of FIG. 5A. (PSIM is a circuit simulation software tool, and the now cancelled PSIM trademark was assigned to Powersim Inc.—An Altair Company, 1820 E. Big Beaver Rd., Troy, MI 48083.)

The embodiment of FIG. 6 is like that of FIG. 5A except it includes additional components. For instance, the high-side gate driver 301 includes an interface control element 621 and a logic NOT gate 611 (i.e., an inverter 611); and the low-side gate driver 302 includes an interface control element 622. As illustrated, interface control element 621 may provide the input voltage VIN1 in response to signal DIN1; while interface control element 622 may provide input voltage VIN2 in response to signal DIN2. Additionally, as discussed below with regards to FIG. 7, interface control element 621 may level shift signal DIN1 to provide input voltage VIN1 relative to the switch node voltage VSW; and interface control element 622 may level shift signal DIN2 to provide input voltage VIN2 relative to ground GND.

Figure 7:
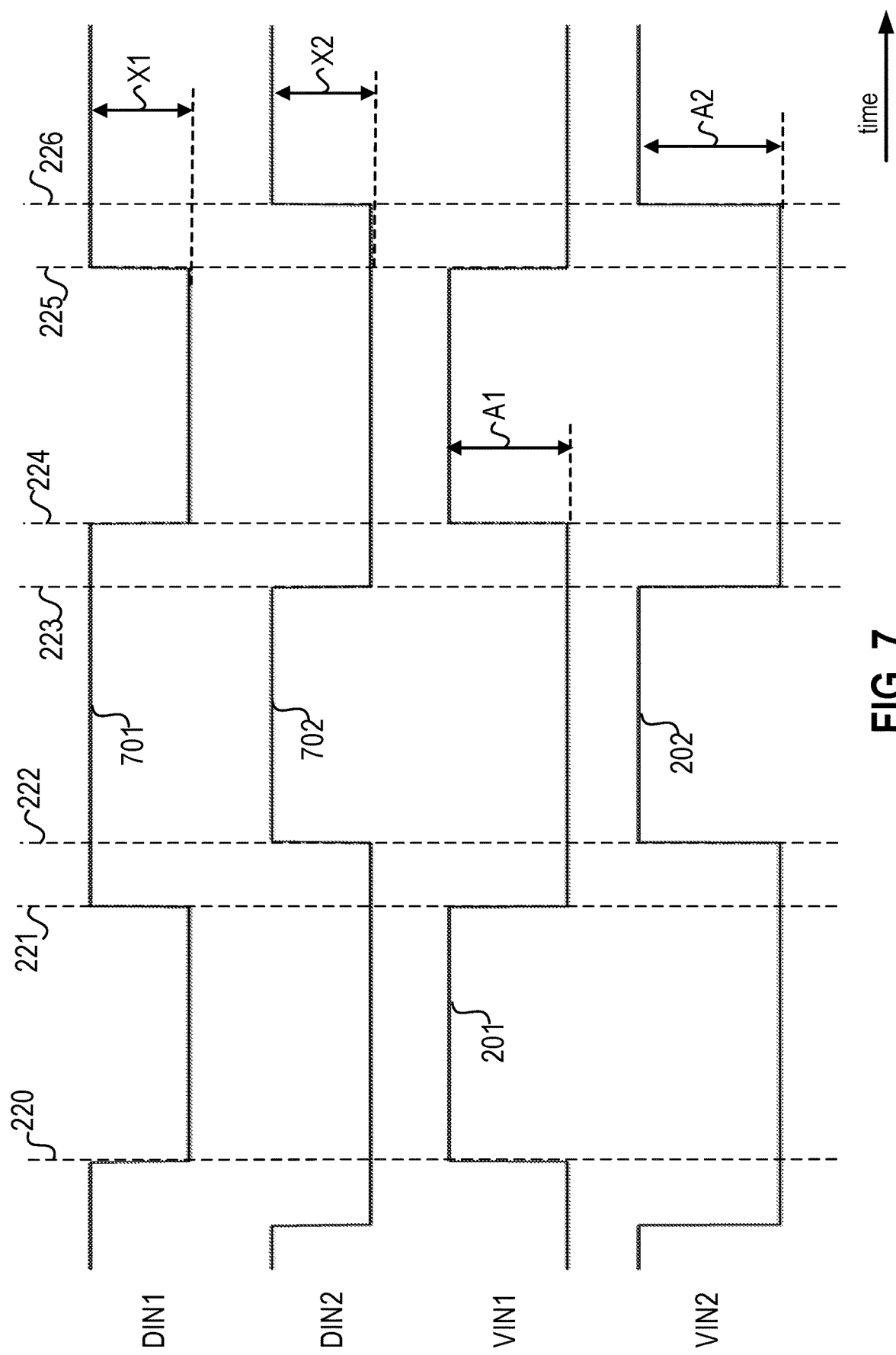
FIG. 7 illustrates switching waveforms of a half-bridge driver according to an embodiment.

FIG. 7 illustrates switching waveforms 701, 702, 201, 202 of a half-bridge driver 100 according to an embodiment. Waveforms 701, 702, 201, and 202 may respectively correspond with signal DIN1, signal DIN2, input voltage VIN1, and input voltage VIN2, as a function of time. Moreover, as presented above with respect to FIG. 2A, transition times 220-226 may delineate switching transitions.

As discussed above with regards to FIG. 6, input voltage VIN1 and input voltage VIN2 may be generated from signals DIN1 and DIN2. For instance, as illustrated by waveforms 701 and 201, input voltage VIN1 may transition from low to high at times 220 and 224 in response to signal DIN1 transitioning from high to low; and input voltage VIN1 may transition from high to low at times 221 and 225 in response to signal DIN1 transitioning from low to high. In one embodiment, signal DIN1 may be a logic signal (e.g., a digital signal) of amplitude X1 (e.g., one volt) relative to ground GND; and by virtue of the NOT gate 611 and interface control element 621, the input voltage VIN1 may be provided as a rectangular waveform with amplitude A1 (e.g., fifteen volts). As discussed above, the interface control element 621 may provide the input voltage VIN1 level shifted relative to the switch node NSW and switch node voltage VSW.

Similarly, as illustrated by waveforms 702 and 202, input voltage VIN2 may transition from low to high at times 222 and 224 in response to signal DIN1 transitioning from low to high; and input voltage VIN2 may transition from high to low at time 223 in response to signal DIN2 transitioning from high to low. In one embodiment, signal DIN2 may be a logic signal (e.g., a digital signal) of amplitude X2 (e.g., one volt) relative to ground GND; and by virtue of the interface control element 621, the input voltage VIN2 may be provided as a rectangular waveform with amplitude A2 (e.g., fifteen volts). As discussed above, the interface control element 622 may provide the input voltage VIN2 level shifted relative to ground GND.

In one application signals DIN1, DIN2 may be realized by using a controller. For instance, half bridge driver 100 may be part of a switch mode power converter, and a system controller may generate signals DIN1 and DIN2.

Although FIG. 7 shows waveforms 701, 702, 201, 202 as transitioning at transition times 220-226, other switching waveforms are possible. For instance, as one of ordinary skill in the art may appreciate, a controller may generate different waveforms depending on system variables (e.g., supply voltage), on system configuration (e.g., buck, boost, flyback, and the like), and/or on load.

Switch Block Control

According to the teachings herein, control signals CX1 and CY1 may advantageously be simplified when switch SX1 is realized using a PFET 401 and when switch SY1 is realized as a back-to-back switch SY1 using NFETs 411 and 421. Similarly, control signals CX2 and CY2 may be simplified when switch SX2 is realized using a PFET 402 and when switch SY2 is realized as a back-to-back switch SY2 using NFETs 412 and 422.

The circuits presented in FIG. 8A to FIG. 8J are realized using PSIM schematic elements and may be included with a PSIM realization of half-bridge driver 100. The waveforms presented in FIG. 9A to FIG. 9H are based on PSIM simulation results of the circuits of half-bridge driver 100 (e.g., the half-bridge driver 100 of FIG. 6) used with the embodiments of FIG. 8A to FIG. 8J.

Figure 8A:
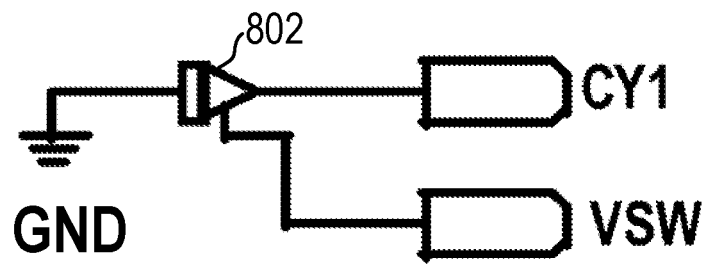
FIG. 8A illustrates a circuit for providing a control signal according to an embodiment.

FIG. 8A illustrates a circuit 800a for providing a control signal CY1 according to an embodiment. Circuit 800a includes an interface control element 802 which, like interface control element 621 may level shift signals relative to the switch node voltage VSW. As illustrated, an input of interface control element 802 is electrically coupled to ground GND to receive a ground potential (e.g., zero volts); and an output of interface control element 802 provides control signal CY1. Additionally, a level shift input of interface control element 802 receives the switch node voltage VSW so that the control signal CY1 is referenced to the switch node voltage VSW. For instance, when ground GND provides zero volts ground potential, then interface control element 802 may level shift and provide control signal CY1 having a value equal to or substantially equal to the switch node voltage VSW.

Included with the PSIM realization of half-bridge driver 100 (e.g., the half-bridge driver 100 of FIG. 6), circuit 800a may be used to force control signal CY1 to be equal to or substantially equal to the switch node voltage VSW. As discussed above with regards to FIG. 5A, this may also simulate the condition wherein the back-to-back gate of back-to-back switch SY1 is electrically coupled to the switch node NSW.

Figure 8B:
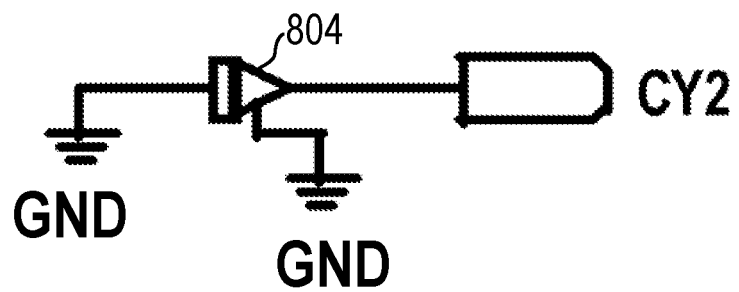
FIG. 8B illustrates a circuit for providing a control signal according to an embodiment.

FIG. 8B illustrates a circuit 800b for providing a control signal CY2 according to an embodiment. Circuit 800b may be like that of circuit 800a, except circuit 800b includes an interface control element 804 which level shifts relative to ground GND. As illustrated, an input of interface control element 804 is electrically coupled to ground GND to receive a ground potential (e.g., zero volts); and an output of interface control element 804 provides control signal CY2. Additionally, a level shift input of interface control element 804 also receives the ground potential; accordingly, the control signal CY1 is referenced to ground GND.

Included with the PSIM realization of half-bridge driver 100 (e.g., the half-bridge driver 100 of FIG. 6), circuit 800b may be used to force control signal CY2 to be equal to or substantially equal to the ground potential (e.g., zero volts). As discussed above with regards to FIG. 5A, this may also simulate the condition wherein the back-to-back gate of back-to-back switch SY2 is electrically coupled to ground GND.

Figure 8C:
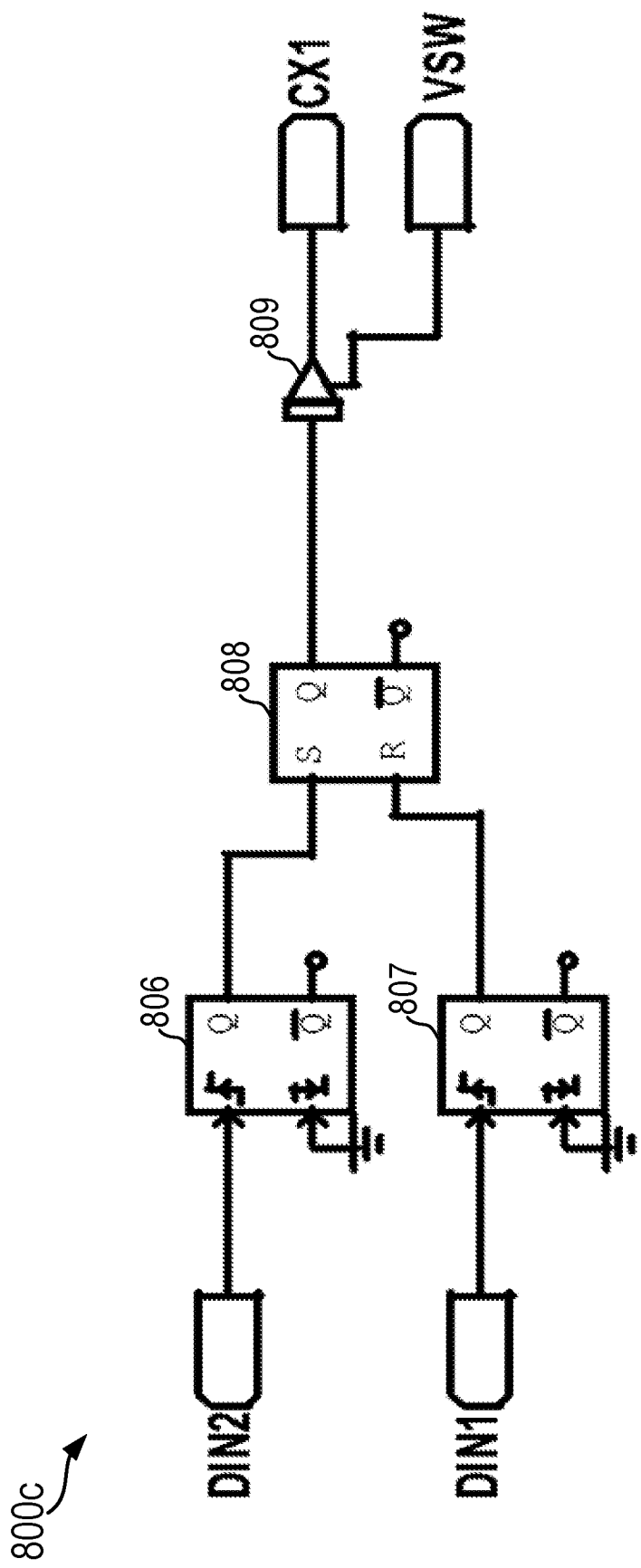
FIG. 8C illustrates a circuit for providing a control signal according to an embodiment.

FIG. 8C illustrates a circuit 800c for providing a control signal CX1 according to an embodiment. Circuit 800c includes a monostable multivibrator 806, a monostable multivibrator 807, an edge-triggered set-reset (SR) flip flop 808, and an interface control element 809. Monostable multivibrator 806 receives signal DIN2 at a positive edge input and receives ground GND (e.g., zero volts) at a negative edge input. In response to a positive edge transition of signal DIN2, monostable multivibrator 806 may provide a pulse of prescribed width (e.g., two microseconds) to a set input of the edge-triggered SR flip flop 808. Monostable multivibrator 807 receives signal DIN1 at a positive edge input and receives ground GND at a negative edge input. In response to a positive edge transition of signal DIN1, monostable multivibrator 807 may provide a pulse of prescribed width (e.g., two microseconds) to a reset input of the edge-triggered SR flip flop 808. In response to receiving a rising pulse edge from monostable multivibrator 806, edge-triggered SR flip flop 808 may set (i.e., may enter a set state); and in response to receiving a rising pulse edge from monostable multivibrator 807, edge-triggered SR flip flop 808 may reset (i.e., may enter a reset state).

While in the set state, edge-triggered SR flip flop 808 may provide a logic high signal (e.g., one volt) to the input of interface control element 809; and while in the reset state, edge-triggered SR flip flop 808 may provide a logic low signal (e.g., zero volts) to the input of interface control element 809. In response to a logic high or logic low signal from the edge-triggered SR flip flop 808, interface control element 809 may provide control signal CX1. Additionally, a level shift input of interface control element 809 receives the switch node voltage VSW so that the control signal CX1 is referenced to the switch node voltage VSW. For instance, when the input of the interface control element 809 is a logic high signal, then the control signal CX1 may be fifteen volts greater than the switch node voltage VSW. Alternatively, when the input of the interface control element 809 is a logic low signal, then the control signal CX1 may be substantially equal to the switch node voltage VSW.

As configured, circuit 800c may provide a control signal CX1 which transitions in response to rising edges of signals DIN1 and DIN2. For instance, with reference to FIG. 2A and FIG. 7, circuit 800c may provide control signal CX1 with transition edges at transition times 221, 222 and at transition times 225, 226. Additionally, the break-before-make interval TB12 may be delineated between transition times 221 and 222 and/or between transition times 225 and 226. Accordingly, as configured, circuit 800c may provide the control signal CX1 to have pulses of width substantially equal to and coincident with the break-before-make interval TB12.

Figure 8D:
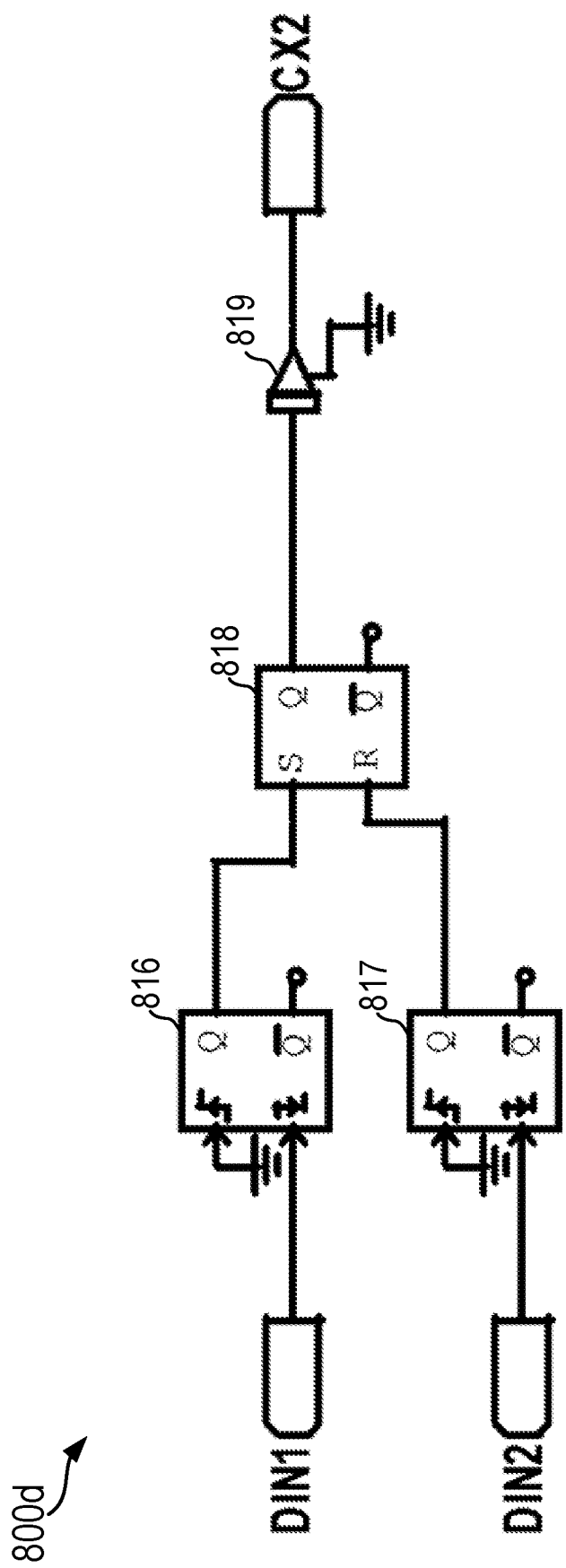
FIG. 8D illustrates a circuit for providing a control signal according to an embodiment.

FIG. 8D illustrates a circuit 800d for providing a control signal CX2 according to an embodiment. Circuit 800d includes a monostable multivibrator 816, a monostable multivibrator 817, an edge-triggered set-reset (SR) flip flop 818, and an interface control element 819. Monostable multivibrator 816 receives signal DIN1 at a negative edge input and receives ground GND (e.g., zero volts) at a positive edge input. In response to a negative edge transition of signal DIN1, monostable multivibrator 816 may provide a pulse of prescribed width (e.g., two microseconds) to a set input of the edge-triggered SR flip flop 818. Monostable multivibrator 817 receives signal DIN2 at a negative edge input and receives ground GND at a positive edge input. In response to a negative edge transition of signal DIN2, monostable multivibrator 817 may provide a pulse of prescribed width (e.g., two microseconds) to a reset input of the edge-triggered SR flip flop 818. In response to receiving a rising pulse edge from monostable multivibrator 816, edge-triggered SR flip flop 818 may set (i.e., may enter a set state); and in response to receiving a rising pulse edge from monostable multivibrator 817, edge-triggered SR flip flop 818 may reset (i.e., may enter a reset state).

While in the set state, edge-triggered SR flip flop 818 may provide a logic high signal (e.g., one volt) to the input of interface control element 819; and while in the reset state, edge-triggered SR flip flop 818 may provide a logic low signal (e.g., zero volts) to the input of interface control element 819. In response to a logic high or logic low signal from the edge-triggered SR flip flop 818, interface control element 819 may provide control signal CX2. Additionally, a level shift input of interface control element 819 receives the ground potential so that the control signal CX2 is referenced to ground GND. For instance, when the input of the interface control element 819 is a logic high signal, then the control signal CX2 may be fifteen volts relative to ground GND. Alternatively, when the input of the interface control element 819 is a logic low signal, then the control signal CX2 may be substantially equal to the ground potential (i.e., ground GND).

As configured, circuit 800d may provide a control signal CX2 which transitions in response to falling edges of signals DIN1 and DIN2. For instance, with reference to FIG. 2A and FIG. 7, circuit 800d may provide control signal CX2 with transition edges at transition times 223, 224. With reference to FIG. 2A, the break-before-make interval TB21 may be delineated between transition times 223 and 224. Accordingly, as configured, circuit 800d may provide the control signal CX2 to have pulses of width substantially equal to and coincident with the break-before-make interval TB21.

Figure 8E:
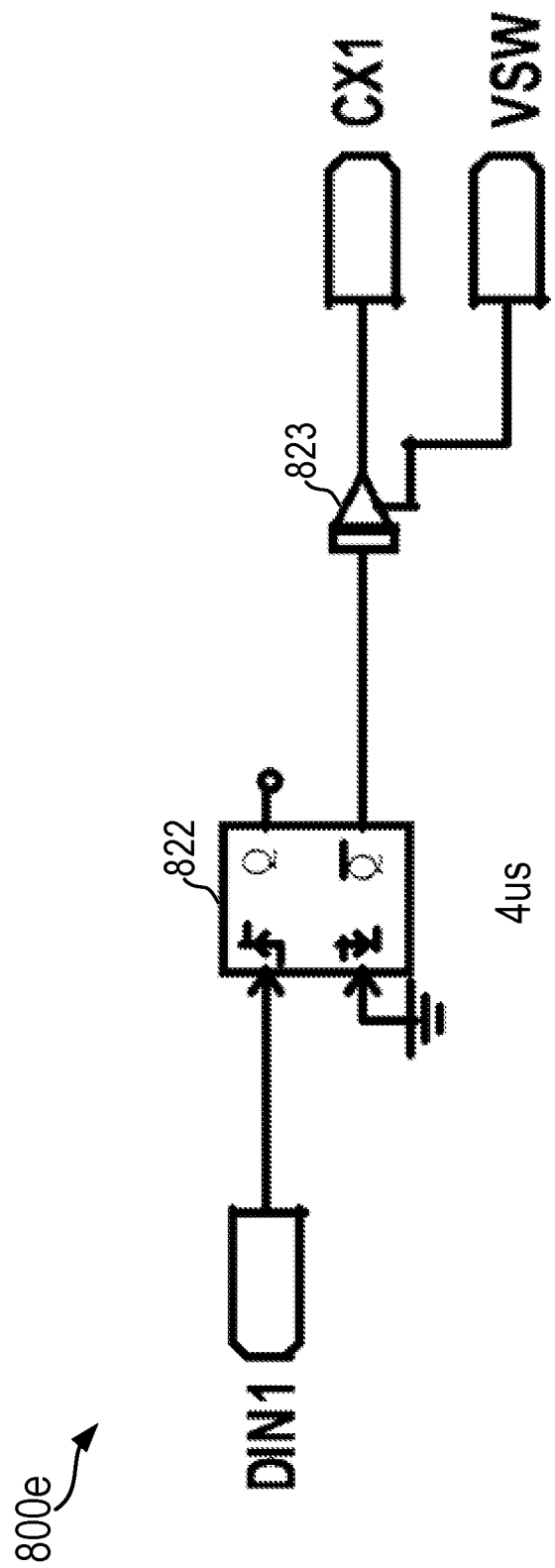
FIG. 8E illustrates a circuit for providing a control signal according to an embodiment.

FIG. 8E illustrates a circuit 800e for providing a control signal CX1 according to an embodiment. Circuit 800e includes a monostable multivibrator 822 and an interface control element 823. Monostable multivibrator 822 receives signal DIN1 at a positive edge input and receives ground GND (e.g., zero volts) at a negative edge input. In response to a positive edge transition of signal DIN1, monostable multivibrator 822 may provide a pulse of prescribed width (e.g., four microseconds) to an input of interface control element 823. As illustrated, the pulse may be a negative going pulse from the inverted output of the monostable multivibrator 822.

In response to the pulse from the monostable multivibrator 822, interface control element 823 may provide control signal CX1. Additionally, a level shift input of interface control element 823 receives the switch node voltage VSW so that the control signal CX1 is referenced to the switch node voltage VSW. Accordingly, the interface control element 823 may level shift the pulse from the monostable multivibrator 822 to the switch node voltage VSW.

As configured, circuit 800e may provide a control signal CX1 which transitions in response to rising edges of signal DIN1. For instance, with reference to FIG. 2A and FIG. 7, circuit 800e may provide control signal CX1 which provides a pulse with a falling edge beginning at time 221 and a pulse with a falling edge beginning at time 225. The width of the pulses may be determined, at least in part, by the pulse width (e.g., four microseconds) from the monostable multivibrator 822.

Accordingly, as configured, circuit 800e may provide the control signal CX1 to have pulses which are initiated at the beginning of the break-before-make interval TB12; and the pulse width may be selected to be less than, greater than, and/or equal to that of the break-before-make interval TB12.

Figure 8F:
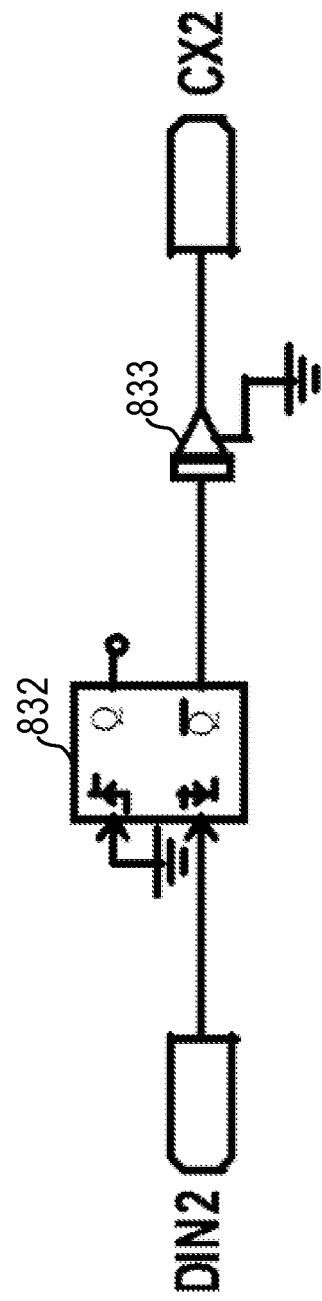
FIG. 8F illustrates a circuit for providing a control signal according to an embodiment.

FIG. 8F illustrates a circuit 800f for providing a control signal CX2 according to an embodiment. Circuit 800f includes a monostable multivibrator 832 and an interface control element 833. Monostable multivibrator 832 receives signal DIN2 at a negative edge input and receives ground GND (e.g., zero volts) at a positive edge input. In response to a negative edge transition of signal DIN2, monostable multivibrator 832 may provide a pulse of prescribed width (e.g., four microseconds) to an input of interface control element 833. As illustrated, the pulse may be a negative going pulse from the inverted output of the monostable multivibrator 832.

In response to the pulse from the monostable multivibrator 832, interface control element 833 may provide control signal CX2. Additionally, a level shift input of interface control element 833 receives the ground potential so that the control signal CX2 is referenced to ground GND.

As configured, circuit 800f may provide control signal CX2 which transitions in response to falling edges of signal DIN2. For instance, with reference to FIG. 2A and FIG. 7, circuit 800f may provide control signal CX2 which provides a pulse with a falling edge beginning at time 223. The width of the pulse may be determined, at least in part, by the pulse width (e.g., four microseconds) from the monostable multivibrator 832.

Accordingly, as configured, circuit 800f may provide the control signal CX2 to have pulses which are initiated at the beginning of the break-before-make interval TB21; and the pulse width may be selected to be less than, greater than, and/or equal to that of the break-before-make interval TB21.

Figure 8G:
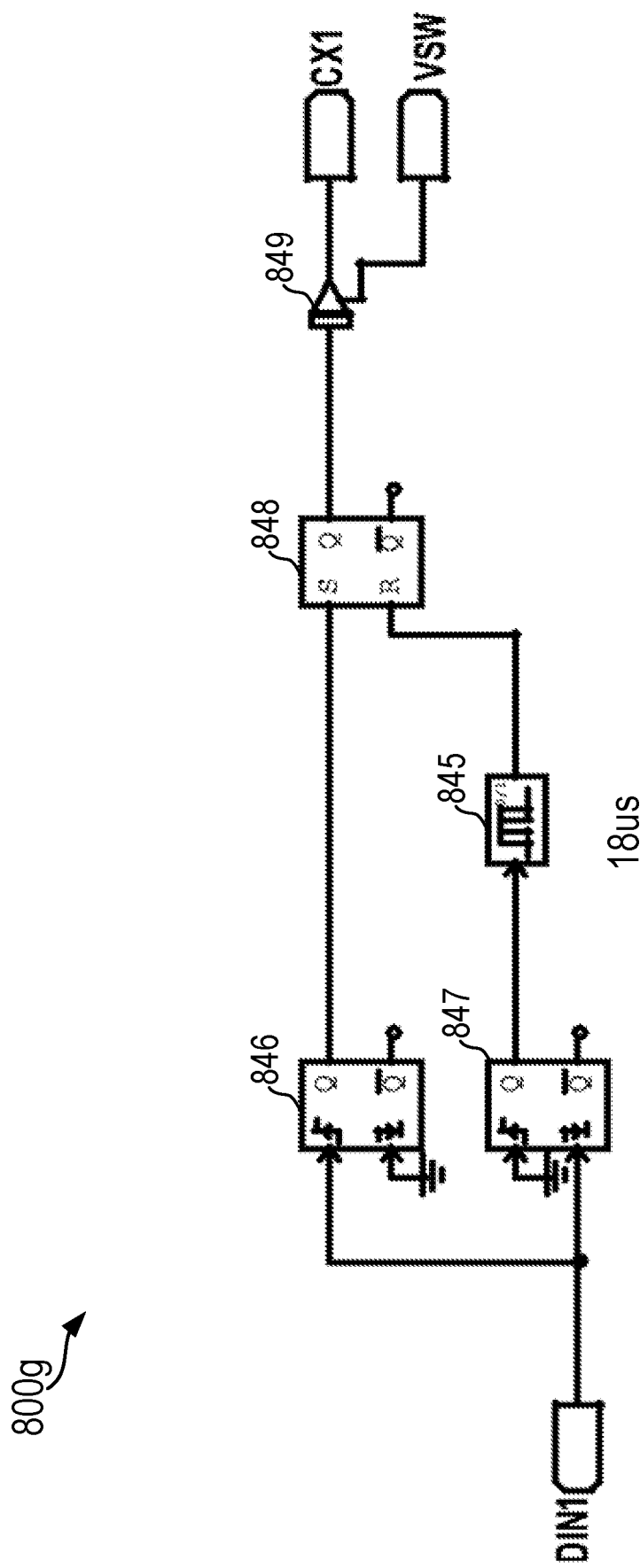
FIG. 8G illustrates a circuit for providing a control signal according to an embodiment.

FIG. 8G illustrates a circuit 800g for providing a control signal CX1 according to an embodiment. Circuit 800g includes a monostable multivibrator 846, a monostable multivibrator 847, an edge-triggered set-reset (SR) flip flop 848, a logic delay block 845, and an interface control element 849. Monostable multivibrator 846 receives signal DIN1 at a positive edge input and receives ground GND (e.g., zero volts) at a negative edge input. In response to a positive edge transition of signal DIN1, monostable multivibrator 846 may provide a pulse of prescribed width (e.g., two microseconds) to a set input of the edge-triggered SR flip flop 848. Monostable multivibrator 847 receives signal DIN1 at a negative edge input and receives ground GND at a positive edge input. In response to a negative edge transition of signal DIN1, monostable multivibrator 847 may provide a pulse of prescribed width (e.g., two microseconds) to logic delay block 845. In turn logic delay block 845 may provide a delayed pulse to the reset input of the edge-triggered SR flip flop 848; and the delayed pulse may be delayed by a prescribed delay time (e.g., eighteen microseconds).

In response to receiving a rising pulse edge from monostable multivibrator 846, edge-triggered SR flip flop 848 may set (i.e., may enter a set state); and in response to receiving a rising pulse edge from logic delay block 845, edge-triggered SR flip flop 848 may reset (i.e., may enter a reset state).

While in the set state, edge-triggered SR flip flop 848 may provide a logic high signal (e.g., one volt) to the input of interface control element 849; and while in the reset state, edge-triggered SR flip flop 848 may provide a logic low signal (e.g., zero volts) to the input of interface control element 849. In response to a logic high or logic low signal from the edge-triggered SR flip flop 848, interface control element 849 may provide control signal CX1. Additionally, a level shift input of interface control element 849 receives the switch node voltage VSW so that the control signal CX1 is referenced to the switch node voltage VSW.

As configured, circuit 800g may provide a control signal CX1 which transitions in response to a delayed falling edge of DIN1 and a subsequent rising edge of DIN1. For instance, with reference to FIG. 2A and FIG. 7, circuit 800g may provide control signal CX1 with a transition edge delayed with respect to time 220 and a transition edge at time 221. The amount of delay may be determined, at least in part, by the delay time of logic delay block 845. Similarly, circuit 800g may provide control signal CX1 with a transition edge delayed with respect to time 224 and a transition edge at time 225.

With reference to FIG. 2A and FIG. 7, the input voltage VIN1 is high from time 220 to time 221 and high from time 224 to time 225. Additionally, a break-before-make interval TB12 may be delineated between transition times 221 and 222 and between transition times 225 and 226.

Accordingly, as configured, circuit 800g may provide the control signal CX1 to have pulses which are initiated while the input voltage VIN1 is high prior to the beginning of the break-before-make interval TB12; and the pulses may terminate coincident with the beginning of the break-before-make interval TB12. By initiating pulses prior to the beginning of the break-before-make interval TB12, circuit 800g may advantageously be used when operating with a small break-before-make intervals TB12 (e.g., less than five hundred nanoseconds).

Figure 8H:
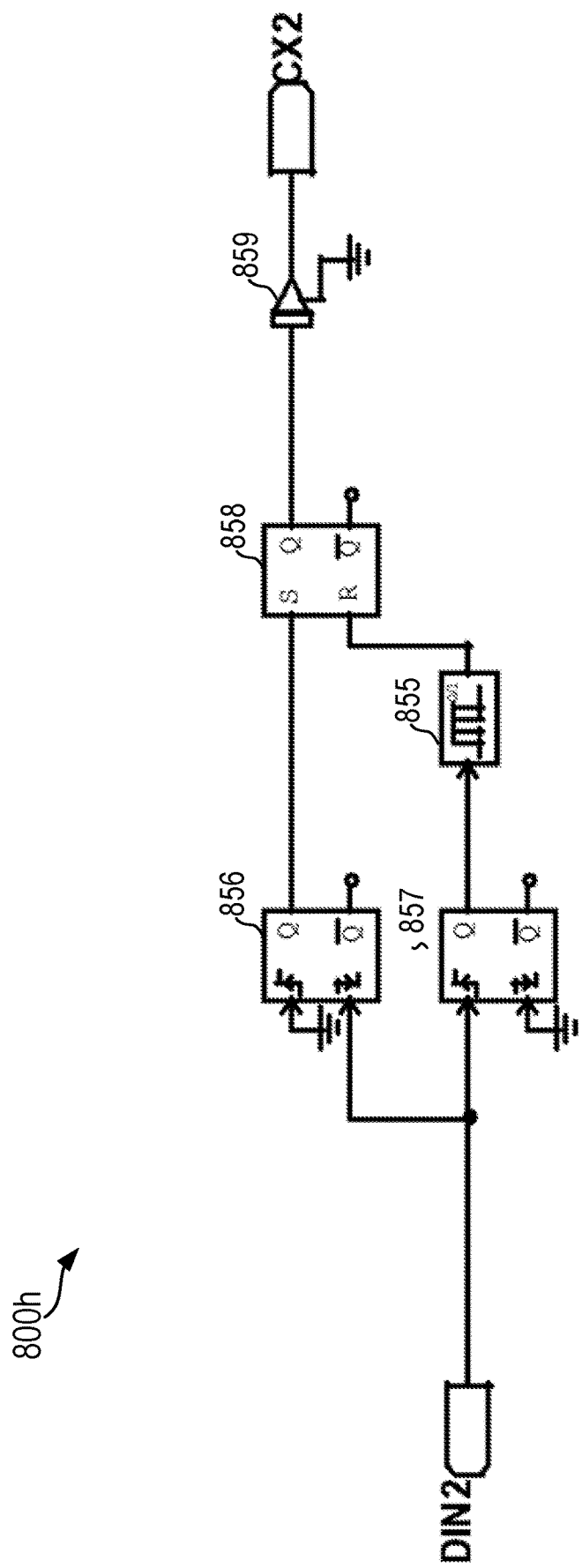
FIG. 8H illustrates a circuit for providing a control signal according to an embodiment.

FIG. 8H illustrates a circuit 800h for providing a control signal CX2 according to an embodiment. Circuit 800h includes a monostable multivibrator 856, a monostable multivibrator 857, an edge-triggered set-reset (SR) flip flop 858, a logic delay block 855, and an interface control element 859. Monostable multivibrator 856 receives signal DIN2 at a negative edge input and receives ground GND (e.g., zero volts) at a positive edge input. In response to a negative edge transition of signal DIN2, monostable multivibrator 856 may provide a pulse of prescribed width (e.g., two microseconds) to a set input of the edge-triggered SR flip flop 858. Monostable multivibrator 857 receives signal DIN2 at a positive edge input and receives ground GND at a negative edge input. In response to a positive edge transition of signal DIN2, monostable multivibrator 857 may provide a pulse of prescribed width (e.g., two microseconds) to logic delay block 855. In turn logic delay block 855 may provide a delayed pulse to the reset input of the edge-triggered SR flip flop 858; and the delayed pulse may be delayed by a prescribed delay time (e.g., eighteen microseconds).

In response to receiving a rising pulse edge from monostable multivibrator 856, edge-triggered SR flip flop 858 may set (i.e., may enter a set state); and in response to receiving a rising pulse edge from logic delay block 855, edge-triggered SR flip flop 858 may reset (i.e., may enter a reset state).

While in the set state, edge-triggered SR flip flop 858 may provide a logic high signal (e.g., one volt) to the input of interface control element 859; and while in the reset state, edge-triggered SR flip flop 858 may provide a logic low signal (e.g., zero volts) to the input of interface control element 859. In response to a logic high or logic low signal from the edge-triggered SR flip flop 858, interface control element 859 may provide control signal CX2. Additionally, a level shift input of interface control element 859 receives the ground potential so that the control signal CX2 is referenced to ground GND.

As configured, circuit 800h may provide a control signal CX2 which transitions in response to a delayed rising edge of DIN2 and a subsequent falling edge of DIN2. For instance, with reference to FIG. 2A and FIG. 7, circuit 800h may provide control signal CX2 with a transition edge delayed with respect to time 222 and a transition edge at time 223. The amount of delay may be determined, at least in part, by the delay time of logic delay block 855.

With reference to FIG. 2A and FIG. 7, the input voltage VIN2 is high from time 222 to time 223. Additionally, a break-before-make interval TB21 may be delineated between transition times 223 and 224.

Accordingly, as configured, circuit 800h may provide the control signal CX2 to have pulses which are initiated while the input voltage VIN2 is high prior to the beginning of the break-before-make interval TB21; and the pulses may terminate coincident with the beginning of the break-before-make interval TB21. By initiating pulses prior to the beginning of the break-before-make interval TB21, circuit 800h may advantageously be used when operating with a small break-before-make intervals TB21 (e.g., less than five hundred nanoseconds).

Figure 8I:
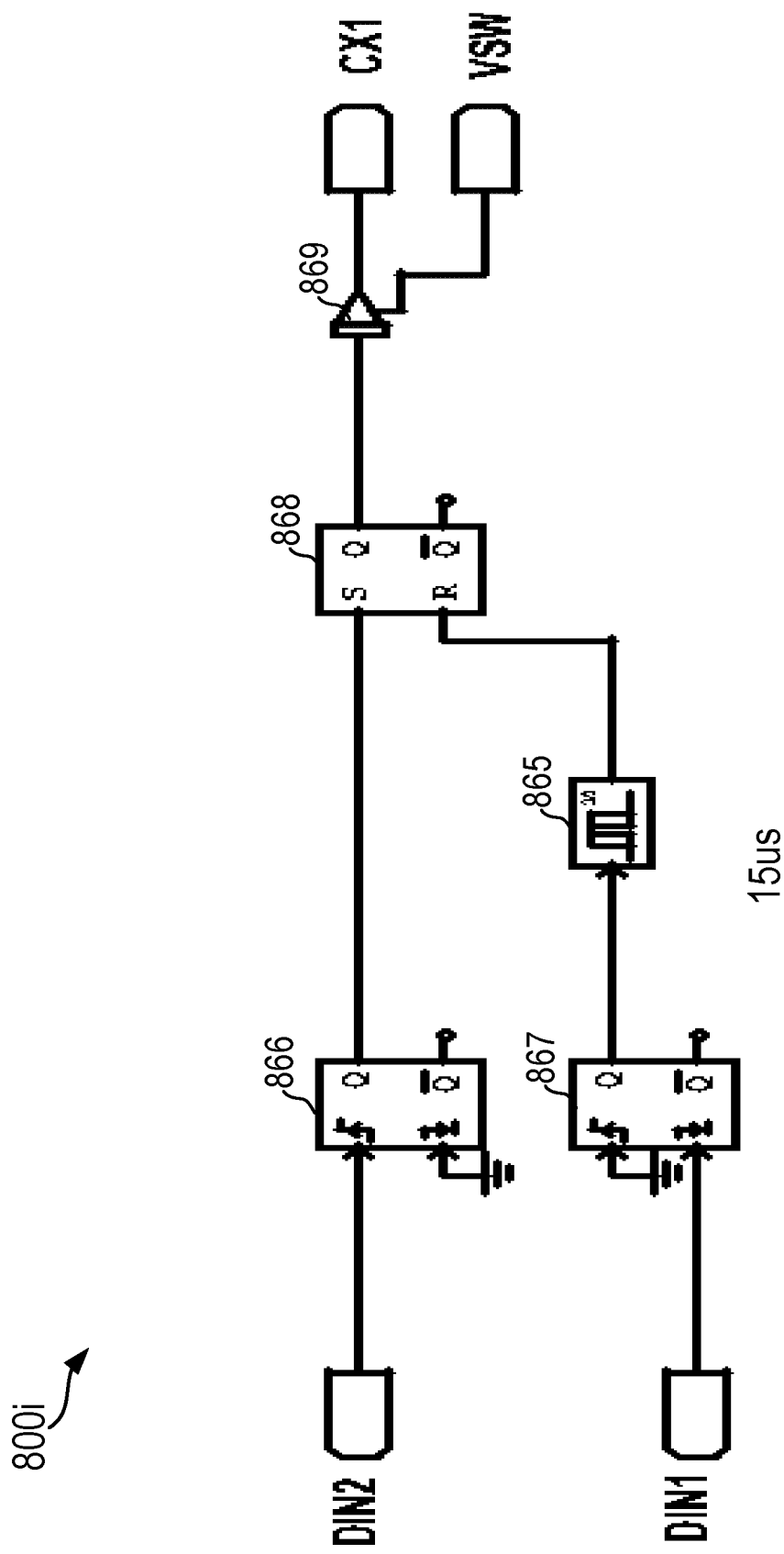
FIG. 8I illustrates a circuit for providing a control signal according to an embodiment.

FIG. 8I illustrates a circuit 800i for providing a control signal CX1 according to an embodiment. Circuit 800i includes a monostable multivibrator 866, a monostable multivibrator 867, an edge-triggered set-reset (SR) flip flop 868, a logic delay block 865, and an interface control element 869. Monostable multivibrator 866 receives signal DIN2 at a positive edge input and receives ground GND (e.g., zero volts) at a negative edge input. In response to a positive edge transition of signal DIN2, monostable multivibrator 866 may provide a pulse of prescribed width (e.g., two microseconds) to a set input of the edge-triggered SR flip flop 868. Monostable multivibrator 867 receives signal DIN1 at a negative edge input and receives ground GND at a positive edge input. In response to a negative edge transition of signal DIN1, monostable multivibrator 867 may provide a pulse of prescribed width (e.g., two microseconds) to logic delay block 865. In turn, logic delay block 865 may provide a delayed pulse to the reset input of the edge-triggered SR flip flop 868; and the delayed pulse may be delayed by a prescribed delay time (e.g., eighteen microseconds).

In response to receiving a rising pulse edge from monostable multivibrator 866, edge-triggered SR flip flop 848 may set (i.e., may enter a set state); and in response to receiving a rising pulse edge from logic delay block 865, edge-triggered SR flip flop 848 may reset (i.e., may enter a reset state).

While in the set state, edge-triggered SR flip flop 868 may provide a logic high signal (e.g., one volt) to the input of interface control element 869; and while in the reset state, edge-triggered SR flip flop 868 may provide a logic low signal (e.g., zero volts) to the input of interface control element 869. In response to a logic high or logic low signal from the edge-triggered SR flip flop 868, interface control element 869 may provide control signal CX1. Additionally, a level shift input of interface control element 869 receives the switch node voltage VSW so that the control signal CX1 is referenced to the switch node voltage VSW.

As configured, circuit 800i may provide a control signal CX1 which transitions in response to a delayed falling edge of DIN1 and a subsequent rising edge of DIN2. For instance, with reference to FIG. 2A and FIG. 7, circuit 800i may provide control signal CX1 with a transition edge delayed with respect to time 220 and a transition edge at time 222. The amount of delay may be determined, at least in part, by the delay time of logic delay block 865. Similarly, circuit 800i may provide control signal CX1 with a transition edge delayed with respect to time 224 and a transition edge at time 226.

With reference to FIG. 2A and FIG. 7, the input voltage VIN1 is high from time 220 to time 221 and high from time 224 to time 225. Additionally, a break-before-make interval TB12 may be delineated between transition times 221 and 222, and between transition times 225 and 226.

Accordingly, as configured, circuit 800i may provide the control signal CX1 to have pulses which are initiated while the input voltage VIN1 is high prior to the beginning of the break-before-make interval TB12; and the pulses may terminate coincident with the end of the break-before-make interval TB12. Like circuit 800g, circuit 800i may advantageously be used when operating with a small break-before-make interval TB12 (e.g., less than five hundred nanoseconds).

Figure 8J:
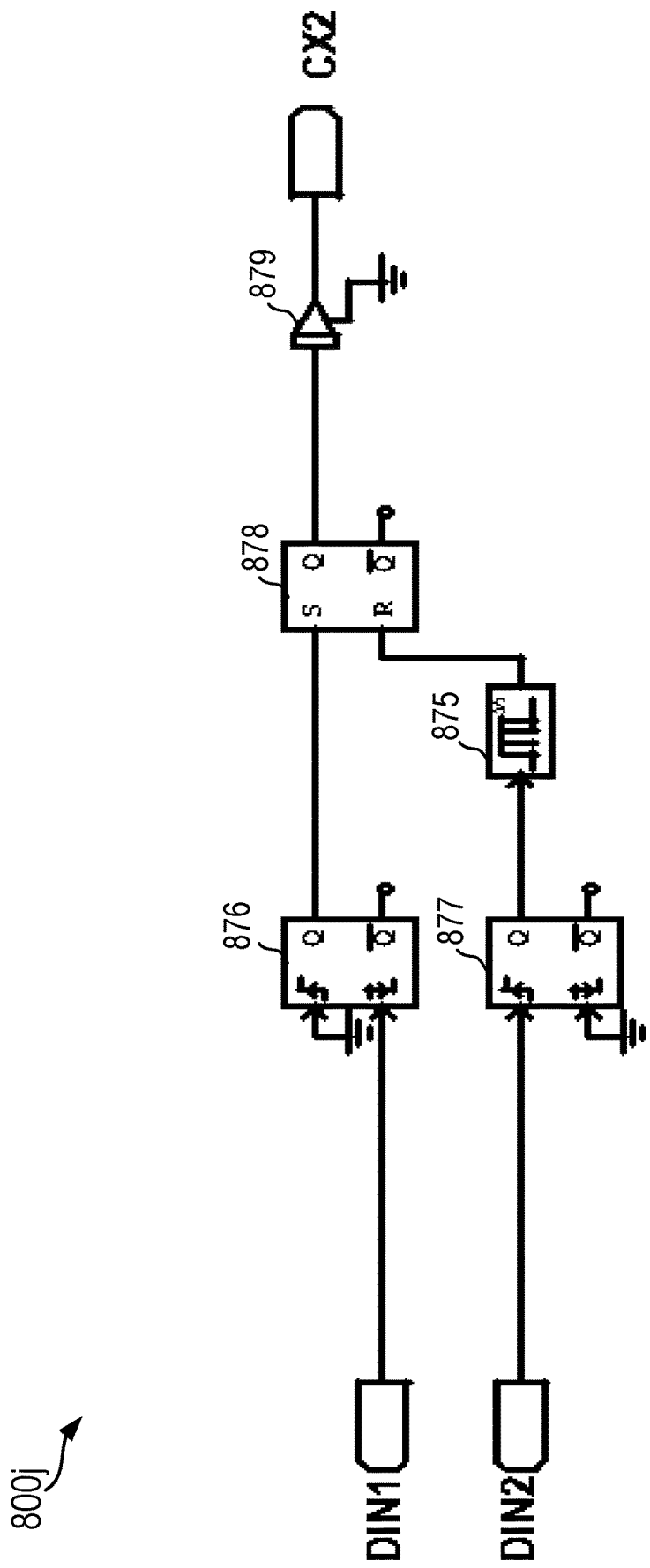
FIG. 8J illustrates a circuit for providing a control signal according to an embodiment.

FIG. 8J illustrates a circuit 800j for providing a control signal CX2 according to an embodiment. Circuit 800j includes a monostable multivibrator 876, a monostable multivibrator 877, an edge-triggered set-reset (SR) flip flop 878, a logic delay block 875, and an interface control element 879. Monostable multivibrator 876 receives signal DIN1 at a negative edge input and receives ground GND (e.g., zero volts) at a positive edge input. In response to a negative edge transition of signal DIN1, monostable multivibrator 876 may provide a pulse of prescribed width (e.g., two microseconds) to a set input of the edge-triggered SR flip flop 878. Monostable multivibrator 877 receives signal DIN2 at a positive edge input and receives ground GND at a negative edge input. In response to a positive edge transition of signal DIN2, monostable multivibrator 877 may provide a pulse of prescribed width (e.g., two microseconds) to logic delay block 875. In turn, logic delay block 875 may provide a delayed pulse to the reset input of the edge-triggered SR flip flop 878; and the delayed pulse may be delayed by a prescribed delay time (e.g., eighteen microseconds).

In response to receiving a rising pulse edge from monostable multivibrator 876, edge-triggered SR flip flop 878 may set (i.e., may enter a set state); and in response to receiving a rising pulse edge from logic delay block 875, edge-triggered SR flip flop 878 may reset (i.e., may enter a reset state).

While in the set state, edge-triggered SR flip flop 878 may provide a logic high signal (e.g., one volt) to the input of interface control element 879; and while in the reset state, edge-triggered SR flip flop 878 may provide a logic low signal (e.g., zero volts) to the input of interface control element 879. In response to a logic high or logic low signal from the edge-triggered SR flip flop 878, interface control element 879 may provide control signal CX2. Additionally, a level shift input of interface control element 879 receives the ground potential so that the control signal CX2 is referenced to ground GND.

As configured, circuit 800*j* may provide a control signal CX2 which transitions in response to a delayed rising edge of DIN2 and a subsequent falling edge of DIN1. For instance, with reference to FIG. 2A and FIG. 7, circuit 800*j* may provide control signal CX2 with a transition edge delayed with respect to time 222 and a transition edge at time 224. The amount of delay may be determined, at least in part, by the delay time of logic delay block 875.

With reference to FIG. 2A and FIG. 7, the input voltage VIN2 is high from time 222 to time 223. Additionally, a break-before-make interval TB21 may be delineated between transition times 223 and 224.

Accordingly, as configured, circuit 800*h* may provide the control signal CX2 to have pulses which are initiated while the input voltage VIN2 is high prior to the beginning of the break-before-make interval TB21; and the pulses may terminate coincident with the end of the break-before-make interval TB21. Like circuit 800*h*, circuit 800*j* may advantageously be used when operating with a small break-before-make interval TB21 (e.g., less than five hundred nanoseconds).

Figure 9A:
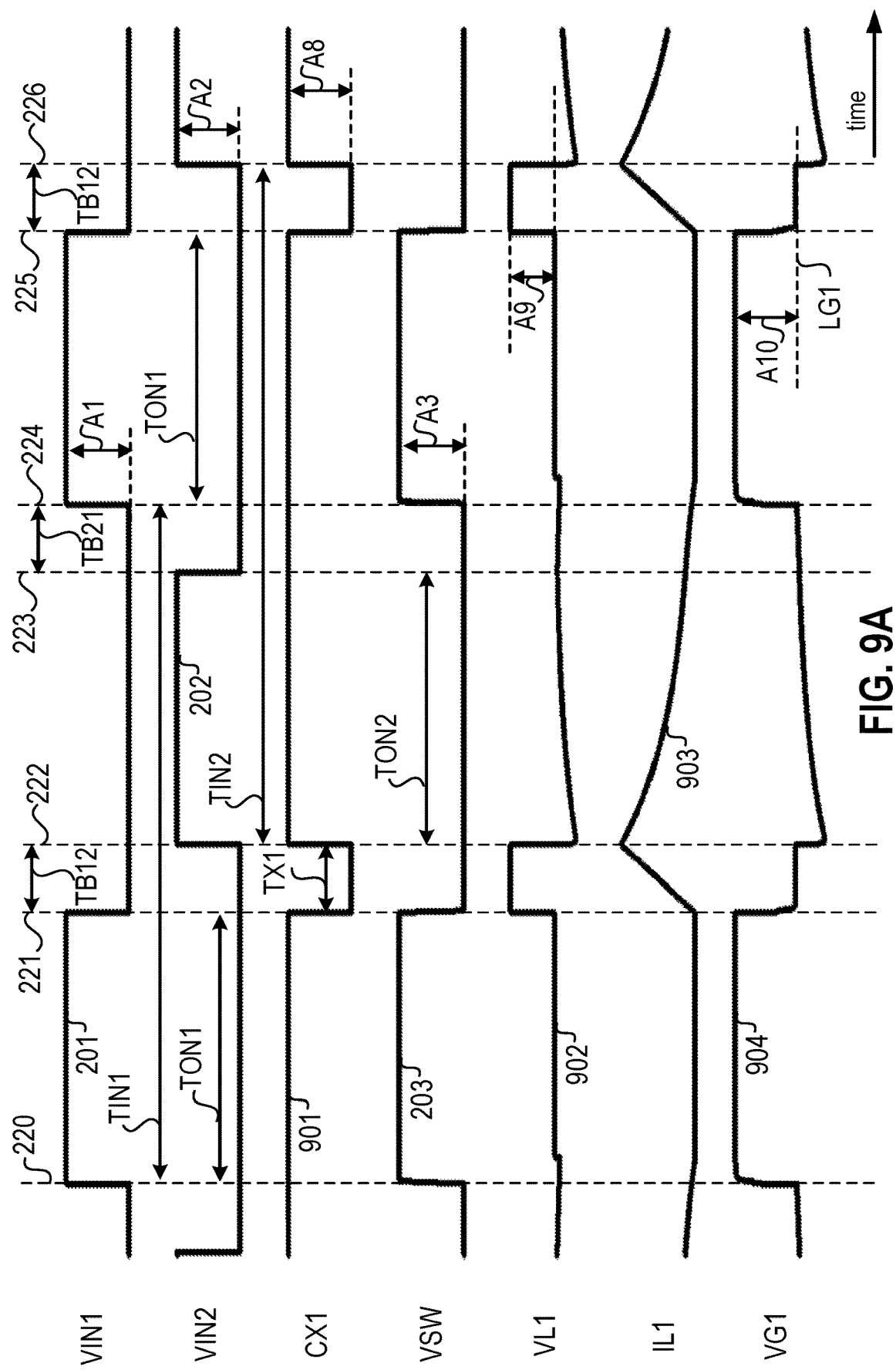
FIG. 9A illustrates simulated waveforms of a half-bridge driver according to an embodiment.

FIG. 9A illustrates simulated waveforms 201-203 and 901-904 of a half-bridge driver 100 according to an embodiment. Waveforms 201, 202, and 203 may respectively correspond with the input voltage VIN1, input voltage VIN2, and switch node voltage VSW versus time; and waveforms 901, 902, 903, and 904 may respectively correspond with control signal CX1, voltage VL1, inductive current IL1, and high-side gate voltage VG1 versus time.

As illustrated, waveforms 201-203 and 901-904 undergo switching at transition times 220-226. With reference to waveform 201, the period TIN1 from time 220 to time 224 may delineate a switching cycle of the high-side gate driver 301; similarly, the period TIN2 from time 222 to time 226 may delineate a switch cycle of the low-side gate driver 302. In some embodiments and operating conditions (e.g., steady-state operating conditions), the period TIN1 may be substantially equal to the period TIN2.

The simulated waveforms 201-203 and 901-904 may correspond with a PSIM simulation of the half-bridge driver 100 of FIG. 6 using circuits 800*a*, 800*b*, 800*c*, and 800*d*. For simulation purposes, the inductive storage element L1 comprises an inductance of one hundred microhenries; and resistor RG1 comprises a resistance of ten ohms. Additionally, NFETs 161, 561, 411, 421 are enhancement mode devices with a threshold of magnitude two volts; and PFETs 151, 551, 401 are also enhancement mode devices with a threshold of magnitude two volts.

Also, for simulation purposes, the supply voltage VDD is fifteen volts. The power supply voltage VP is seven hundred volts; and the bootstrap voltage BST is fifteen volts relative to the switch node NSW. Additionally, the load comprises ten ohms; and the IGBTs Q1, Q2 are based on PSIM default parameters for eight-hundred volts maximum operation.

With reference to waveforms 201 and 202, input voltage VIN1 transitions according to a switching cycle of period TIN1 (e.g., fifty microseconds) and with amplitude A1 (e.g., fifteen volts); and input voltage VIN2 transitions according to a switching cycle of period TIN2 (e.g., fifty microseconds) and with amplitude A2 (e.g., fifteen volts). Additionally, the time interval TON1 may be twenty microseconds; and time interval TON2 may be twenty microseconds. Break-before-make interval TB12 may be five microseconds; and break-before-make interval TB21 may be five microseconds.

Accordingly, the switch node voltage VSW transitions high with amplitude A3 (e.g., seven hundred volts) during the time interval TON1 and low during the time interval TON2. Because the simulated load is a resistor; the switch node voltage VSW may also be low during the break-before-make intervals.

With reference to waveform 901, the control signal CX1 may transition low at time 221 and transition high at time 222 to provide a negative going pulse of width TX1 (e.g., five microseconds). Similarly, the control signal CX1 may transition low at time 225 and transition high at time 226 to provide a negative going pulse of width TX1 and amplitude A8 (e.g., fifteen volts). For instance, circuit 800*c* may be used to generate the negative going pulse with width TX1 substantially equal to and coincident with the break-before-make interval TB12. According to the discussion above, the negative going pulse may turn on switch SX1 for the duration of the pulse width TX1.

With reference to waveform 904, high-side gate voltage VG1 may transition high at time 220 and remain high with amplitude A10 during the time interval TON1 from time 220 to time 221. The amplitude A10 may be fifteen volts relative to the switch node voltage VSW. Similarly, high-side gate voltage may transition high at time 224 and remain high with amplitude A10 during interval TON1 from time 224 to time 225.

High-side gate voltage VG1 may transition low at time 221 and, similarly, at time 225. According to the teachings herein, the inductive storage element L1 may be configured to prevent parasitic turn-on by preventing high-side gate voltage VG1 from turning on while the low-side gate voltage VG2 is high.

For instance, with reference to waveforms 901-903, the inductive storage element L1 may be energized in response to switch SX1 operating in the on state. At time 221 and at time 225 when control signal CX1 transitions low, the voltage VL1 transitions high with amplitude A9 (e.g., fifteen volts) relative to the switch node NSW. Concurrently, the inductive current IL1 ramps with positive slope and reaches a maximum at time 222 and at time 226.

In accordance with magnetics, at time 222 and similarly at time 226, voltage VL1 (i.e., waveform 902) transitions to a voltage lower than that of the switch node NSW; accordingly, the back-to-back gate of back-to-back switch SY1 becomes forward biased. Thus, as illustrated by waveform 903, the inductive current IL1 decreases; and as illustrated by waveform 904, the high-side gate voltage VG1 may be driven lower than a local ground potential LG1 (i.e., the switch node voltage VSW) at time 222 and at time 226.

Figure 9B:
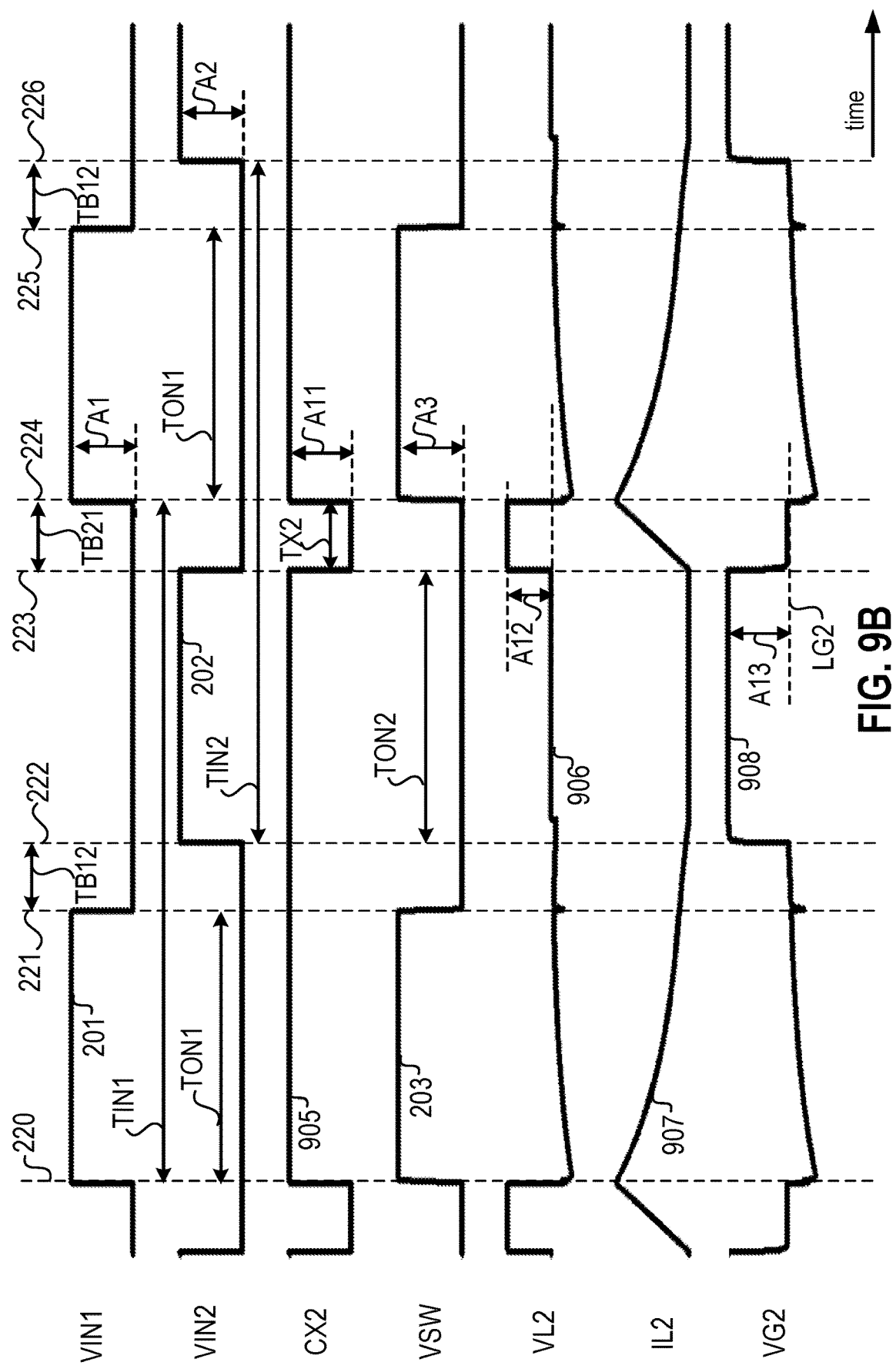
FIG. 9B illustrates simulated waveforms of a half-bridge driver according to an embodiment.

FIG. 9B illustrates simulated waveforms 201-203 and 905-908 of a half-bridge driver 100 according to the embodiment of FIG. 9A. Waveforms 201, 202, and 203 may respectively correspond with the input voltage VIN1, input voltage VIN2, and switch node voltage VSW versus time; and waveforms 905, 906, 907 and 908 may respectively correspond with control signal CX2, voltage VL2, inductive current IL2, and low-side gate voltage VG2 versus time.

The simulated waveforms 201-203 and 905-908 may correspond with a PSIM simulation of the half-bridge driver 100 of FIG. 6 using circuits 800a, 800b, 800c, and 800d. For simulation purposes, the inductive storage element L2 comprises an inductance of one hundred microhenries; and resistor RG2 comprises a resistance of ten ohms. Additionally, NFETs 162, 562, 412, 422 are enhancement mode devices with a threshold of magnitude two volts; and PFETs 152, 552, 402 are also enhancement mode devices with a threshold of magnitude two volts.

With reference to waveform 905, the control signal CX2 may transition low at time 223 and transition high at time 224 to provide a negative going pulse of width TX2 (e.g., five microseconds) and amplitude A11 (e.g., fifteen volts). For instance, circuit 800d may be used to generate the negative going pulse with width TX2 substantially equal to and coincident with the break-before-make interval TB21. According to the discussion above, the negative going pulse may turn on switch SX2 for the duration of the pulse width TX2.

With reference to waveform 908, low-side gate voltage VG2 may transition high at time 222 and remain high with amplitude A13 during the time interval TON2 from time 222 to time 223. The amplitude A13 may be fifteen volts relative to ground GND.

Low-side gate voltage VG2 may transition low at time 223. According to the teachings herein, the inductive storage element L2 may be configured to prevent parasitic turn-on by preventing low-side gate voltage VG2 from turning on while the high-side gate voltage VG1 is high.

For instance, with reference to waveforms 905-907, the inductive storage element L2 may be energized in response to switch SX2 operating in the on state. At time 223 when control signal CX2 transitions low, the voltage VL2 transitions high by amplitude A12 (e.g., fifteen volts) relative to GND. Concurrently, the inductive current IL2 ramps with positive slope and reaches a maximum at time 224.

In accordance with magnetics, at time 224 voltage VL2 (i.e., waveform 906) transitions to a voltage lower than ground GND; accordingly, the back-to-back gate of back-to-back switch SY2 becomes forward biased. Thus, as illustrated by waveform 907, the inductive current IL2 decreases; and as illustrated by waveform 908, the low-side gate voltage VG2 may be driven lower than a local ground potential LG2 (i.e., ground GND) at time 224.

Figure 9C:
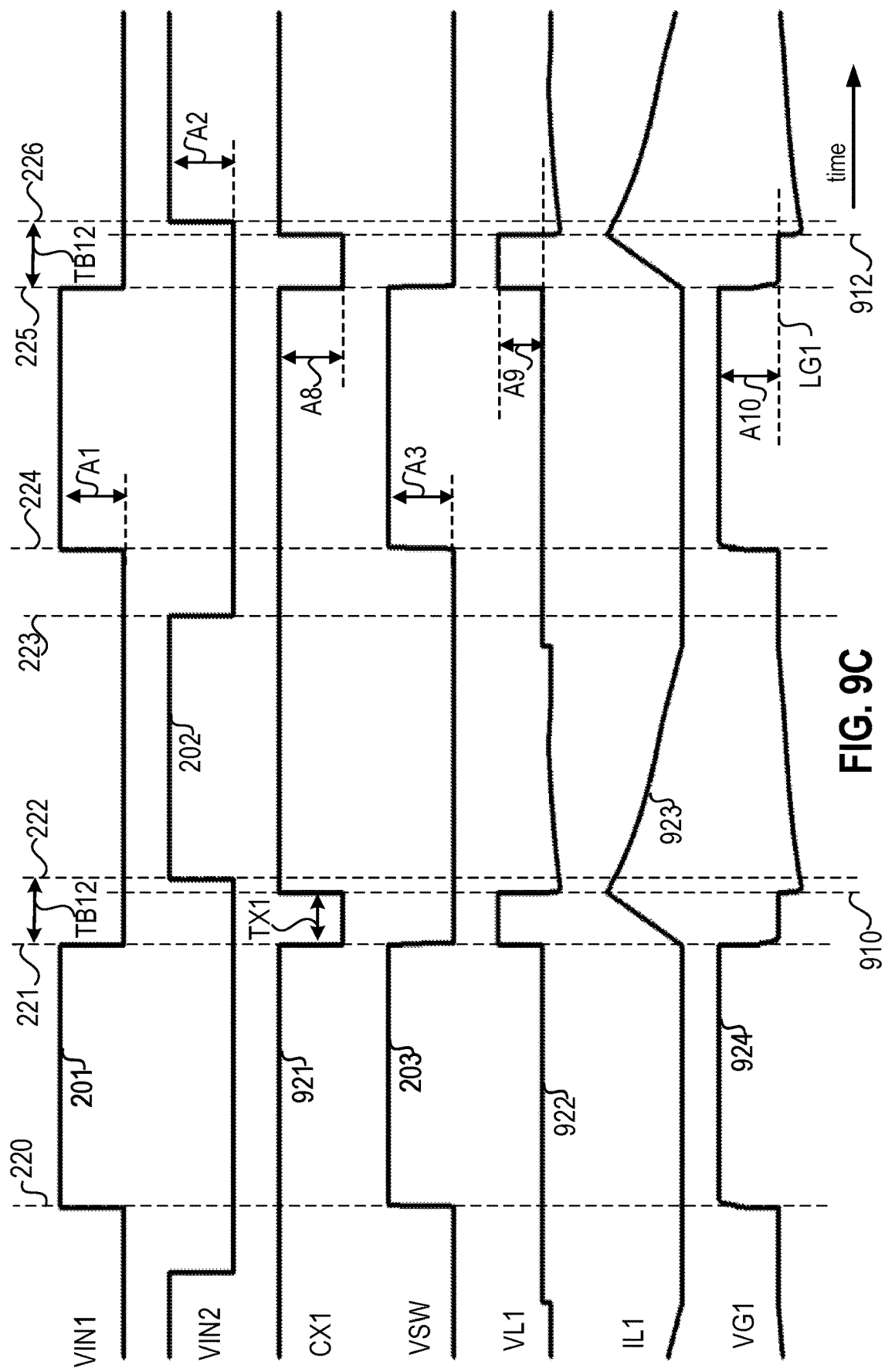
FIG. 9C illustrates simulated waveforms of a half-bridge driver according to an embodiment.

FIG. 9C illustrates simulated 201-203 and 921-924 of a half-bridge driver 100 according to an embodiment. Waveforms 201, 202, and 203 may respectively correspond with the input voltage VIN1, input voltage VIN2, and switch node voltage VSW versus time; and waveforms 921, 922, 923, and 924 may respectively correspond with control signal CX1, voltage VL1, inductive current IL1, and high-side gate voltage VG1 versus time.

Like the simulated waveforms of FIG. 9A, simulated waveforms 201-203 and 921-924 may correspond with a PSIM simulation of the half-bridge driver 100 of FIG. 6 using circuits 800a and 800b. However, instead of using circuits 800c and 800d, the embodiment of FIG. 9C uses circuits 800e and 800f.

Accordingly, waveforms 921-924 may vary according to the configuration of circuits 800e and 800f instead of circuits 800c and 800d. For instance, with reference to waveform 921, the control signal CX1 may transition low at time 221 and transition high at time 910 to provide a negative going pulse of width TX1 (e.g., four microseconds). Similarly, the control signal CX1 may transition low at time 225 and transition high at time 912 to provide a negative going pulse of width TX1 and amplitude A8 (e.g., fifteen volts). For instance, circuit 800e may be used to generate the negative going pulse with width TX1 (e.g., four microseconds) less than that of the break-before-make interval TB12 (e.g., five microseconds). According to the discussion above, the negative going pulse may turn on switch SX1 for the duration of the pulse width TX1.

However, unlike that of FIG. 2A, the negative going pulse terminates prior to the end of the break-before-make interval TB12. Having a shorter pulse width TX1, the inductor current IL1 of waveform 923 may advantageously reach a lower peak (i.e., maximum) relative to that of waveform 903 thereby reducing quiescent current.

With reference to waveform 924, high-side gate voltage VG1 may transition high at time 220 and remain high with amplitude A10 (e.g., fifteen volts) during the time interval TON1 from time 220 to time 221. Similarly, high-side gate voltage VG1 may transition high at time 224 and remain high with amplitude A10 during interval TON1 from time 224 to time 225.

High-side gate voltage VG1 may transition low at time 221 and, similarly, at time 225. According to the teachings herein, the inductive storage element L1 may be configured to prevent parasitic turn-on by preventing high-side gate voltage VG1 from turning on while the low-side gate voltage VG2 is high.

For instance, with reference to waveforms 921-923, the inductive storage element L1 may be energized in response to switch SX1 operating in the on state. At time 221 and at time 225, control signal CX1 transitions low; and voltage VL1 transitions high by amplitude A9 (e.g., fifteen volts) relative to the switch node NSW. Concurrently, the inductive current IL1 ramps with positive slope and reaches a maximum at time 910 and at time 912.

In accordance with magnetics, at time 910 and similarly at time 912, voltage VL1 (i.e., waveform 922) transitions to a voltage lower than that of the switch node NSW; accordingly, the back-to-back gate of back-to-back switch SY1 becomes forward biased. Thus, as illustrated by waveform 923, the inductive current IL1 decreases; and as illustrated by waveform 924, the high-side gate voltage VG1 may be driven lower than the local ground potential LG1 (i.e., the switch node voltage VSW) at time 910 and at time 912.

FIG. 9D illustrates simulated waveforms 201-203 and 925-928 of a half-bridge driver 100 according to the embodiment of FIG. 9C. Waveforms 201, 202, and 203 may respectively correspond with the input voltage VIN1, input voltage VIN2, and switch node voltage VSW versus time; and waveforms 925, 926, 927 and 928 may respectively correspond with control signal CX2, voltage VL2, inductive current IL2, and low-side gate voltage VG2 versus time.

With reference to waveform 925, the control signal CX2 may transition low at time 223 and transition high at time 916 to provide a negative going pulse of width TX2 (e.g., four microseconds) and amplitude A11 (e.g., fifteen volts).

For instance, circuit 800f may be used to generate the negative going pulse with width TX2 (e.g., four microseconds) less than that of the break-before-make interval TB21 (e.g., five microseconds). According to the discussion above, the negative going pulse may turn on switch SX2 for the duration of the pulse width TX2.

With reference to waveform 928, low-side gate voltage VG2 may transition high at time 222 and remain high with amplitude A13 (e.g., fifteen volts) during the time interval TON2 from time 222 to time 223.

Low-side gate voltage VG2 may transition low at time 223. According to the teachings herein, the inductive storage element L2 may be configured to prevent parasitic turn-on by preventing low-side gate voltage VG2 from turning on while the high-side gate voltage VG1 is high.

For instance, with reference to waveforms 925-927, the inductive storage element L2 may be energized in response to switch SX2 operating in the on state. At time 223 when control signal CX2 transitions low, the voltage VL2 transitions high by amplitude A12 (e.g., fifteen volts) relative to the switch node NSW. Concurrently, the inductive current IL2 ramps with positive slope and reaches a maximum at time 916.

In accordance with magnetics, at time 916 voltage VL2 (i.e., waveform 926) transitions to a voltage lower than that of ground GND; accordingly, the back-to-back gate of back-to-back switch SY2 becomes forward biased. Thus, as illustrated by waveform 927, the inductive current IL2 decreases; and as illustrated by waveform 928, the low-side gate voltage VG2 may be driven lower than a local ground potential LG2 (i.e., ground GND) at time 916. According to the teachings herein, at time 224 a positive going glitch in waveform 928 remains below ground GND (i.e., below local ground potential LG2).

Figure 9E:
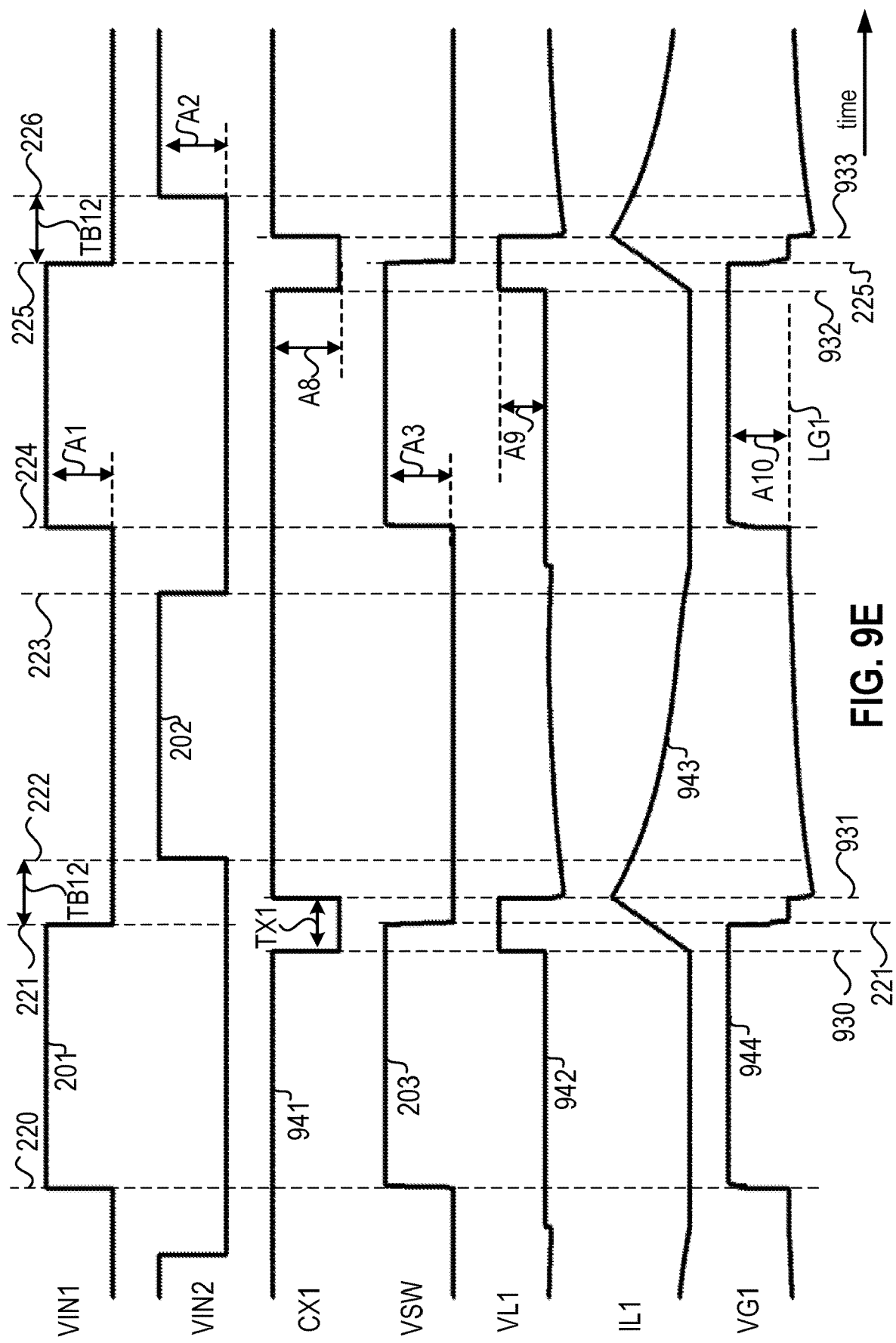
FIG. 9E illustrates simulated waveforms of a half-bridge driver according to an embodiment.

FIG. 9E illustrates simulated 201-203 and 941-944 of a half-bridge driver 100 according to an embodiment. Waveforms 201, 202, and 203 may respectively correspond with the input voltage VIN1, input voltage VIN2, and switch node voltage VSW versus time; and waveforms 941, 942, 943, and 944 may respectively correspond with control signal CX1, voltage VL1, inductive current IL1, and high-side gate voltage VG1 versus time.

Like the simulated waveforms of FIG. 9A, simulated waveforms 201-203 and 941-944 may correspond with a PSIM simulation of the half-bridge driver 100 of FIG. 6 using circuits 800a and 800b. However, instead of using circuits 800c and 800d, the embodiment of FIG. 9E generates the negative going pulses of waveform 941 using a source waveform generator. A source waveform generator may provide a programmed pulse like that available from a microprocessor or controller.

Accordingly, waveforms 941-944 may vary according to a generalized configuration which may be realized using a microprocessor or controller. As illustrated, the control signal CX1 may transition low at time 930 prior to the onset of break-before-make at time 221 and then transition high at time 931 during the break-before-make period TB12. For instance, time 930 may occur two microseconds before time 221; and time 931 may occur two microseconds after time 221. Similarly, control signal CX1 may transition low at time 932 prior to the onset of break-before-make at time 225 and then transition high at time 931 during the break-before-make period TB12. As illustrated the control signal CX1 may be provided with a negative going pulse of pulse width TX1. The pulse width TX1 may be four microseconds and the break-before-make period TB12 may be five microseconds.

With reference to waveform 944, high-side gate voltage VG1 may transition high at time 220 and remain high with amplitude A10 (e.g., fifteen volts) during the time interval TON1 from time 220 to time 221. Similarly, high-side gate voltage VG1 may transition high at time 224 and remain high with amplitude A10 during interval TON1 from time 224 to time 225.

High-side gate voltage VG1 may transition low at time 221 and, similarly, at time 225. According to the teachings herein, the inductive storage element L1 may be configured to prevent parasitic turn-on by preventing high-side gate voltage VG1 from turning on while the low-side gate voltage VG2 is high.

For instance, with reference to waveforms 941-943, the inductive storage element L1 may be energized in response to switch SX1 operating in the on state. At time 930 and at time 932 when control signal CX1 transitions low, the voltage VL1 transitions high by amplitude A9 (e.g., fifteen volts) relative to the switch node NSW. Concurrently, the inductive current IL1 ramps with positive slope and reaches a maximum at time 931 and at time 933.

In accordance with magnetics, at time 931 and similarly at time 933, voltage VL1 (i.e., waveform 942) transitions to a voltage lower than that of the switch node NSW; accordingly, the back-to-back gate of back-to-back switch SY1 becomes forward biased. Thus, as illustrated by waveform 943, the inductive current IL1 decreases; and as illustrated by waveform 944, the high-side gate voltage VG1 may be driven lower than the local ground potential LG1 (i.e., the switch node voltage VSW) at time 931 and at time 933.

Figure 9F:
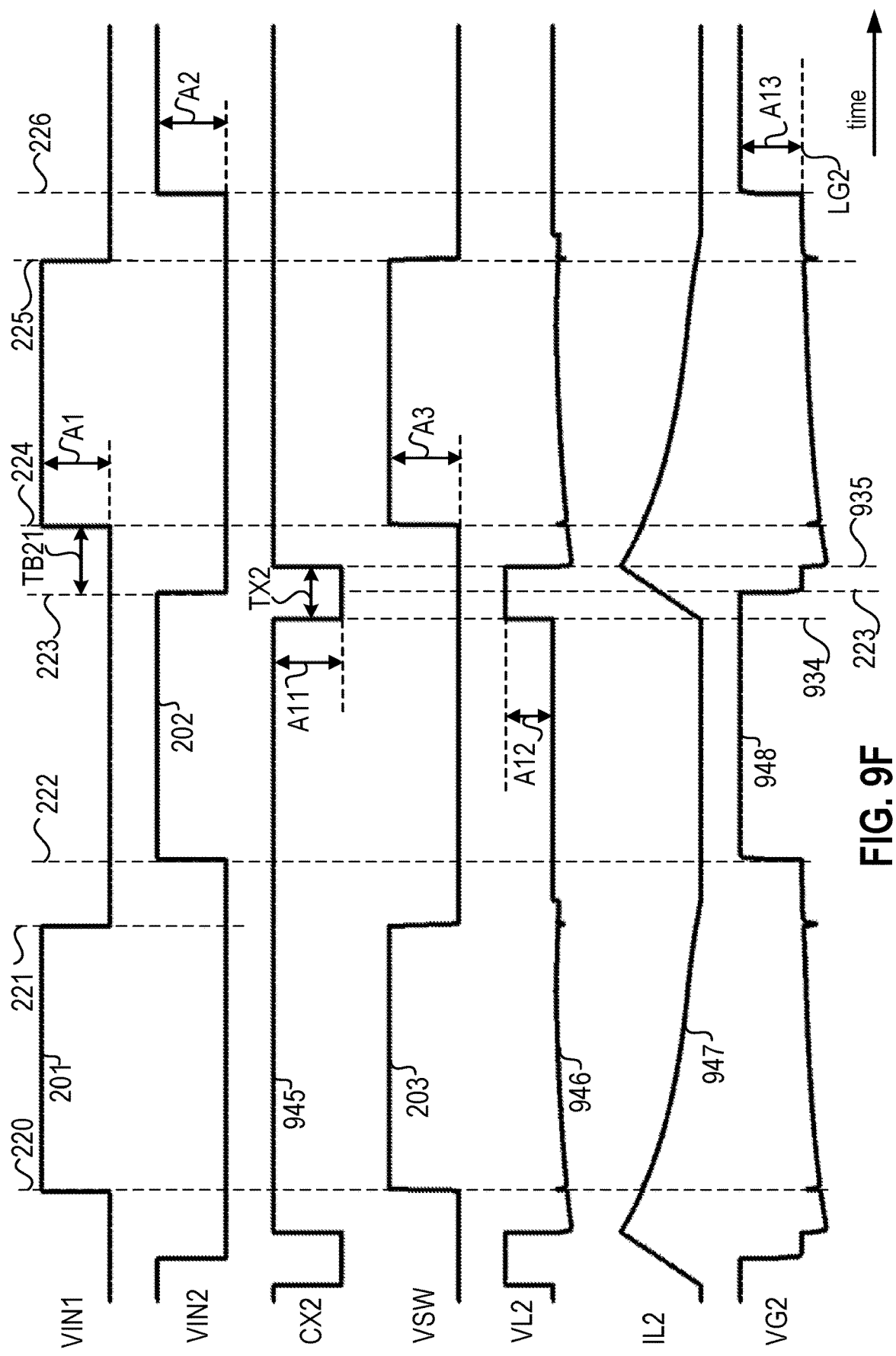
FIG. 9F illustrates simulated waveforms of a half-bridge driver according to an embodiment.

FIG. 9F illustrates simulated waveforms 201-203 and 945-948 of a half-bridge driver 100 according to the embodiment of FIG. 9E. Waveforms 201, 202, and 203 may respectively correspond with the input voltage VIN1, input voltage VIN2, and switch node voltage VSW versus time; and waveforms 945, 946, 947 and 948 may respectively correspond with control signal CX2, voltage VL2, inductive current IL2, and low-side gate voltage VG2 versus time.

As discussed above, the embodiment of FIG. 9F, like that of FIG. 9E, may generate the negative going pulses of waveform 945 using a source waveform generator.

As illustrated, the control signal CX2 may transition low at time 934 and transition high at time 935 to provide a negative going pulse of width TX2 (e.g., four microseconds) and amplitude A11 (e.g., fifteen volts). For instance, time 934 may occur two microseconds before time 223; and time 935 may occur two microseconds after time 223. Accordingly, control signal CX2 may transition low at time 934 prior to the onset of break-before-make and then transition high at time 935 during the break-before-make period TB21 (e.g., five microseconds).

With reference to waveform 928, low-side gate voltage VG2 may transition high at time 222 and remain high with amplitude A13 (e.g., fifteen volts) during the time interval TON1 from time 222 to time 223.

Low-side gate voltage VG2 may transition low at time 223. According to the teachings herein, the inductive storage element L2 may be configured to prevent parasitic turn-on by preventing low-side gate voltage VG2 from turning on while the high-side gate voltage VG1 is high.

For instance, with reference to waveforms 945-947, the inductive storage element L2 may be energized in response to switch SX2 operating in the on state. At time 934 when control signal CX2 transitions low, the voltage VL2 transitions high by amplitude A12 (e.g., fifteen volts) relative to ground GND. Concurrently, the inductive current IL2 ramps with positive slope and reaches a maximum at time 935.

In accordance with magnetics, at time 935 voltage VL2 (i.e., waveform 946) transitions to a voltage lower than that of ground GND; accordingly, the back-to-back gate of back-to-back switch SY2 becomes forward biased. Thus, as illustrated by waveform 947, the inductive current IL2 decreases; and as illustrated by waveform 948, the low-side gate voltage VG2 is driven lower than a local ground potential LG2 (i.e., ground GND) at time 935. According to the teachings herein, at time 224 a positive going glitch in waveform 948 remains below ground GND (i.e., below local ground potential LG2).

Figure 9G:
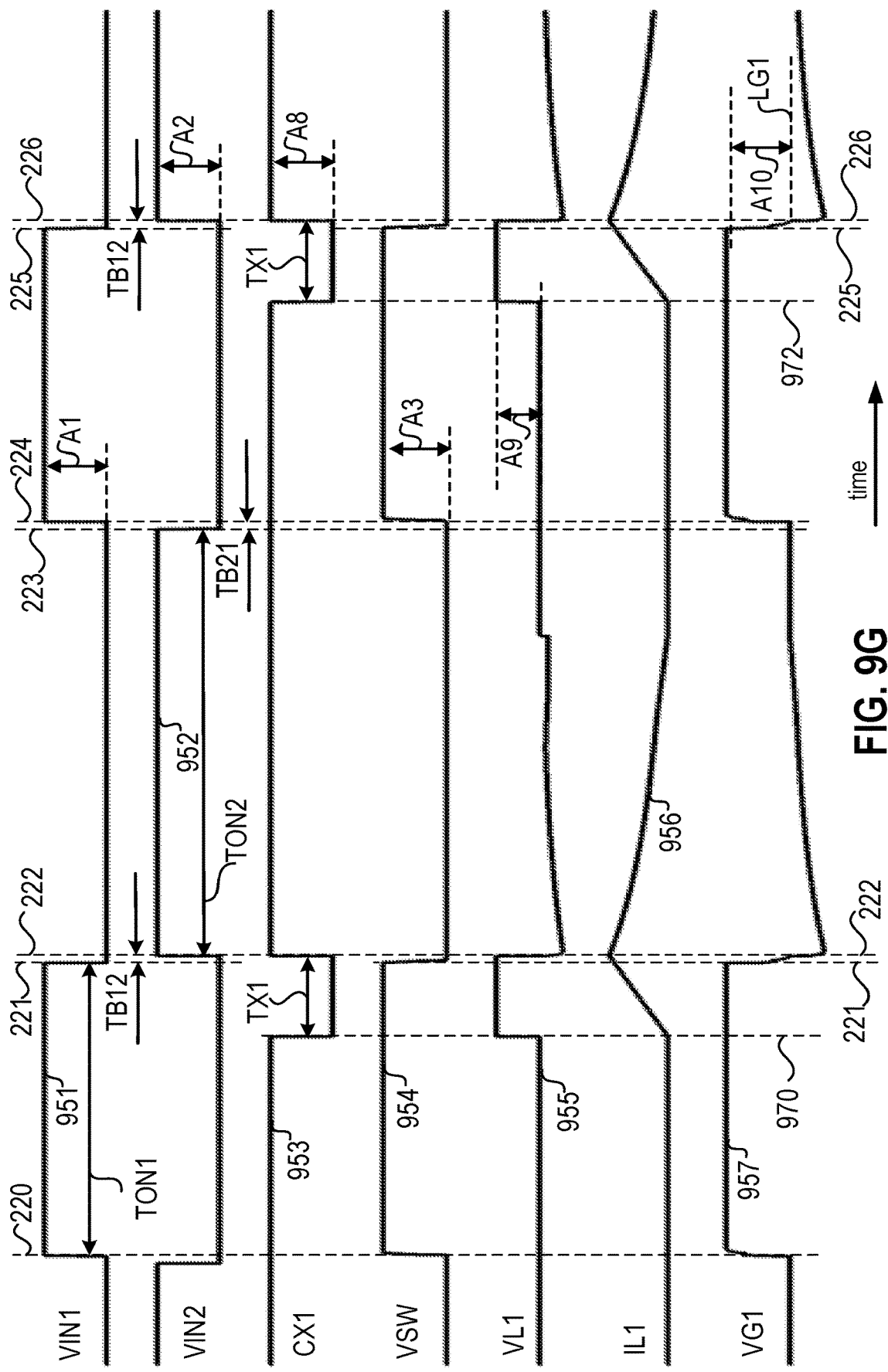
FIG. 9G illustrates simulated waveforms of a half-bridge driver according to an embodiment.

FIG. 9G illustrates simulated waveforms 951-957 of a half-bridge driver 100 according to an embodiment. Waveforms 951, 952, and 954 may respectively correspond with the input voltage VIN1, input voltage VIN2, and switch node voltage VSW versus time; and waveforms 953, 955, 956, and 957 may respectively correspond with control signal CX1, voltage VL1, inductive current IL1, and high-side gate voltage VG1 versus time. Waveforms 951, 952, and 954 are like waveforms 201, 202, and 203, except the break-before-make period TB12 and the break-before-make period TB21 are smaller (e.g., five-hundred nanoseconds); and the time interval TON2 may be larger. For instance, time interval TON2 may be twenty-nine microseconds instead of twenty microseconds.

Like the simulated waveforms of FIG. 9A, simulated waveforms 951-957 may correspond with a PSIM simulation of the half-bridge driver 100 of FIG. 6 using circuits 800a and 800b. However, instead of using circuits 800c and 800d, the embodiment of FIG. 9G uses circuits 800i and 800j.

Accordingly, waveforms 921-924 may vary according to the configuration of circuits 800i and 800j instead of circuits 800c and 800d. For instance, with reference to waveform 953, the control signal CX1 may transition low at time 970 and transition high at time 222 to provide a negative going pulse of width TX1 (e.g., five and a half microseconds). Similarly, the control signal CX1 may transition low at time 972 and transition high at time 226 to provide a negative going pulse of width TX1 and amplitude A8 (e.g., fifteen volts). For instance, circuit 800i may be used to generate the negative going pulse with width TX1 (e.g., five and a half microseconds) which begins prior to the beginning of the break before-make interval TB12. As illustrated, the negative going pulse may turn on switch SX1 while the high-side gate voltage VG1 is high and turn off switch SX1 at the end of the break-before-make interval TB12.

According to the teachings herein, circuit 800i may allow using the inductive storage element L1 when the break-before-make interval TB12 is shorter. For instance, the break-before-make interval TB12 may be approximately five-hundred nanoseconds.

With reference to waveform 957, high-side gate voltage VG1 may transition high at time 220 and remain high with amplitude A10 (e.g., fifteen volts) during the time interval TON1 from time 220 to time 221. Similarly, high-side gate voltage VG1 may transition high at time 224 and remain high with amplitude A10 during interval TON1 from time 224 to time 225.

High-side gate voltage VG1 may transition low at time 221 and similarly at time 225. According to the teachings herein, the inductive storage element L1 may be configured to prevent parasitic turn-on by preventing high-side gate voltage VG1 from turning on while the low-side gate voltage VG2 is high.

For instance, with reference to waveforms 953, 955-957, the inductive storage element L1 may be energized in response to switch SX1 operating in the on state. At time 970 and at time 972 when control signal CX1 transitions low, the voltage VL1 transitions high by amplitude A9 (e.g., fifteen volts) relative to the switch node NSW. Concurrently, the inductive current IL1 ramps with positive slope and reaches a maximum at time 222 and at time 226.

In accordance with magnetics, at time 222 and similarly at time 226, voltage VL1 (i.e., waveform 955) transitions to a voltage lower than that of the switch node NSW; accordingly, the back-to-back gate of back-to-back switch SY1 becomes forward biased. Thus, as illustrated by waveform 956, the inductive current IL1 decreases; and as illustrated by waveform 957, the high-side gate voltage VG1 may be driven lower than the local ground potential LG1 (i.e., the switch node voltage VSW) at time 222 and at time 226.

Figure 9H:
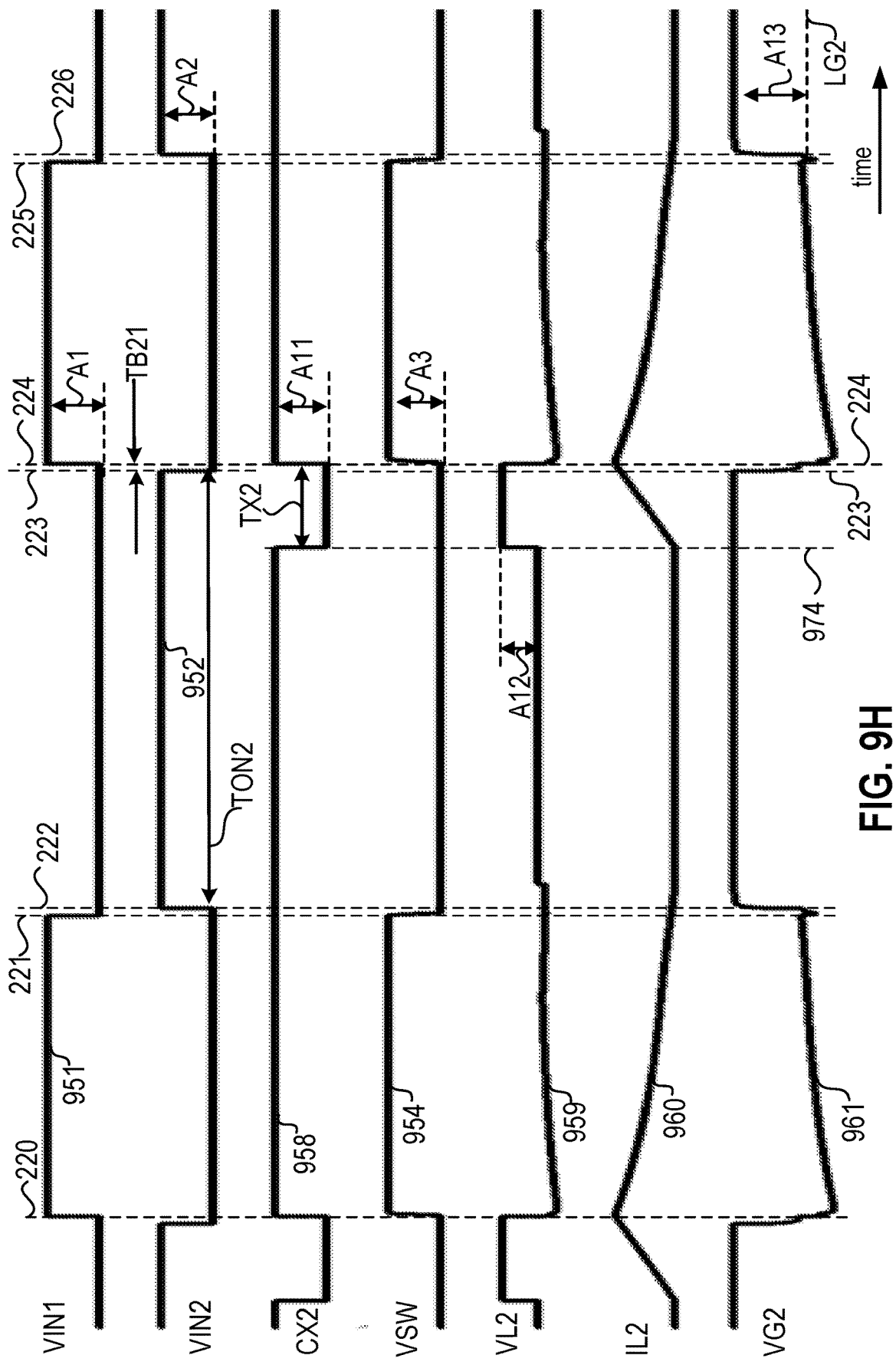
FIG. 9H illustrates simulated waveforms of a half-bridge driver according to an embodiment.

FIG. 9H illustrates simulated waveforms 951, 952, 954, and 958-961 of a half-bridge driver 100 according to the embodiment of FIG. 9G. Waveforms 951, 952, and 954 may respectively correspond with the input voltage VIN1, input voltage VIN2, and switch node voltage VSW versus time; and waveforms 958, 959, 960, and 961 may respectively correspond with control signal CX2, voltage VL2, inductive current IL2, and low-side gate voltage VG2 versus time.

With reference to waveform 958, the control signal CX2 may transition low at time 974 and transition high at time 224 to provide a negative going pulse of width TX2 (e.g., five and a half microseconds) and amplitude A11 (e.g., fifteen volts). For instance, circuit 800j may be used to generate the negative going pulse with width TX2 which begins prior to the beginning of the break before-make interval TB21. As illustrated, the negative going pulse may turn on switch SX2 while the low-side gate voltage VG2 is high and turn off switch SX2 at the end of the break-before-make interval TB21.

According to the teachings herein, circuit 800j may allow using the inductive storage element L2 when the break-before-make interval TB21 is shorter. For instance, the break-before-make interval TB21 may be approximately five-hundred nanoseconds.

With reference to waveform 961, low-side gate voltage VG2 may transition high at time 222 and remain high with amplitude A13 (e.g., fifteen volts) during the time interval TON2 from time 222 to time 223.

Low-side gate voltage VG2 may transition low at time 223. According to the teachings herein, the inductive storage element L2 may be configured to prevent parasitic turn-on by preventing low-side gate voltage VG2 from turning on while the high-side gate voltage VG1 is high.

For instance, as illustrated, the inductive storage element L2 may be energized in response to switch SX2 operating in the on state. At time 974 when control signal CX2 transitions low, the voltage VL2 transitions high by amplitude A12 (e.g., fifteen volts) relative to ground GND. Concurrently, the inductive current IL2 ramps with positive slope and reaches a maximum at time 224.

In accordance with magnetics, at time 224 voltage VL2 (i.e., waveform 955) transitions to a voltage lower than that of ground GND; accordingly, the back-to-back gate of back-to-back switch SY2 becomes forward biased. Thus, as illustrated by waveform 960, the inductive current IL2 decreases; and as illustrated by waveform 961, the low-side gate voltage VG2 is driven lower than the local ground potential LG2 (i.e., ground GND) at time 224.

Figure 10:
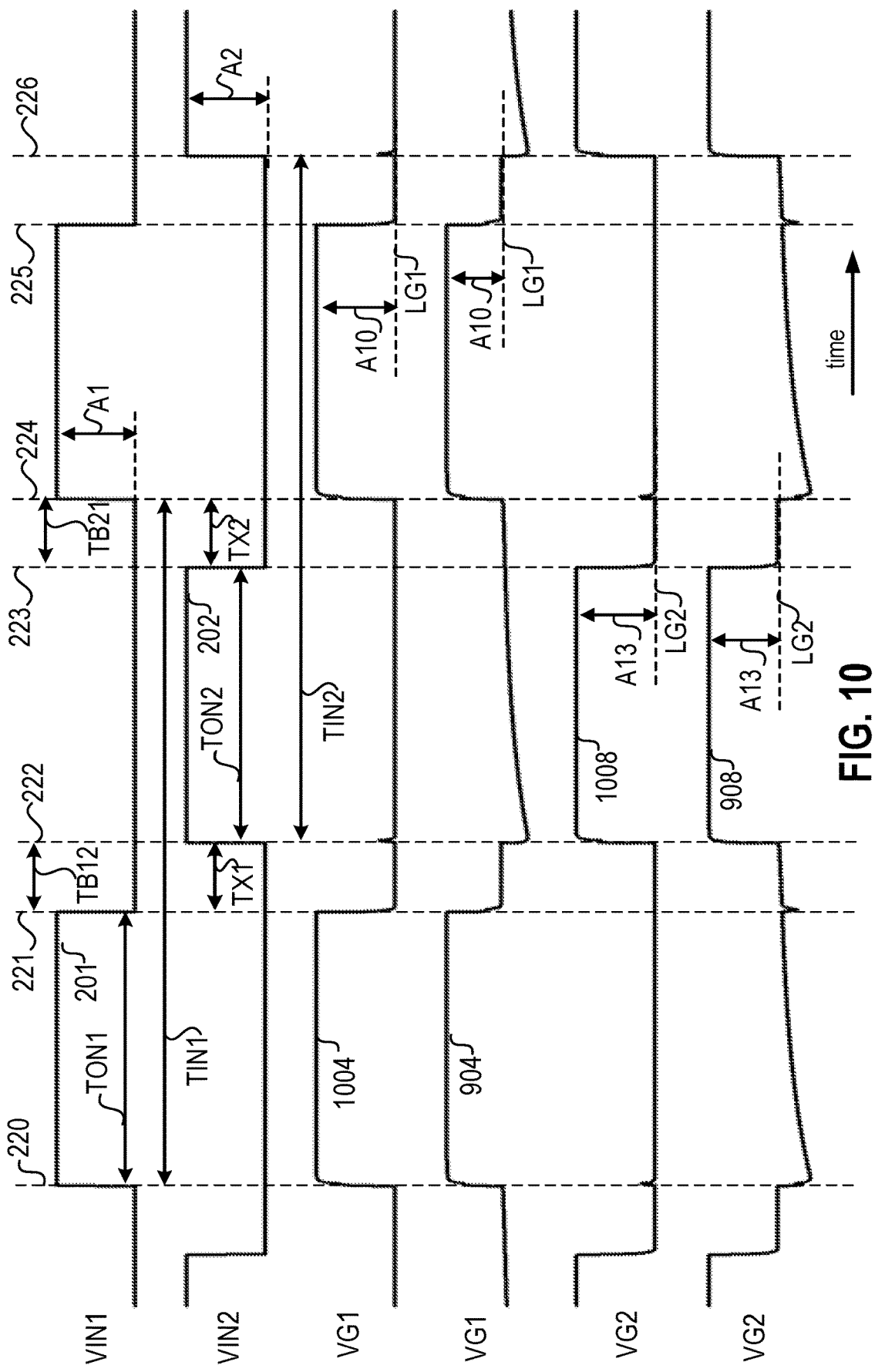
FIG. 10 compares simulated waveforms.

FIG. 10 compares simulated waveforms 201, 202, 1004, 904, 1008, 908. Waveforms 201 and 202 may respectively correspond with input voltages VIN1 and VIN2; and waveforms 904 and 908 may respectively correspond with high-side gate voltage VG1 and low-side gate voltage VG2 according to the embodiment of FIG. 9A and FIG. 9B. For comparison, waveforms 1004 and 1008 may respectively correspond with high-side gate voltage VG1 and low-side gate voltage VG2 when the inductive storage elements L1 and L2 are removed from the half-bridge driver 100.

For instance, high-side gate voltage VG1 (i.e., waveform 1004) may exhibit positive going glitches at transition times 222 and 226. As discussed herein, the positive going glitches may lead to parasitic turn-on of high-side device 141 while the low-side gate voltage VG2 is high. In contrast, according to the embodiment of FIG. 9A, the high-side gate voltage VG1 (i.e., waveform 904) does not show a positive going glitch at transition times 222 and 226. Instead, according to magnetics and the teachings herein, the inductive storage element L1 may drive the gate (i.e., the device gate) of high-side device 141 below a local ground potential LG1 (i.e., the switch node voltage VSW).

Similarly, low-side gate voltage VG2 (i.e., waveform 1008) may exhibit positive going glitches at transition times 220 and 224. As discussed herein, the positive going glitches may lead to parasitic turn-on of low-side device 142 while the high-side gate voltage VG1 is high. In contrast, according to the embodiment of FIG. 9B, the low-side gate voltage VG1 (i.e., waveform 908) does not show a positive going glitch at transition times 220 and 224. Instead, according to magnetics and the teachings herein, the inductive storage element L2 may drive the gate (i.e., the device gate) of low-side device 142 below a local ground potential LG2 (i.e., ground GND).

Figure 11:
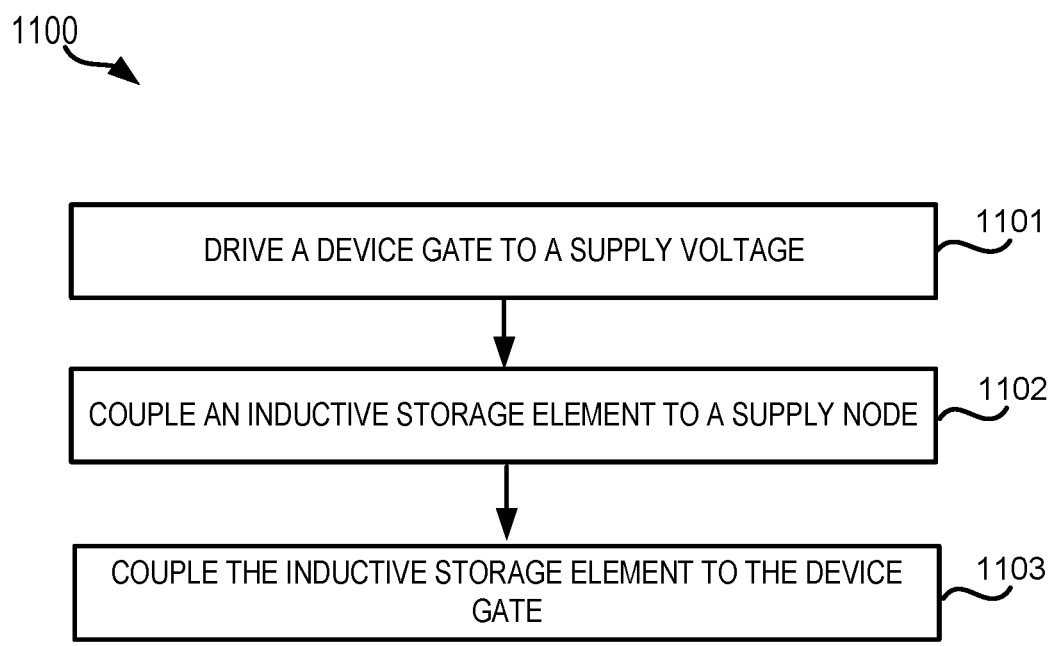
FIG. 11 illustrates a conceptual flow diagram for driving a device gate according to an embodiment.

FIG. 11 illustrates a conceptual flow diagram 1100 for driving a device gate according to an embodiment. According to the teachings herein, a device gate may correspond with a gate driven by a gate driver. For instance, a device gate may be the gate of high-side device 141 and/or the gate of low-side device 142. Also, a gate driver may be a high-side gate driver 301 and/or a low-side gate driver 302. Furthermore, as presented herein, a gate driver may include a buffer which may be coupled, either directly and/or indirectly, to the device gate; and the buffer may provide gate drive. For instance, a buffer may be a high-side buffer 121 and/or a low-side buffer 122.

Accordingly, step 1101 may correspond with using a buffer to drive a device high (i.e., to a supply voltage). For instance, high-side buffer 121 may drive the gate of high-side device 141 to be coupled to the bootstrap node NBST via PFET 151. As such, the gate (i.e., device gate) of high-side device 141 may be driven toward the bootstrap voltage BST (i.e., a supply voltage). In doing so, the high-side device 141 may be turned on. During a switching cycle (e.g., a switching cycle of period TIN1), the high-side buffer 121 may also drive the gate of the high-side device 141 to a local ground potential LG1 (i.e., the switch node voltage VSW) via NFET 161.

Similarly, low-side buffer 122 may drive the gate of low-side device 142 to be coupled to the supply node NVDD via PFET 152. As such, the gate (i.e., device gate) of low-side device 142 may be driven toward the supply voltage VDD (i.e., a supply voltage). In doing so, the low-side device 142 may be turned on. During a switching cycle (e.g., a switching cycle of period TIN2), the low-side buffer 122 may also drive the gate of the low-side device 142 to a local ground potential LG2 (i.e., ground GND) via NFET 162.

Step 1102 may correspond with coupling an inductive storage element to a supply node. For instance, inductive storage element L1 may be coupled to the bootstrap node NBST (i.e., a supply node) when control signal CX1 turns switch SX1 on. According to the teachings herein, this may energize inductive storage element L1 while an inductive current IL1 increases.

Similarly, inductive storage element L2 may be coupled to the supply node NVDD (i.e., a supply node) when control signal CX2 turns switch SX2 on. According to the teachings herein, this may energize inductive storage element L2 while an inductive current IL2 increases.

Step 1103 may correspond with coupling the inductive storage element to the device gate. According to the teachings herein, inductive storage element L1 may be coupled to the high-side gate node NG1 when switch SY1 turns on. Switch SY1 may be turned on by exerting a control signal CY1 and/or by using a back-to-back switch SY1. For instance, as illustrated in FIG. 5A, a back-to-back switch SY1 may be controlled without the need for exerting a control signal CY1. Instead, the back-to-back gate may be coupled to the switch node NSW. According to magnetics and the teachings herein, when the inductive storage element L1 is coupled to the high-side gate node NG1, this may cause the device gate to be pulled (i.e., driven) below the local ground potential LG1 (i.e., below the switch node voltage VSW).

Similarly, inductive storage element L2 may be coupled to the low-side gate node NG2 when switch SY2 turns on. Switch SY2 may be turned on by exerting a control signal CY2 and/or by using a back-to-back switch SY2. For instance, as illustrated in FIG. 5A, a back-to-back switch SY2 may be controlled without the need for exerting a control signal CY2. Instead, the back-to-back gate may be coupled to ground GND. According to magnetics and the teachings herein, when the inductive storage element L2 is coupled to the low-side gate node NG2, then this may cause the device gate to be pulled (i.e., driven) below the local ground potential LG2 (i.e., below ground GND).

Figure 12:
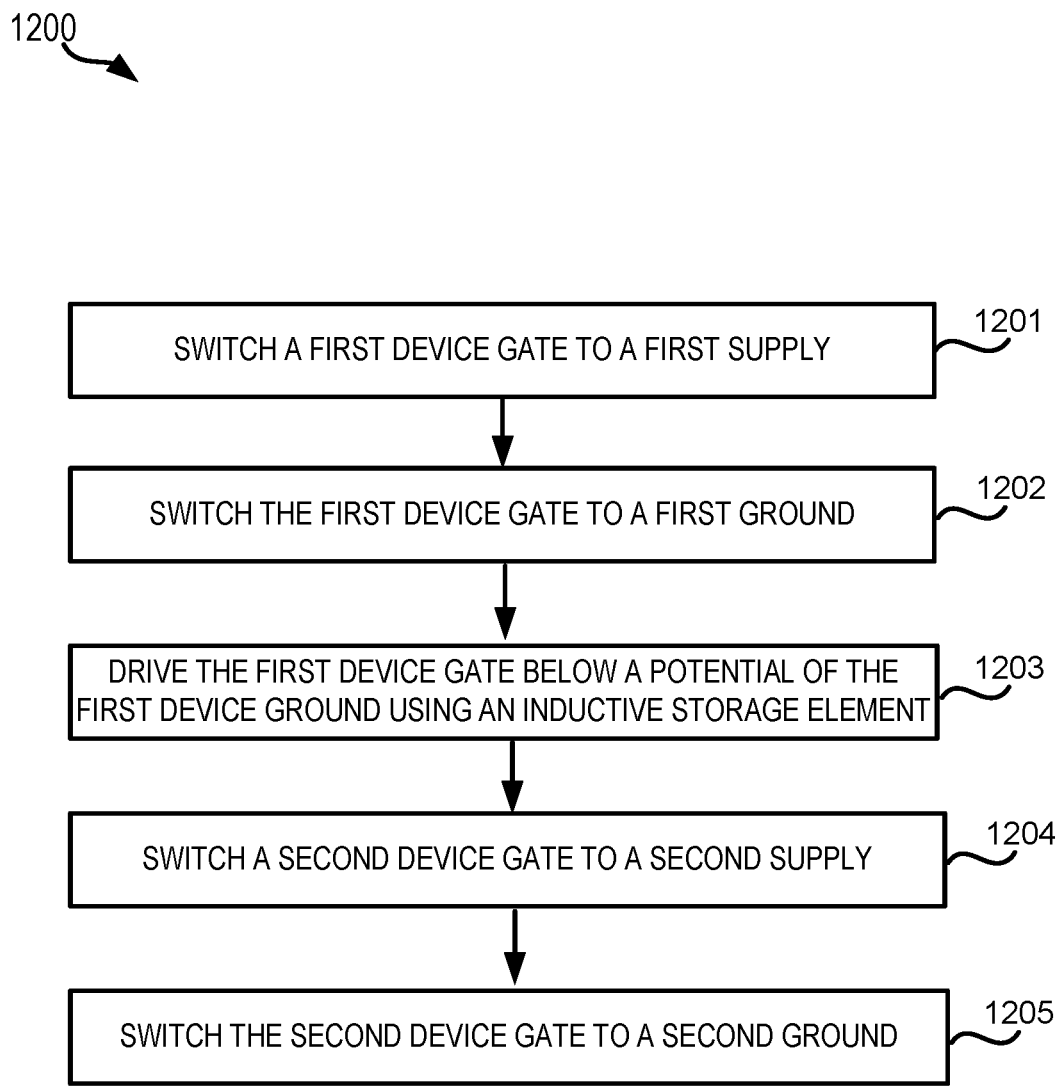
FIG. 12 illustrates a conceptual flow diagram for operating a half-bridge driver according to an embodiment.

FIG. 12 illustrates a conceptual flow diagram 1200 for operating a half-bridge driver 100 according to an embodiment. Step 1201 may correspond with switching a first device gate to a first supply. For instance, with reference to FIG. 5A and to FIG. 9A, the first device gate may be the gate of the high-side device 141; and at time 220 the high-side buffer 121 may drive the gate of high-side device 141 to the bootstrap node NBST via PFET 151. The bootstrap node NBST may provide the first supply (i.e., the bootstrap voltage BST); and the high-side gate voltage VG1 (i.e., waveform 904) may transition high.

Alternatively, and additionally, with reference to FIG. 5A and FIG. 9B, the first device gate may be the gate of the low-side device 142; and at time 222 the low-side buffer 122 may drive the gate of low-side device 142 to the supply node NVDD via PFET 152. The supply node NVDD may provide the first supply (i.e., the supply voltage VDD); and the low-side gate voltage VG2 (i.e., waveform 908) may transition high.

Step 1202 may correspond with switching the first device gate to a first ground. For instance, with reference to FIG. 5A and FIG. 9A, the first device gate may be the gate of the high-side device 141; and at time 221 the high-side buffer 121 may drive the gate of high-side device 141 to the switch node NSW via NFET 161. The switch node NSW may provide the first ground; and the high-side gate voltage VG1 (i.e., waveform 904) may transition low to a local ground potential LG1 (i.e., the switch node voltage VSW).

Alternatively, and additionally, with reference to FIG. 5A and FIG. 9B, the first device gate may be the gate of the low-side device 142; and at time 223 the low-side buffer 122 may drive the gate of low-side device 142 to ground GND via NFET 162. Ground GND may provide the first ground; and the low-side gate voltage VG2 (i.e., waveform 908) may transition low to a local ground potential LG2 (e.g., zero volts).

Step 1203 may correspond with driving the first device gate below a potential of the first device ground using an inductive storage element. For instance, with reference to FIG. 5A and to FIG. 9A, the first device gate may be the gate of the high-side device 141. According to the teachings herein, at time 222 the inductive storage element L1 may drive the high-side gate node NG1 below the potential (i.e., local ground potential LG1) of the first device ground (i.e., the switch node NSW).

Alternatively, and additionally, with reference to FIG. 5A and to FIG. 9B, the first device gate may be the gate of the low-side device 142. According to the teachings herein, at time 224 the inductive storage element L2 may drive the low-side gate node NG2 below the potential (i.e., local ground potential LG2) of the first device ground (i.e., ground GND).

Step 1204 may correspond with switching a second device gate to a second supply. For instance, with reference to FIG. 5A and FIG. 9B, the second device gate may be the gate of the low-side device 142; and at time 222 the low-side buffer 122 may drive the gate of low-side device 142 to the supply node NVDD via PFET 152. The supply node NVDD may provide the second supply (i.e., the supply voltage VDD); and the low-side gate voltage VG2 may transition high.

Alternatively, and additionally, with reference to FIG. 5A and FIG. 9A, the second device gate may be the gate of the high-side device 141; and at time 224 the high-side buffer 121 may drive the gate of high-side device 141 to the bootstrap node NBST via PFET 151. The bootstrap node NBST may provide the second supply (i.e., the bootstrap voltage BST); and the high-side gate voltage VG1 may transition high.

Step 1205 may correspond with switching the second device gate to a second ground. For instance, with reference to FIG. 5A and FIG. 9B, the second device gate may be the gate of the low-side device 142; and at time 223 the low-side buffer 122 may drive the gate of low-side device 142 to ground GND via NFET 162. Ground GND may provide the second ground; and the low-side gate voltage VG2 may transition low to a local ground potential LG2.

Alternatively, and additionally, with reference to FIG. 5A and FIG. 9A, the second device gate may be the gate of the high-side device 141; and at time 225 the high-side buffer 121 may drive the gate of high-side device 141 to the switch node NSW via NFET 161. The switch node NSW may provide the second ground; and the high-side gate voltage VG1 may transition low to a local ground potential LG1 (i.e., the switch node voltage VSW).

Although steps 1201-1205 were discussed with reference to FIG. 5A, FIG. 9A, and FIG. 9B, the embodiments of FIG. 5A, FIG. 9A, and FIG. 9B are non-limiting embodiments; accordingly, steps 1201-1205 may apply to any of embodiments presented herein.

CONCLUSION

The above description of illustrated examples of the present disclosure, including what is described in the Abstract, is not intended to be exhaustive or to be limitation to the precise forms disclosed. While specific embodiments of, and examples for a switched inductive storage element to enhance gate drive at turn-off are described herein for illustrative purposes, various equivalent modifications are possible without departing from the broader spirit and scope of the present disclosure. Indeed, it is appreciated that the specific example voltages, currents, frequencies, power range values, times, etc., are provided for explanation purposes and that other values may also be employed in other embodiments and examples in accordance with the teachings herein.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions, and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

The present invention is defined in the claims; however, it should be understood that the present invention can alternatively be defined in accordance with the following examples.

Example 1: A gate driver comprises a local ground node, a buffer, and an inductive storage element. The buffer is configured to drive a device gate to the local ground potential during a switching cycle; and the inductive storage element is configured to drive the device gate below the local ground potential during the switching cycle.

Example 2: The gate driver of any one of the preceding examples, wherein the gate driver is a high-side gate driver, and the buffer is configured to drive the device gate of a high-side device.

Example 3: The gate driver of any one of the preceding examples, wherein the high-side device comprises an insulated gate bipolar transistor (IGBT).

Example 4: The gate driver of any one of the preceding examples, wherein the gate driver is a low-side gate driver, and the buffer is configured to drive the device gate of a low-side device.

Example 5: The gate driver of any one of the preceding examples, wherein the low-side device comprises an insulated gate bipolar transistor (IGBT).

Example 6: The gate driver of any one of the preceding examples, wherein the inductive storage element is an inductor.

Example 7: The gate driver of any one of the preceding examples, wherein the inductive storage element comprises an inductance.

Example 8: The gate driver of any one of the preceding examples, wherein the inductive storage element is configured to receive an inductive current.

Example 9: The gate driver of any one of the preceding examples, further comprising an inductor switch block configured to source an inductive current from a supply node and to subsequently sink the inductive current from the device gate during the switching cycle.

Example 10: The gate driver of any one of the preceding examples, wherein the inductor switch block comprises a p-channel field effect transistor (PFET) and an n-type back-to-back switch. The PFET comprises a body-connected PFET source, a PFET drain, and a PFET gate. The n-type back-to-back switch comprises a back-to-back gate, a first back-to-back drain/source, and a second back-to-back drain/source. The back-to-back gate, the first back-to-back drain/source, and the second back-to-back drain/source are formed by a first n-type field effect transistor (NFET) electrically coupled to a second NFET.

Example 11: The gate driver of any one of the preceding examples, wherein the first back-to-back drain/source is electrically coupled to the PFET drain, the second back-to-back drain/source is electrically coupled to the device gate, and the inductive storage element is electrically coupled between the PFET drain and the local ground node.

Example 12: The gate driver of any one of the preceding examples, wherein the back-to-back gate is electrically coupled to the local ground node.

Example 13: The gate driver of any one of the preceding examples, wherein the back-to-back gate is electrically coupled to an alternating current (ac) ground node.

Example 14: The gate driver of any one of the preceding examples, wherein the back-to-back gate is configured to receive the local ground potential.

Example 15: The gate driver of any one of the preceding examples, wherein the PFET gate is configured to receive a pulse control signal during the switching cycle.

Example 16: The gate driver of any one of the preceding examples, wherein a circuit comprising a monostable multivibrator is configured to provide the pulse control signal.

Example 17: A method of driving a device gate according to a switching cycle comprises: driving the device gate to a supply voltage; coupling an inductive storage element to a supply node; and coupling the inductive storage element to the device gate.

Example 18: The method of any one of the preceding examples, wherein driving the device gate to the supply voltage further comprises: subsequently driving the device gate to a local ground potential.

Example 19: The method of any one of the preceding examples, wherein coupling the inductive storage element to the supply node further comprises: subsequently driving the device gate to a local ground potential.

Example 20: The method of any one of the preceding examples, wherein coupling the inductive storage element to the supply node further comprises: coupling the inductive storage element to the supply node using a PFET.

Example 21: The method of any one of the preceding examples, wherein coupling the inductive storage element to the device gate further comprises: coupling the inductive storage element to the device gate using an n-type back-to-back switch.

Example 22: The method of any one of the preceding examples, wherein coupling the inductive storage element to the device gate further comprises: providing a local ground potential to a back-to-back gate of the n-type back-to-back switch.

Example 23: The method of any one of the preceding examples, wherein providing the local ground potential to the back-to-back gate of the n-type back-to-back switch comprises: coupling the back-to-back gate to a local ground.

Example 24: A method of operating a half-bridge driver during a switching cycle comprises: switching a first device gate to a first supply; switching the first device gate to a first ground; driving the first device gate below a potential of the first ground using an inductive storage element; switching a second device gate to a second supply; and switching the second device gate to a second ground.

Example 25: The method of any one of the preceding examples, wherein providing the local ground potential to the back-to-back gate of the n-type back-to-back switch comprises: coupling the back-to-back gate to a local ground.

Example 26: The method of any one of the preceding examples, wherein the first device gate is a low-side device gate; the second device gate is a high-side device gate; the second ground is a half-bridge switch node; and the second supply is a bootstrap supply.

Example 27: The method of any one of the preceding examples, wherein the second device gate is a low-side device gate; the first device gate is a high-side device gate; the first ground is a half-bridge switch node; and the first supply is a bootstrap supply.

Example 28: The method of any one of the preceding examples, wherein driving the first device gate below the potential of the first ground using the inductive storage element comprises: switching the inductive storage element to the first supply using a PFET; and switching the inductive storage element to the first device gate using an n-type back-to-back switch.

Example 29: The method of any one of the preceding examples, wherein switching the inductive storage element to the first supply using the PFET comprises: turning on the PFET after switching the first device gate to the first supply; and turning off the PFET before switching the second device gate to the second supply.

Example 30: The method of any one of the preceding examples, wherein switching the inductive storage element to the first supply using the PFET comprises: switching the inductive storage element to the first supply during a break-before-make interval of the switching cycle.

Example 31: The method of any one of the preceding examples, wherein switching the inductive storage element to the first device gate using the n-type back-to-back switch comprises: coupling a gate of the n-type back-to-back switch to the first ground.

What is claimed is:

1. A gate driver comprising:
 a local ground node configured to provide a local ground potential;
 a buffer configured to drive a device gate to the local ground potential during a switching cycle;
 an inductive storage element configured to receive an inductive current and to drive the device gate below the local ground potential during the switching cycle; and
 an inductor switch block configured to source the inductive current from a supply node and to subsequently sink the inductive current from the device gate during the switching cycle, wherein the inductor switch block comprises:
  a p-channel field effect transistor (PFET) comprising a body-connected PFET source, a PFET drain, and a PFET gate; and
  an n-type back-to-back switch comprising a back-to-back gate (i) configured to receive the local ground potential, (ii) electrically coupled to the local ground node, or (iii) electrically coupled to an alternating current (ac) ground node,
  wherein the n-type back-to-back switch further comprises a first back-to-back drain/source, and a second back-to-back drain/source formed by a first n-type field effect transistor (NFET) electrically coupled to a second NFET,
  wherein the first back-to-back drain/source is electrically coupled to the PFET drain, the second back-to-back drain/source is electrically coupled to the device gate, and the inductive storage element is electrically coupled between the PFET drain and the local ground node.

2. The gate driver of claim 1, wherein the gate driver is a high-side gate driver, and the buffer is configured to drive the device gate of a high-side device.

3. The gate driver of claim 2, wherein the high-side device comprises an insulated gate bipolar transistor (IGBT).

4. The gate driver of claim 1, wherein the gate driver is a low-side gate driver, and the buffer is configured to drive the device gate of a low-side device.

5. The gate driver of claim 4, wherein the low-side device comprises an insulated gate bipolar transistor (IGBT).

6. The gate driver of claim 1, wherein the inductive storage element is an inductor.

7. The gate driver of claim 1, wherein the inductive storage element comprises an inductance.

8. A gate driver comprising:
 a local ground node configured to provide a local ground potential;
 a buffer configured to drive a device gate to the local ground potential during a switching cycle;
 an inductive storage element configured to receive an inductive current and to drive the device gate below the local ground potential during the switching cycle; and
 an inductor switch block configured to source the inductive current from a supply node and to subsequently sink the inductive current from the device gate during the switching cycle, wherein the inductor switch block comprises:
  a p-channel field effect transistor (PFET) comprising a body-connected PFET source, a PFET drain, and a PFET gate configured to receive a pulse control signal during the switching cycle, wherein a circuit comprising a monostable multivibrator is configured to provide the pulse control signal; and
  an n-type back-to-back switch comprising a back-to-back gate, a first back-to-back drain/source, and a second back-to-back drain/source formed by a first n-type field effect transistor (NFET) electrically coupled to a second NFET,
  wherein the first back-to-back drain/source is electrically coupled to the PFET drain, the second back-to-back drain/source is electrically coupled to the device gate, and the inductive storage element is electrically coupled between the PFET drain and the local ground node.

9. A method of driving a device gate according to a switching cycle comprising:
 driving the device gate to a supply voltage;
 coupling an inductive storage element to a supply node; and
 coupling the inductive storage element to the device gate using an n-type back-to-back switch, wherein coupling the inductive storage element to the device gate further comprises providing a local ground potential to a back-to-back gate of the n-type back-to-back switch.

10. The method of claim 9, wherein driving the device gate to the supply voltage further comprises:
 subsequently driving the device gate to a local ground potential.

11. The method of claim 9, wherein coupling the inductive storage element to the supply node further comprises:
 subsequently driving the device gate to a local ground potential.

12. The method of claim 9, wherein coupling the inductive storage element to the supply node further comprises:
 coupling the inductive storage element to the supply node using a PFET.

13. The method of claim 9, wherein providing the local ground potential to the back-to-back gate of the n-type back-to-back switch comprises:
 coupling the back-to-back gate to a local ground.

14. A method of operating a half-bridge driver during a switching cycle comprising:
 switching a first device gate to a first supply;
 switching the first device gate to a first ground;
 driving the first device gate below a potential of the first ground using an inductive storage element, wherein said driving comprises:
  switching the inductive storage element to the first supply using a PFET by switching the inductive storage element to the first supply during a break-before-make interval of the switching cycle; and
  switching the inductive storage element to the first device gate using an n-type back-to-back switch;
 switching a second device gate to a second supply; and
 switching the second device gate to a second ground.

15. The method of claim 14, wherein the inductive storage element is an inductor.

16. The method of claim 14, wherein:
 the first device gate is a low-side device gate;
 the second device gate is a high-side device gate;
 the second ground is a half-bridge switch node; and
 the second supply is a bootstrap supply.

17. The method of claim 14, wherein:
 the second device gate is a low-side device gate;

the first device gate is a high-side device gate;
the first ground is a half-bridge switch node; and
the first supply is a bootstrap supply.

18. The method of claim 14, wherein switching the inductive storage element to the first supply using the PFET comprises:
    turning on the PFET after switching the first device gate to the first supply; and
    turning off the PFET before switching the second device gate to the second supply.

19. A method of of operating a half-bridge driver during a switching cycle comprising:
    switching a first device gate to a first supply;
    switching the first device gate to a first ground;
    driving the first device gate below a potential of the first ground using an inductive storage element, wherein said driving comprises:
        switching the inductive storage element to the first supply using a PFET; and
        switching the inductive storage element to the first device gate using an n-type back-to-back switch by coupling a gate of the n-type back-to-back switch to the first ground;
    switching a second device gate to a second supply; and
    switching the second device gate to a second ground.

20. The method of claim 19, wherein the inductive storage element is an inductor.

21. The method of claim 19, wherein:
    the first device gate is a low-side device gate;
    the second device gate is a high-side device gate;
    the second ground is a half-bridge switch node; and
    the second supply is a bootstrap supply.

22. The method of claim 19, wherein:
    the second device gate is a low-side device gate;
    the first device gate is a high-side device gate;
    the first ground is a half-bridge switch node; and
    the first supply is a bootstrap supply.

23. The method of claim 19, wherein switching the inductive storage element to the first supply using the PFET comprises:
    turning on the PFET after switching the first device gate to the first supply; and
    turning off the PFET before switching the second device gate to the second supply.

\* \* \* \* \*